(12) United States Patent
Olsson et al.

(10) Patent No.: US 11,118,778 B1
(45) Date of Patent: *Sep. 14, 2021

(54) SEMICONDUCTOR LIGHTING DEVICES AND METHODS

(71) Applicant: SeeScan, Inc., San Diego, CA (US)

(72) Inventors: Mark S. Olsson, La Jolla, CA (US); Jeff R. Truesdell, San Diego, CA (US); John R. Sanderson, IV, Panama City, FL (US); Jon E. Simmons, Poway, CA (US); Eric M. Chapman, Lake Tapps, WA (US); Aaron J. Steiner, San Diego, CA (US)

(73) Assignee: SEESCAN, INC., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/140,402

(22) Filed: Sep. 24, 2018

Related U.S. Application Data

(63) Continuation of application No. 15/231,454, filed on Aug. 8, 2016, now Pat. No. 10,088,143, which is a
(Continued)

(51) Int. Cl.
*F21V 29/00* (2015.01)
*F21V 31/03* (2006.01)
(Continued)

(52) U.S. Cl.
CPC ............. *F21V 31/03* (2013.01); *F21K 9/20* (2016.08); *F21K 9/27* (2016.08); *F21V 3/00* (2013.01); *F21V 7/00* (2013.01); *F21V 9/30* (2018.02); *F21V 23/005* (2013.01); *F21V 23/006* (2013.01); *F21V 23/06* (2013.01); *F21V 31/005* (2013.01); *H01L 33/502* (2013.01); *H01L 33/56* (2013.01); *H01L 33/62* (2013.01); *F21Y 2101/00* (2013.01); *F21Y 2115/10* (2016.08); *H01L 2224/48091* (2013.01); *H01L 2224/48227* (2013.01); *H01L 2224/8592* (2013.01);
(Continued)

(58) Field of Classification Search
CPC ... F21V 31/03; F21V 3/00; F21V 7/00; F21V 9/30; F21Y 2101/02
USPC ......................................................... 362/267
See application file for complete search history.

(56) References Cited

U.S. PATENT DOCUMENTS 9,416,957 B2 * 8/2016 Olsson ...................... F21V 3/00
9,429,301 B2 * 8/2016 Olsson .................... F21V 31/03
(Continued)

FOREIGN PATENT DOCUMENTS

EP          0707360 A1    4/1996
WO     2012/037574 A2    3/2012

OTHER PUBLICATIONS

International Searching Authority, "Written Opinion of the International Searching Authority" for PCT Patent Application No. PCT/US13/78115, dated Jun. 30, 2016, European Patent Office, Munich.

*Primary Examiner* — Evan P Dzierzynski
(74) *Attorney, Agent, or Firm* — Steven C. Tietsworth, Esq.

(57) ABSTRACT

Lighting device embodiments having a housing enclosing one or more interior volumes, a metal core printed circuit board, a multilayer stack of spacers, and a serviceable port in the housing to allow venting of one or more of the interior volumes are disclosed.

13 Claims, 59 Drawing Sheets

Example Lighting Element

Related U.S. Application Data continuation of application No. 14/213,652, filed on Mar. 14, 2014, now Pat. No. 9,416,957.

(60) Provisional application No. 61/786,206, filed on Mar. 14, 2013.

(51) Int. Cl.

| | | |
|---|---|---|
| *H01L 33/62* | (2010.01) | |
| *F21V 23/00* | (2015.01) | |
| *F21K 9/27* | (2016.01) | |
| *F21K 9/20* | (2016.01) | |
| *F21V 23/06* | (2006.01) | |
| *F21V 7/00* | (2006.01) | |
| *F21V 3/00* | (2015.01) | |
| *H01L 33/50* | (2010.01) | |
| *H01L 33/56* | (2010.01) | |
| *F21V 9/30* | (2018.01) | |
| *F21V 31/00* | (2006.01) | |
| *F21Y 101/00* | (2016.01) | |
| *F21Y 115/10* | (2016.01) | |

(52) U.S. Cl.
CPC .............. *H01L 2924/15311* (2013.01); *H01L 2924/181* (2013.01); *H01L 2924/1815* (2013.01)

(56) References Cited

U.S. PATENT DOCUMENTS

| | | | |
|---|---|---|---|
| 9,970,728 B1* | 5/2018 | Huang | F41A 35/02 |
| 10,088,143 B2* | 10/2018 | Olsson | F21V 31/03 |
| 10,352,550 B1* | 7/2019 | Olsson | F21V 15/01 |
| 2007/0133203 A1* | 6/2007 | Chen | F21V 31/00 |
| | | | 362/235 |
| 2007/0154716 A1* | 7/2007 | Czubarow | C08L 77/00 |
| | | | 428/411.1 |
| 2011/0051423 A1 | 3/2011 | Hand et al. | |
| 2012/0300491 A1* | 11/2012 | Hussell | H01L 24/49 |
| | | | 362/602 |
| 2018/0352121 A1* | 12/2018 | Chapman | H04N 5/2252 |

\* cited by examiner

Example Lighting Element

Example Outgassing Process

Example Browning Phosphor Failure Mechanism

Example Embodiment of Lighting Element Using Sequestering Agent and/or Browning Agent Destroyer Elements to Control Browning Example Embodiment of Lighting Element Using Sequestering Agents and/or Browning Agent Destroyers to Control Browning Sequestering Agent and/or Browning Agent
Destroyer Material Into Luminaire Example Embodiment Including Sequestering Agent and/or Browning Agent Destroyer Into Reflector Element Example LED Device with Browning Example LED Lighting Apparatus with Sequestering Agent and/or Browning Agent Destroyer Disposed in Proximity to a Reflector Cross-Section of Example Embodiment of Lighting Device Using Graphite Thermal Seal & Sequestering Agents and/or Browning Agent Destroyers to Control Browning Detail of Example Embodiment of Metal Clad Circuit Board Element and Pyrolytic Graphite Sheet (PGS) for Sealing and Heat Transfer Detail of Opposite Side of Example Embodiment Shown in FIG. 11A Detail of Example Embodiment of PGS Detail of Example Embodiment of Underwater Light Detail of Example Embodiment of Underwater Light Assembly Housing/Body With LEDs and Related Assemblies Removed Isometric View of Underwater Light Embodiment Shown in FIGs. 13A & 13B

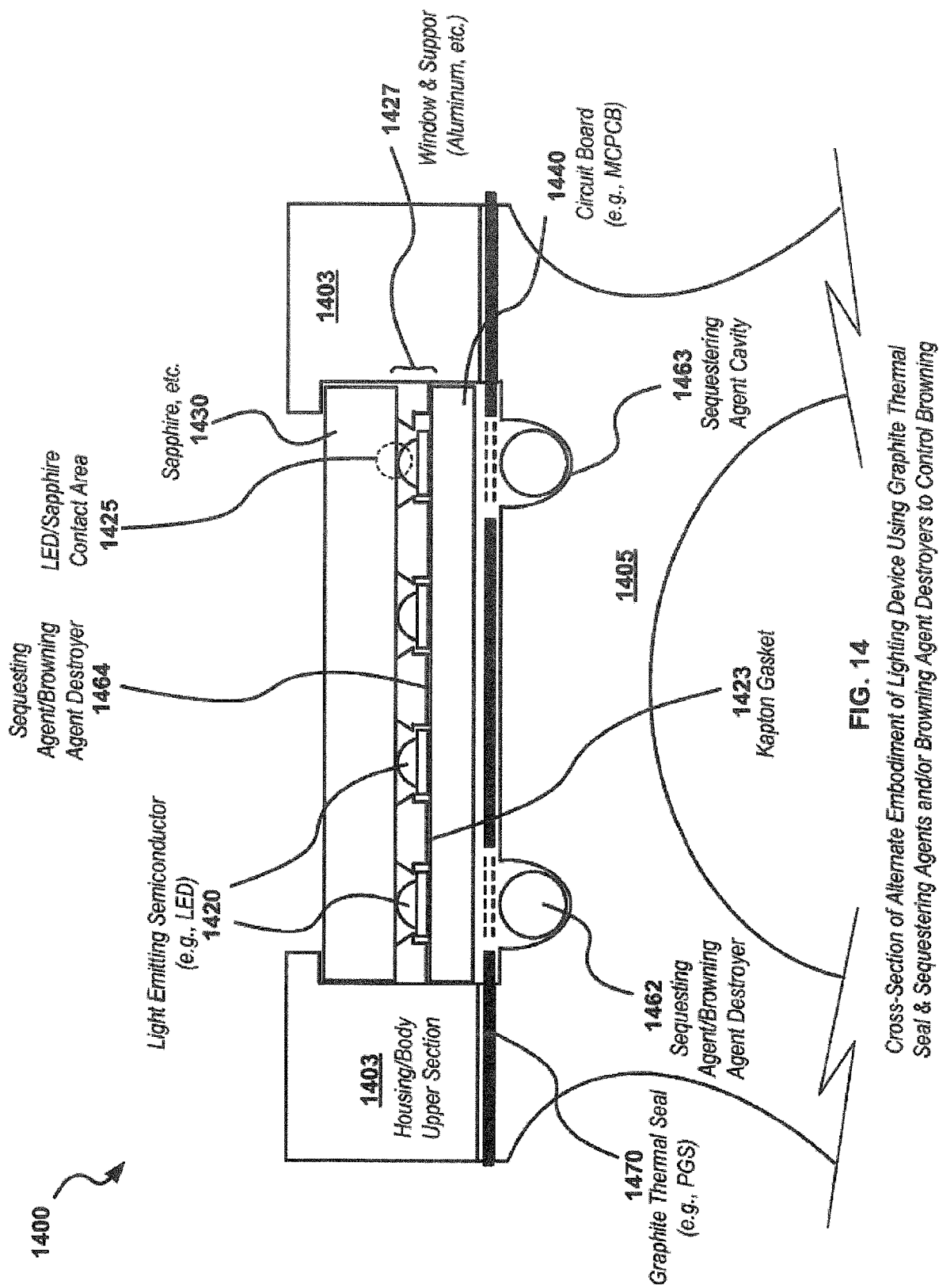

3200A
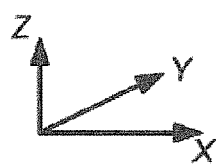
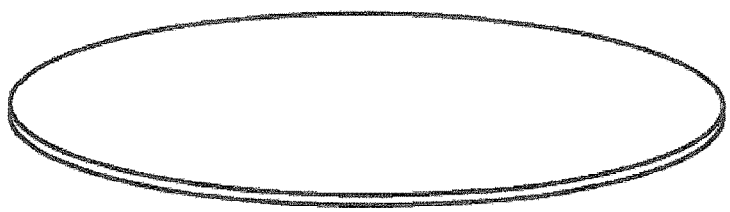
FIG. 32A
*Example Round Graphite Sheet (e.g. PGS) and Associated Conductivity Axes*
3200B
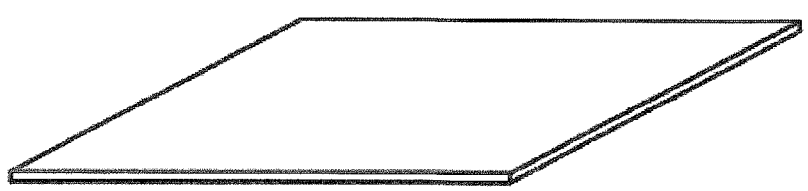
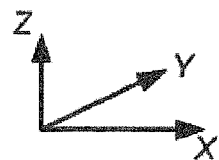
FIG. 32B
*Example Square Graphite Sheet (e.g. PGS) and Associated Conductivity Axes*

Example Surface Features on Mating Surface to Enhance Z-Axis Conductivity with Graphite Thermal Sealing Material (not to scale)

Example Conductor Surface with Conductive Particles and/or Embedded Conductive Particles (e.g., Diamond Dust) in Graphite Material Example Surface Features on Mating Surface and Thermally Conductive Particles to Enhance Z-Axis Conductivity with Graphite Thermal Sealing Material (not to scale)

*Example Gas Permeable Pressure Valve
(Automatic Embodiment)*

Selectively Gas Permeable Pressure Valve Embodiment in Lighting Device
(Example Gas Exchange Path Through Valve in "Open" Configuration)

Selectively Gas Permeable Pressure Valve Embodiment in Lighting Device
(In "Closed" Configuration)

SEMICONDUCTOR LIGHTING DEVICES AND METHODS

This application is a continuation of and claims priority to co-pending U.S. Utility patent application Ser. No. 15/231,454, filed Aug. 8, 2016, entitled SEMICONDUCTOR LIGHTING DEVICES AND METHODS, which is a continuation of and claims priority to U.S. Utility patent application Ser. No. 14/213,652, now U.S. Pat. No. 9,416,957 filed Mar. 14, 2014, entitled SEMICONDUCTOR LIGHTING DEVICES AND METHODS, which claims priority under 35 U.S.C. § 119(e) to U.S. Provisional Patent Application Ser. No. 61/786,206, filed Mar. 14, 2013, entitled SEMICONDUCTOR LIGHTING DEVICES AND METHODS. The content of each of these applications is hereby incorporated by reference herein in its entirety.

FIELD

This disclosure relates generally to lighting assemblies, devices, and operating methods for extension of light output and/or operational life. More specifically, but not exclusively, the present disclosure relates to semiconductor lighting devices including one or more user serviceable venting ports and/or internal venting paths and/or a gas permeable pressure valve to allow transfer of contaminating gases to the serviceable port. The lighting devices may further include sequestering agents and/or browning agent destroyers along with graphite materials and/or selectively permeable barriers to allow contaminant diffusion out of the lighting devices.

BACKGROUND

Semiconductor-based lighting devices, such as lighting devices using Light Emitting Diodes (LEDs), have been used for various lighting applications for a number of years. However, in many applications, the lighting devices may suffer from loss of output luminance during operation, which may occur rapidly. These decreases in output may occur long before the normal life expectancy of the semiconductor and/or other elements of the lighting device. Efforts have been made by various manufacturers to understand these failures, however, a viable solution has not to date been discovered. Accordingly, there is a need in the art to address the above-described as well as other problems related to LED lighting devices, apparatus, and systems.

SUMMARY

This disclosure relates generally to lighting assemblies, devices, and operating methods for extension of light output and/or operational life. More specifically, but not exclusively, the present disclosure relates to semiconductor lighting devices including user serviceable venting to allow contaminant removal from the interior of the lighting devices and/or internal venting paths and/or gas permeable pressure valves to allow transfer of contaminating gases to the serviceable port. The lighting devices may further include integrated sequestering agents and/or browning agent destroyers along with graphite materials and/or selectively permeable or serviceable barriers to allow contaminant diffusion out of the interior of the lighting devices.

For example, in one aspect the disclosure relates to a lighting device. The lighting device may include, for example, a housing enclosing one or more interior volumes, along with a serviceable port in the housing to allow venting of one or more of the interior volumes. The lighting device may further include internal venting paths to allow transfer of contaminating gases to the serviceable port. The lighting device may further include a gas permeable pressure valve to allow transfer of contaminants from the interior of the lighting device. The pressure valve may be selectively permeable as a function of applied exterior pressure. The lighting device may further include one or more electronic circuit elements disposed in the one or more interior volumes, and a selectively permeable barrier element disposed in the housing having a first area exposed to one of the interior volumes and a second area exposed to a gas or liquid volume exterior to the housing to allow diffusion of browning contaminants from the one of the interior volumes to the gas or liquid volume exterior to the housing.

In another aspect the disclosure relates to a lighting device. The lighting device may include, for example, a body or housing, a semiconductor lighting element disposed within an interior volume of the housing, and a sequestering agent and/or a browning agent destroyer disposed in the interior volume. The lighting device may further include a silicone material. The sequestering agent and/or browning agent destroyer may be disposed on or within the silicone element. The lighting device may further include a serviceable port to allow venting of the interior volume and/or venting paths to allow transfer of contaminating gases to the serviceable port. The lighting device may further include a gas permeable pressure valve to allow transfer of contaminants from the interior. The pressure valve may be selectively permeable as a function of applied exterior pressure.

In another aspect, the disclosure relates to a submersible light. The submersible light may include, for example, a housing enclosing an interior volume, a transparent pressure bearing window positioned at a forward end of the housing, a window supporting structure mounted in the housing behind the transparent window, a water-tight seal between the window and the housing, a circuit element configured and positioned within the housing behind the window supporting structure to bear at least some of the pressure applied to the transparent window by ambient water on the exterior side of the window, at least one solid state light source mounted on the circuit element behind the transparent window, a sequestering agent and/or a browning agent destroyer disposed behind the window, and a graphite material configured to seal two surfaces of the light to enhance thermal conductivity from the circuit element to the housing. The light may further include a serviceable port to allow venting of the interior volume and/or venting paths to allow transfer of contaminating gases to the serviceable port. The light may further include a gas permeable pressure valve to allow transfer of contaminants from the interior of the lighting device. The pressure valve may be selectively permeable as a function of applied exterior pressure.

In another aspect, the disclosure relates to a submersible LED light. The light may include, for example, a light head made of a thermally conductive material, a metal core printed circuit board (MCPCB) thermally coupled to the light head, a plurality of LEDs mounted on the MCPCB, a transparent window mounted in the light head, extending across the MCPCB and spaced from the LEDs, the window being sealed around a periphery thereof to the light head, a multilayer stack of spacers made of a high compressive strength material positioned between the window and the MCPCB for engaging the window and carrying loads exerted by the window, and a sequestering agent and/or a browning agent destroyer disposed behind the window. The light may further include a graphite material configured to seal a first volume of the light head including the at least one solid state light source and circuit element from a second volume of the light head. The light may further include a serviceable port to allow venting of the interior volume and/or venting paths to allow transfer of contaminating gases to the serviceable port. The light may further include a gas permeable pressure valve to allow transfer of contaminants from the interior. The pressure valve may be selectively permeable as a function of applied exterior pressure.

In another aspect, the disclosure relates to methods for manufacturing, testing, and/or operating lighting devices to implement the above-described functionality and/or extend operating life and/or performance by providing a vent path from one or more interior volumes to a volume exterior to the sealed solid state lighting product using a serviceable vent port or other serviceable interior volume access mechanism. The vent port may, for example, be placed within a first sealed volume containing at least one solid state lighting source, or in a second volume remote from but connected by vapor paths to the first volume for the purpose of allowing browning agents to migrate out of or away from solid state lighting devices to a volume exterior to the one or more sealed interior volumes. Furthermore the vent port may be located so as to be easily accessible throughout the life span of the lighting product, permitting maintenance actions designed to prevent diminished performance or recovery from a diminished performance state.

Various additional aspects, features, and functions are described below in conjunction with the appended Drawings.

BRIEF DESCRIPTION OF THE DRAWINGS

The present application may be more fully appreciated in connection with the following detailed description taken in conjunction with the accompanying drawings, wherein:

FIG. 14 illustrates details of another embodiment of a lighting device using a graphite material and a sequestering agent/browning agent destroyer.

FIGS. 32A and 32B illustrate details of embodiments of graphite materials in PGS form along with associated thermal conductivity axes.

DETAILED DESCRIPTION OF EMBODIMENTS

Overview

Figure 1:
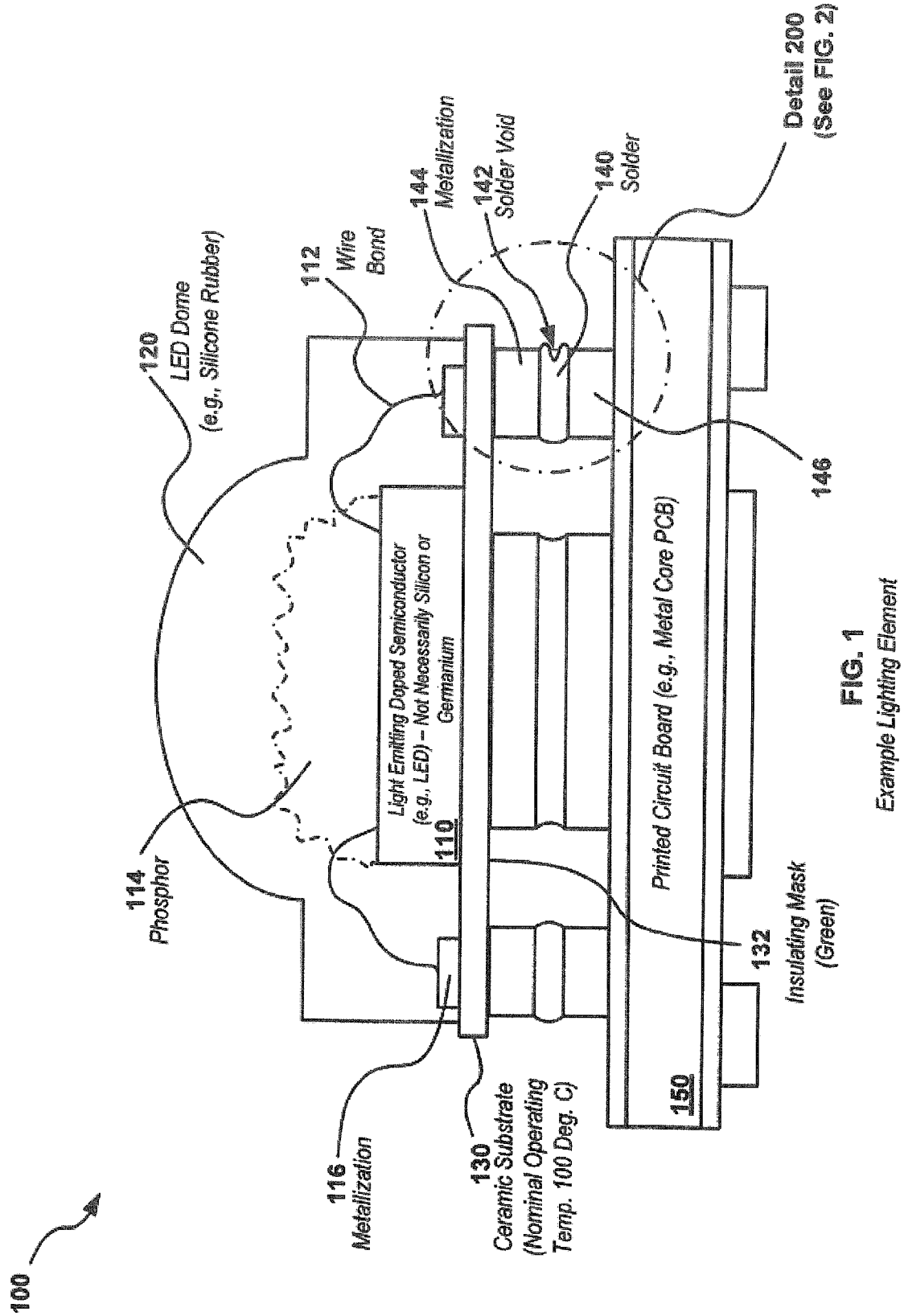
FIG. 1 illustrates an example semiconductor lighting device.

It is noted that as used herein, the term, "exemplary" means "serving as an example, instance, or illustration". Any aspect, detail, function, implementation, and/or embodiment described herein as "exemplary" is not necessarily to be construed as preferred or advantageous over other aspects and/or embodiments.

Various details as described herein may be combined with aspects disclosed in co-assigned patent applications including U.S. Utility patent application Ser. No. 13/482,969, filed May 29, 2012, entitled SEMICONDUCTOR LIGHTING DEVICES AND METHODS, U.S. Provisional Patent Application Ser. No. 61/491,191, filed May 28, 2011, entitled SEMICONDUCTOR LIGHTING DEVICES AND METHODS, U.S. Provisional Patent Application Ser. No. 61/596,204, filed Feb. 7, 2012, entitled SEMICONDUCTOR LIGHTING DEVICES AND METHODS, and U.S. Provisional Patent Application Ser. No. 61/596,709, filed Feb. 8, 2012, entitled SEMICONDUCTOR LIGHTING DEVICES AND METHODS. The content of each of these applications is incorporated by reference herein in its entirety for all purposes.

The following exemplary embodiments are provided for the purpose of illustrating examples of various aspects, details, and functions of embodiments of the present invention; however, the described embodiments are not intended to be in any way limiting. It will be apparent to one of ordinary skill in the art that various aspects may be implemented in other embodiments within the spirit and scope of the present invention.

This disclosure relates generally to lighting assemblies, devices, and operating life extension methods. More specifically, but not exclusively, the disclosure relates to semiconductor lighting devices including integrated sequestering agents and/or browning agent destroyers, such as adsorption and/or absorption materials and/or catalysts or other materials for mitigating browning. Alternately, or in addition, lighting devices may include a selectively permeable barrier element and/or a serviceable vent port and/or a gas permeable pressure valve to allow transfer of contaminants from the interior of the lighting device to allow diffusion of contaminants from interior volumes of the light to the exterior environment.

For example, in one aspect the disclosure relates to a lighting device. The lighting device may include, for example, a housing enclosing one or more interior volumes, along with a serviceable port in the housing to allow venting of one or more of the interior volumes. The lighting device may further include internal venting paths to allow transfer of contaminating gases to the serviceable port. The lighting device may further include one or more electronic circuit elements disposed in the one or more interior volumes and a selectively permeable barrier element disposed in the housing having a first area exposed to one of the interior volumes and a second area exposed to a gas or liquid volume exterior to the housing to allow diffusion of browning contaminants from one of the interior volumes to the gas or liquid volume exterior to the housing. The lighting device may further include a gas permeable pressure valve to allow transfer of contaminants from the interior. The pressure valve may be selectively permeable as a function of applied exterior pressure.

The one or more electronic circuit elements may include, for example, an LED lighting element. The LED lighting element may be disposed on a metal core printed circuit board (MCPCB). The one or more electronic circuit elements may include a power circuit for providing electrical power and/or control signals to the LED lighting element. The LED lighting element and the power circuit may be separate circuits on separate circuit element, such as separate PCBs, or may be a single circuit on a single circuit element, such as a single PCB. The LED lighting element may be disposed in a first volume of the one or more interior volumes and the power circuit may be disposed in the same volume or in a second volume of the one or more volumes. The first area of the selectively permeable barrier element may be in contact with the first volume, such as having an area of the selectively permeable barrier element in contact with the first volume. Alternately, or in addition, the first area of the selectively permeable barrier element may be in contact with the second volume, such as by having an area in contact with the second volume. The lighting device may further include one or more additional selectively permeable barrier elements. The one or more additional selectively permeable barrier elements may be in contact with the second volume or other interior volumes of the housing defining interior cavities.

The selectively permeable barrier element may include, for example, a silicone material. The selectively permeable barrier element may be in the form of an o-ring, window, gasket, membrane, or other structure. The selectively permeable barrier element may be positioned between two elements of the housing to further provide sealing, such as in the form of an o-ring or gasket.

The lighting device may further include, for example, a sequestering agent and/or a browning agent destroyer. The sequestering agent/browning agent destroyer may be disposed at least partially in one or more of the interior volumes. The sequestering agent may include a molecular sieve material. The sequestering agent may include an activated charcoal material. The sequestering agent may be a clay mineral material. The browning agent destroyer may be a catalyst material. The catalyst material may include one or more of platinum, palladium, rhodium, cerium, iron, manganese, nickel, and copper material, or other catalyst materials. The sequestering agent may comprise a material for absorbing or adsorbing and containing a gas capable of browning the lighting element and/or a phosphor associated with the lighting element. The sequestering agent and/or browning agent destroyer may be disposed at least partially within the selectively permeable barrier element.

The lighting device may further include, for example, a graphite material for at least partially sealing elements of the lighting device and/or to increase thermal conductivity between mating surfaces. The mating surface may be on a housing element and on a printed circuit board, such as an MCPCB including a semiconductor lighting element, and/or may be on two or more housing elements or other lighting device elements. The semiconductor lighting elements may be, for example, light emitting diodes (LEDs).

The housing may include, for example, one or more housing elements which may mate to define one or more interior volumes. The housing may include a forward housing element with a forward opening having a first diameter and an aft opening having a second diameter that is larger than the first diameter. The housing may include a transparent, pressure-bearing window positioned inside the forward housing, and having a diameter that is larger than the first diameter and smaller than the second diameter. The housing may include a water-tight seal disposed between the window and a surface of the forward housing. The housing may include a window support structure positioned in the forward housing behind a portion of the window. The housing may include a semiconductor lighting element positioned in the forward housing behind the window. The housing may contain a sequestering agent and/or a browning agent destroyer disposed behind the window. The housing may include a graphite material configured to seal a volume including the semiconductor lighting element from a second volume of the housing.

In another aspect the disclosure relates to a lighting device. The lighting device may include, for example, a body or housing, a semiconductor lighting element disposed within an interior volume of the housing, and a sequestering agent and/or a browning agent destroyer disposed in the interior volume. The lighting device may further include a silicone material. The sequestering agent and/or browning agent destroyer may be disposed on or within the silicone element. The lighting device may further include a serviceable port to allow venting of the interior volume and/or venting paths to allow transfer of contaminating gases to the serviceable port. The lighting device may further include a gas permeable pressure valve to allow transfer of contaminants from the interior. The pressure valve may be selectively permeable as a function of applied exterior pressure.

In another aspect, the disclosure relates to a submersible light. The submersible light may include, for example, a housing enclosing an interior volume, a transparent pressure bearing window positioned at a forward end of the housing, a window supporting structure mounted in the housing behind the transparent window, a water-tight seal between the window and the housing, a circuit element configured and positioned within the housing behind the window supporting structure to bear at least some of the pressure applied to the transparent window by ambient water on the exterior side of the window, at least one solid state light source mounted on the circuit element behind the transparent window, a sequestering agent and/or a browning agent destroyer disposed behind the window, and a graphite material configured to seal two surfaces of the light to enhance thermal conductivity from the circuit element to the housing. The submersible light may further include a serviceable port to allow venting of the interior volume and/or venting paths to allow transfer of contaminating gases to the serviceable port. The submersible light may further include a gas permeable pressure valve to allow transfer of contaminants from the interior. The pressure valve may be selectively permeable as a function of applied exterior pressure.

In another aspect, the disclosure relates to a submersible LED light. The light may include, for example, a light head made of a thermally conductive material, a metal core printed circuit board (PCB) thermally coupled to the light head, a plurality of LEDs mounted on the MCPCB, a transparent window mounted in the light head, extending across the MCPCB and spaced from the LEDs, the window being sealed around a periphery thereof to the light head, a multilayer stack of spacers made of a high compressive strength material positioned between the window and the MCPCB for engaging the window and carrying loads exerted by the window, and a sequestering agent and/or a browning agent destroyer disposed behind the window. The light may further include a graphite material configured to seal a first volume of the light head including at least one solid state light source and circuit element from a second volume of the light head. The light device may further include a serviceable port to allow venting of the interior volume and/or venting paths to allow transfer of contaminating gases to the serviceable port. The light may further include a gas permeable pressure valve to allow transfer of contaminants from the interior. The pressure valve may be selectively permeable as a function of applied exterior pressure.

In another aspect, the disclosure relates to methods for manufacturing, testing, and operating lighting devices to implement the above-described functionality and/or extend operating life and/or performance by providing a vent path from one or more interior volumes to a volume exterior to the sealed solid state lighting product using a serviceable vent port or other serviceable interior volume access mechanism. The vent port may, for example, be placed within a first sealed volume containing at least one solid state lighting source, or in a second volume remote from, but connected by vapor paths to the first volume for the purpose of allowing browning agents to migrate out of or away from solid state lighting devices to a volume exterior to the one or more sealed interior volumes. Furthermore the vent port may be located so as to be easily accessible throughout the life span of the lighting product, permitting maintenance actions designed to prevent diminished performance, or recovery from a diminished performance state.

In another aspect the disclosure relates to a lighting device. The lighting device may be configured to reduce browning and/or premature failure. The lighting device may include, for example, a housing enclosing an interior volume and a semiconductor lighting element disposed in the interior volume. The lighting device may include a silicone element, such as a silicone dome or window or selectively permeable barrier. The lighting device may include a sequestering agent and/or browning agent destroyer material disposed in proximity to the silicone element. The lighting device may further include a serviceable port to allow venting of the interior volume and/or venting paths to allow transfer of contaminating gases to the serviceable port. The lighting device may further include a gas permeable pressure valve to allow transfer of contaminants from the interior. The pressure valve may be selectively permeable as a function of applied exterior pressure.

The sequestering agent may include, for example, an adsorbent material. Alternately, or in addition, the sequestering agent may include an absorbent material. The absorbent material comprises a silica gel material. The silica gel material may be used to contain captured gases capable of effecting browning. The adsorbent material may include a molecular sieve material. The molecular sieve material may include a zeolite material. The zeolite material may include an aluminosilicate zeolite. The adsorbent material may include an activated charcoal material. The absorbent material may include a clay mineral material. The sequestering agent may include a chemically reactive binder material. The browning agent destroyer may include a catalyst material. The catalyst material may include a platinum material or other catalyst material.

The semiconductor lighting element may be an LED. The sequestering agent may be used to absorb or adsorb and contain a gas capable of browning the silicone element. The silicone dome may be a silicone dome of the LED. The sequestering agent and/or browning agent destroyer may be disposed on or within the silicone element or adjacent to the silicone element. The semiconductor lighting element, the silicone element, and the sequestering agent and/or browning agent destroyer may be disposed in a sealed structure within one or more internal volumes. The lighting device may include a reflector element to direct output from the LED. The sequestering agent may be disposed on or within the reflector element.

In another aspect, the disclosure relates to a lighting apparatus. The lighting apparatus may include, for example, a housing enclosing an interior volume and a plurality of semiconductor lighting elements. Each of the plurality of semiconductor lighting elements may include a semiconductor lighting element and a phosphor element. The lighting apparatus may further include a sequestering agent and/or a browning agent destroyer disposed in proximity to the plurality of semiconductor lighting elements. The lighting apparatus may further include a serviceable port to allow venting of the interior volume and/or venting paths to allow transfer of contaminating gases to the serviceable port. The lighting apparatus may further include a gas permeable pressure valve to allow transfer of contaminants from the interior of the housing. The pressure valve may be selectively permeable as a function of applied exterior pressure.

The lighting apparatus may further include a reflector element. The sequestering agent and/or browning agent destroyer may be disposed on or within the reflector element. The sequestering agent and/or browning agent destroyer may be disposed within one of the plurality of semiconductor lighting elements. The lighting apparatus may further include a silicone element. The semiconductor lighting element, the phosphor element, the sequestering agent and/or browning agent destroyer, and/or the silicone element may be disposed in a sealed structure within one or more internal volumes.

In another aspect the disclosure relates to a submersible lighting device. The lighting device may include, for example, a housing including a first volume and a second volume, a window in contact with a first volume, one or more semiconductor lighting elements disposed on a printed circuit element at least partially within the first volume, a sequestering agent and/or a browning agent destroyer disposed at least partially in the first volume, and a graphite material configured to seal the first volume from the second volume. The lighting device may further include a serviceable port to allow venting of the volumes and/or venting paths to allow transfer of contaminating gases to the serviceable port. The lighting device may further include a gas permeable pressure valve to allow transfer of contaminants from the interior. The pressure valve may be selectively permeable as a function of applied exterior pressure.

The sequestering agent may include, for example, an adsorbent material and/or an absorbent material. The absorbent material may be a silica gel material. The silica gel material may be disposed to contain captured gases capable of effecting browning. The adsorbent material may be a molecular sieve material. The molecular sieve material may be a zeolite material. The zeolite material may be an aluminosilicate zeolite. The adsorbent material may be an activated charcoal material. The absorbent material may be a clay mineral material. The sequestering agent may include a chemically reactive binder material. The sequestering agent may be disposed to absorb and contain a gas capable of browning a phosphor element of the lighting device. The sequestering agent may be disposed to absorb and contain a gas capable of browning the silicone element.

The browning agent destroyer may, for example, include a catalyst material. The catalyst material may include one or more of a platinum, palladium, rhodium, cerium, iron, manganese, nickel, and copper material. The sequestering agent and/or browning agent destroyer may be disposed within the silicone element.

The lighting device may include, for example, a silicone element. The semiconductor lighting element may be an LED, and the silicone element may be a component of or coupled to the LED. The silicone element may be a silicone dome element of the LED. The sequestering agent and/or browning agent destroyer may be disposed within and/or adjacent to the silicone element. The lighting device may include a plurality of LEDs, which may be configured in an array. The LED array may be configured with a flat top surface which may be in contact with and/or compressed with the window. The window may be a sapphire forward optically transparent material. The lighting device may further include a reflector element. The sequestering agent may be disposed within the reflector element.

The lighting device may further include, for example, a phosphor. The phosphor may be disposed at least partially in the first volume. The sequestering agent and/or the browning agent destroyer may be disposed within and/or adjacent to the phosphor element.

The graphite material may be, for example, a graphite sheet. The graphite sheet may be a pyrolitic graphite sheet (PGS). The PGS may be positioned between the circuit element, such as a metal core printed circuit board (MCPCB) and a thermally conductive mating surface of the housing. The semiconductor lighting element and/or the sequestering agent and/or browning agent destroyer may be sealed from the second volume at the mating surface. The lighting device may further include a phosphor element. The semiconductor lighting element, the phosphor element, the silicone element, and/or the sequestering agent and/or browning agent destroyer may be disposed in a sealed structure and/or volume of the lighting device. The graphite sheet may consist of graphite substantially free of contaminants. The graphite sheet material may not include binder materials, adhesives, or other materials that may emit contaminants. The graphite sheet material may comprise substantially all carbon. The graphite sheet material may be a pyrolitic graphite.

The graphite material may, for example, comprise a graphite sheet, and the body or housing may include a first surface in contact with the graphite sheet. The first surface may be configured to increase thermal conductivity between the body and the graphite sheet. The first surface may include surface features and/or be prepared by micromachining, nanofabrication, and/or other processes to create micro or nano-scale surface features to increase thermal conductivity.

The graphite material may comprise a graphite sheet, such as a pyrolitic graphite sheet. The graphite sheet may include and/or may be in contact with thermally conductive particles. The conductive particles may be embedded in the graphite sheet. The conductive particles may be in contact with and/or embedded in a mating surface adjacent to the graphite sheet. The conductive particles may be powdered diamond or other thermally conductive materials. The graphite material may be a graphite sheet including an impregnated powdered diamond material.

The lighting device may have a structural body configured to withstand an external water pressure. In some near shore embodiments the external water pressure may be in the range of 50 pounds per square inch (PSI). In embodiments for deep sea operation, the external water pressure may be 1000 PSI or higher, depending on the depth of operation.

The graphite material may comprise, for example, a pyrolitic graphite sheet (PGS). The PGS may be positioned between the circuit element and a thermally conductive mating surface of the housing and/or between mating surfaces of housing elements to conduct heat. The graphite sheet may consist of a graphite material substantially free of contaminants. The graphite sheet material may not include binder materials. The graphite sheet material may not include adhesive materials. The graphite sheet material may be substantially all carbon. The graphite material may comprise a graphite sheet, and the housing/body may include a first surface in contact with the graphite sheet. The first surface may be formed, machined, etc., to increase thermal conductivity between the body and the graphite sheet. The first and/or other surfaces may be configured to have increased thermal conductivity using a micromachining process. The first and/or other surfaces may include nanostructured features to enhance thermal conductivity. The graphite material may be a pyrolitic graphite sheet and the sheet may include embedded and/or surface particles such as powdered diamond, on the surface layer and/or internal layers or volumes. The graphite sheet may include an impregnated powdered diamond material.

The LEDs may include a dome and the lighting device may include a window, such as a sapphire window. The dome may be in contact with the sapphire or other window. The LED domes may include a flat top surface in contact with the sapphire. The flat top surface may be a manufactured surface. The plurality of LEDs may be trimmed to form the flat top surfaces. The flat top surfaces may be trimmed on an array of the plurality of LEDs. The window may be compressed against the LEDs. The window may be compressed against the LEDs during assembly of the lighting device. The window may be compressed against the LEDs by water pressure during underwater deployment.

The semiconductor lighting elements may be, for example, LEDs having a dome, and the window may comprise sapphire. The dome may be in contact with the sapphire. The LED domes may be silicone rubber or elastomeric domes or domes of other similar or equivalent materials. The LED domes may include a flat top surface in contact with the sapphire. The flat top surface may be a manufactured surface. The LEDs may be trimmed using a cutting element to form the flat top surfaces. The flat top surfaces may be trimmed on an array of the plurality of LEDs. The trimming may be done after the LEDs are mounted on a printed circuit element, such as an MCPCB. The sapphire window may be compressed against the LEDs. The sapphire window may be compressed against the LEDs during assembly of the lighting device. The sapphire window may be compressed against the LEDs by water pressure during underwater deployment.

In another aspect, the disclosure relates to a submersible light. The light may include, for example, a housing structure enclosing an interior volume, where the housing structure includes a forward housing with a forward opening having a first diameter and an aft opening having a second diameter that is larger than the first diameter. The light may further include a transparent, pressure-bearing window positioned inside the forward housing. The window may have a diameter that is larger than the first diameter and smaller than the second diameter. The light may further include a water-tight seal disposed between the window and a surface of the forward housing and a window support structure positioned in the forward housing behind a portion of the window. The light may further include a circuit element positioned within the forward housing and at least one light source mounted on the circuit element behind the window, which may be an LED. The light may further include a sequestering agent and/or a browning agent destroyer disposed behind the window. The light may further include a graphite material configured to seal a volume including the light source and circuit element from a second volume of the forward housing. The light may further include a pressure support structure positioned in the forward housing. The light may be configured so that some or all pressure applied to an external face of the window is transferred to and carried by the pressure support structure through at least the window support structure. The light may further include a serviceable port to allow venting of the interior volume and/or venting paths to allow transfer of contaminating gases to the serviceable port. The light may further include a gas permeable pressure valve to allow transfer of contaminants from the interior of the housing. The pressure valve may be selectively permeable as a function of applied exterior pressure.

The sequestering agent may include, for example, an adsorbent material and/or an absorbent material. The absorbent material may be a silica gel material. The silica gel material may be disposed to contain captured gases capable of effecting browning. The adsorbent material may be a molecular sieve material. The molecular sieve material may be a zeolite material. The zeolite material may be an aluminosilicate zeolite. The adsorbent material may be an activated charcoal material. The absorbent material may be a clay mineral material. The sequestering agent may include a chemically reactive binder material. The sequestering agent may be disposed to absorb and contain a gas capable of browning a phosphor element of the lighting device. The sequestering agent may be disposed to absorb or adsorb and contain a gas capable of browning the silicone element.

The browning agent destroyer may, for example, include a catalyst material. The catalyst material may include one or more of a platinum, palladium, rhodium, cerium, iron, manganese, nickel, and copper material. The sequestering agent and/or browning agent destroyer may be disposed within the silicone element.

The light may include, for example, a silicone element. The semiconductor lighting element may be an LED, and the silicone element may be of a group of silicone rubbers or silicone elastomers or silicone fluids or greases. The silicone element may be a component of or coupled to the LED. The silicone element may be a silicone dome element of the LED. The sequestering agent and/or browning agent destroyer may be disposed within and/or adjacent to the silicone element. The lighting device may include a plurality of LEDs, which may be configured in an array. The LED array may be configured with a flat top surface which may be in contact with and/or compressed with the window. The window may be a sapphire forward optically transparent material. The light may further include a reflector element. The sequestering agent may be disposed within the reflector element.

The light may further include, for example, a phosphor. The phosphor may be disposed at least partially in the first volume. The sequestering agent and/or the browning agent destroyer may be disposed within and/or adjacent to the phosphor element.

The graphite material may be, for example, a graphite sheet. The graphite sheet may be a pyrolitic graphite sheet (PGS). The PGS may be positioned between the circuit element, such as a metal core printed circuit board (MCPCB) and a thermally conductive mating surface of the housing. The semiconductor lighting element and/or the sequestering agent and/or browning agent destroyer may be sealed from the second volume at the mating surface. The light may further include a phosphor element. The semiconductor lighting element, the phosphor element, the silicone element, and/or the sequestering agent and/or browning agent destroyer may be disposed in a sealed structure and/or volume of the light. The graphite sheet may consist of graphite substantially free of contaminants. The graphite sheet material may not include binder materials, adhesives, or other materials that may emit contaminants. The graphite sheet material may comprise substantially all carbon. The graphite sheet material may be a pyrolitic graphite.

The graphite material may, for example, comprise a graphite sheet, and the body or housing may include a first surface in contact with the graphite sheet. The first surface may be configured to increase thermal conductivity between the body and the graphite sheet. The first surface may include surface features and/or be prepared by micromachining, nanofabrication, and/or other processes to create micro or nano-scale surface features to increase thermal conductivity.

The graphite sheet may be, for example, a pyrolitic graphite sheet. The graphite sheet may include and/or may be in contact with thermally conductive particles. The conductive particles may be embedded in the graphite sheet. The conductive particles may be in contact with and/or embedded in a mating surface adjacent to the graphite sheet. The conductive particles may be powdered diamond or other thermally conductive materials. The graphite material may be a graphite sheet including an impregnated powdered diamond material. The graphite sheet may be coated with a fluid or grease to improve sealing. The coating may be lightly applied during assembly or manufacturing. The fluid or grease may be applied to seal holes or cavities between layers of a housing or other internal structure so as to isolate internal volumes of the housing. The fluid or grease may also help retain particles, such as those made from diamond, to enhance thermal conductivity.

The graphite sheet may, for example, be pre-compressed to a substantially non-porous density state. The sheet may be compressed before assembly or manufacturing, may be compressed during the manufacturing process, and/or may be compressed during an initial pressurization cycle, such as during an underwater pressure test during manufacture or during initial use.

The light may have a structural body configured to withstand an external water pressure. In some near shore embodiments the external water pressure may be in the range of 50 pounds per square inch (PSI). In embodiments for deep sea operation, the external water pressure may be 1000 PSI or higher, depending on the depth of operation.

The semiconductor lighting elements may be, for example, LEDs having a dome and the window may comprise sapphire. The dome may be in contact with the sapphire. The LED domes may be silicone domes. The LED domes may include a flat top surface in contact with the sapphire. The flat top surface may be a manufactured surface. The LEDs may be trimmed using a cutting element to form the flat top surfaces. The flat top surfaces may be trimmed on an array of the plurality of LEDs. The trimming may be done after the LEDs are mounted on a printed circuit element, such as an MCPCB. The sapphire window may be compressed against the LEDs. The sapphire window may be compressed against the LEDs during assembly of the lighting device. The sapphire window may be compressed against the LEDs by water pressure during underwater deployment.

In another aspect, the disclosure relates to a submersible light. The submersible light may include, for example, a housing or body enclosing an interior volume, a transparent pressure bearing window positioned at a forward end of the housing, a window supporting structure mounted in the housing behind the transparent window and a water-tight seal between the window and the housing. The light may further include a circuit element configured and positioned within the housing behind the window supporting structure to bear at least some of the pressure applied to the transparent window by ambient water on the exterior side of the window, and at least one solid state light source mounted on the circuit element behind the transparent window. The light may further include a sequestering agent and/or a browning agent destroyer disposed behind the window. The light may further include a graphite material configured to seal a first volume of the housing or body and a second volume of the housing or body. The light may further include a serviceable port to allow venting of the interior volume and/or venting paths to allow transfer of contaminating gases to the serviceable port. The light may further include a gas permeable pressure valve to allow transfer of contaminants from the interior. The pressure valve may be selectively permeable as a function of applied exterior pressure.

The sequestering agent may include, for example, an adsorbent material and/or an absorbent material. The absorbent material may be a silica gel material. The silica gel material may be disposed to contain captured gases capable of effecting browning. The adsorbent material may be a molecular sieve material. The molecular sieve material may be a zeolite material. The zeolite material may be an aluminosilicate zeolite. The adsorbent material may be an activated charcoal material. The absorbent material may be a clay mineral material. The sequestering agent may include a chemically reactive binder material. The sequestering agent may be disposed to absorb or adsorb and contain a gas capable of browning a phosphor element of the lighting device. The sequestering agent may be disposed to absorb or adsorb and contain a gas capable of browning the silicone element.

The browning agent destroyer may, for example, include a catalyst material. The catalyst material may include one or more of a platinum, palladium, rhodium, cerium, iron, manganese, nickel, and copper material. The sequestering agent and/or browning agent destroyer may be disposed within the silicone element.

The light may include, for example, a silicone element. The semiconductor lighting element may be an LED and the silicone element may be a component of or coupled to the LED. The silicone element may be a silicone dome element of the LED. The sequestering agent and/or browning agent destroyer may be disposed within and/or adjacent to the silicone element. The light may include a plurality of LEDs, which may be configured in an array. The LED array may be configured with a flat top surface which may be in contact with and/or compressed with the window. The window may be a sapphire forward optically transparent material. The light may further include a reflector element. The sequestering agent may be disposed within the reflector element.

The light may further include, for example, a phosphor. The phosphor may be disposed at least partially in the first volume. The sequestering agent and/or the browning agent destroyer may be disposed within and/or adjacent to the phosphor element.

The graphite material may be, for example, a graphite sheet. The graphite sheet may be a pyrolitic graphite sheet (PGS). The PGS may be positioned between the circuit element, such as a metal core printed circuit board (MCPCB) and a thermally conductive mating surface of the housing. The semiconductor lighting element and/or the sequestering agent and/or browning agent destroyer may be sealed from the second volume at the mating surface. The light may further include a phosphor element. The semiconductor lighting element, the phosphor element, the silicone element, and/or the sequestering agent and/or browning agent destroyer may be disposed in a sealed structure and/or volume of the light. The graphite sheet may consist of graphite substantially free of contaminants. The graphite sheet material may not include binder materials, adhesives, or other materials that may emit contaminants. The graphite sheet material may comprise substantially all carbon. The graphite sheet material may be a pyrolitic graphite.

The graphite material may, for example, comprise a graphite sheet, and the body or housing may include a first surface in contact with the graphite sheet. The first surface may be configured to increase thermal conductivity between the body and the graphite sheet. The first surface may include surface features and/or be prepared by micromachining, nanofabrication, and/or other processes to create micro or nano-scale surface features to increase thermal conductivity.

The graphite material comprises a graphite sheet, such as a pyrolitic graphite sheet. The graphite sheet may include and/or may be in contact with thermally conductive particles. The conductive particles may be embedded in the graphite sheet. The conductive particles may be in contact with and/or embedded in a mating surface adjacent to the graphite sheet. The conductive particles may be powdered diamond or other conductive materials. The graphite material may be a graphite sheet including an impregnated powdered diamond material.

The light may have a structural body configured to withstand an external water pressure. In some near shore embodiments the external water pressure may be in the range of 50 pounds per square inch (PSI). In embodiments for deep sea operation, the external water pressure may be 1000 PSI or higher, depending on the depth of operation.

The semiconductor lighting elements may be, for example, LEDs having a dome, and the window may comprise sapphire. The dome may be in contact with the sapphire. The LED domes may be silicone domes. The LED domes may include a flat top surface in contact with the sapphire. The flat top surface may be a manufactured surface. The LEDs may be trimmed using a cutting element to form the flat top surfaces. The flat top surfaces may be trimmed on an array of the plurality of LEDs. The trimming may be done after the LEDs are mounted on a printed circuit element, such as an MCPCB. The sapphire window may be compressed against the LEDs. The sapphire window may be compressed against the LEDs during assembly of the lighting device. The sapphire window may be compressed against the LEDs by water pressure during underwater deployment.

In another aspect, the disclosure relates to a submersible LED light fixture. The light fixture may include, for example, a housing enclosing an interior volume, a light head made of a thermally conductive material, a metal core printed circuit board (PCB) thermally coupled to the light head, a plurality of semiconductor lighting elements, such as LEDs, mounted on the MCPCB, an optically transparent window mounted in the light head, where the window may extend across the MCPCB and be spaced from the LEDs or in contact with the LEDs. The window may be sealed around a periphery thereof to the light head. The light fixture may further include a multilayer stack of spacers made of a high compressive strength material positioned between the window and the MCPCB for engaging the window and carrying loads exerted by the window. The light fixture may further include a sequestering agent and/or a browning agent destroyer disposed behind the window. The light fixture may further include a graphite material configured to seal a first volume of the housing or body and a second volume of the housing or body. The light fixture may further include a serviceable port to allow venting of the interior volume and/or venting paths to allow transfer of contaminating gases to the serviceable port. The light fixture may further include a gas permeable pressure valve to allow transfer of contaminants from the interior of the housing. The pressure valve may be selectively permeable as a function of applied exterior pressure.

The sequestering agent may include, for example, an adsorbent material and/or an absorbent material. The absorbent material may be a silica gel material. The silica gel material may be disposed to contain captured gases capable of effecting browning. The adsorbent material may be a molecular sieve material. The molecular sieve material may be a zeolite material. The zeolite material may be an aluminosilicate zeolite. The adsorbent material may be an activated charcoal material. The absorbent material may be a clay mineral material. The sequestering agent may include a chemically reactive binder material. The sequestering agent may be disposed to absorb or adsorb and contain a gas capable of browning a phosphor element of the light fixture. The sequestering agent may be disposed to absorb or adsorb and contain a gas capable of browning the silicone element.

The browning agent destroyer may, for example, include a catalyst material. The catalyst material may include one or more of a platinum, palladium, rhodium, cerium, iron, manganese, nickel, and copper material. The sequestering agent and/or browning agent destroyer may be disposed within the silicone element.

The light fixture may include, for example, a silicone element. The semiconductor lighting element may be an LED and the silicone element may be a component of or coupled to the LED. The silicone element may be a silicone dome element of the LED. The sequestering agent and/or browning agent destroyer may be disposed within and/or adjacent to the silicone element. The lighting device may include a plurality of LEDs, which may be configured in an array. The LED array may be configured with a flat top surface which may be in contact with and/or compressed with the window. The window may be a sapphire forward optically transparent material. The light fixture may further include a reflector element. The sequestering agent may be disposed within the reflector element.

The light fixture may further include, for example, a phosphor. The phosphor may be disposed at least partially in the first volume. The sequestering agent and/or the browning agent destroyer may be disposed within and/or adjacent to the phosphor element.

The graphite material may be, for example, a graphite sheet. The graphite sheet may be a pyrolitic graphite sheet (PGS). The PGS may be positioned between the circuit element, such as a metal core printed circuit board (MCPCB) and a thermally conductive mating surface of the housing. The semiconductor lighting element and/or the sequestering agent and/or browning agent destroyer may be sealed from the second volume at the mating surface. The light fixture may further include a phosphor element. The semiconductor lighting element, the phosphor element, the silicone element, and/or the sequestering agent and/or browning agent destroyer may be disposed in a sealed structure and/or volume of the light fixture. The graphite sheet may consist of graphite substantially free of contaminants. The graphite sheet material may not include binder materials, adhesives, or other materials that may emit contaminants. The graphite sheet material may comprise substantially all carbon. The graphite sheet material may be a pyrolitic graphite.

The graphite material may, for example, comprise a graphite sheet, and the body or housing may include a first surface in contact with the graphite sheet. The first surface may be configured to increase thermal conductivity between the body and the graphite sheet. The first surface may include surface features and/or be prepared by micromachining, nanofabrication, and/or other processes to create micro or nano-scale surface features to increase thermal conductivity.

The graphite material comprises a graphite sheet, such as a pyrolitic graphite sheet. The graphite sheet may include and/or may be in contact with thermally conductive particles. The conductive particles may be embedded in the graphite sheet. The conductive particles may be in contact with and/or embedded in a mating surface adjacent to the graphite sheet. The conductive particles may be powdered diamond or other thermally conductive materials. The graphite material may be a graphite sheet including an impregnated powdered diamond material.

The light fixture may have a structural body configured to withstand an external water pressure. In some near shore embodiments the external water pressure may be in the range of 50 pounds per square inch (PSI). In embodiments for deep sea operation, the external water pressure may be 1000 PSI or higher, depending on the depth of operation.

The semiconductor lighting elements may be, for example, LEDs having a dome and the window may comprise sapphire. The dome may be in contact with the sapphire. The LED domes may be silicone domes. The LED domes may include a flat top surface in contact with the sapphire. The flat top surface may be a manufactured surface. The LEDs may be trimmed using a cutting element to form the flat top surfaces. The flat top surfaces may be trimmed on an array of the plurality of LEDs. The trimming may be done after the LEDs are mounted on a printed circuit element, such as an MCPCB. The sapphire window may be compressed against the LEDs. The sapphire window may be compressed against the LEDs during assembly of the light fixture. The sapphire window may be compressed against the LEDs by water pressure during underwater deployment.

The light fixture may include a first internal volume containing at least one solid state light source, such as an LED or other solid state lighting element. The first volume containing the solid state light source may be sealed from a second internal volume containing electronics as well as other parts and materials commonly used in the manufacture of solid state lighting products. The internal volumes may be sealed from a third volume, separate from and external to the first and second internal volumes. The light fixture may include a vent port between the first and third volumes. The vent port may include a vent hole in a structural body or housing allowing the first volume containing the solid state light source to communicate with the third, external volume. The vent hole may have surfaces designed to allow sealing between the first and third volumes to occur. The vent hole may also have a section allowing retention of a separate removable structural element that supports a sealing action between the first and third volumes. The removable structural element may have surfaces which work with the vent hole sealing surfaces to allow a seal between the first and third volumes to be created. The removable structural element may have surfaces that allow its retention in a structural body or housing. A sealing ring or rings may be positioned relative to the removable structural element such that a seal is formed upon installation of the removable structural element between the first internal and third external volumes.

The light fixture may include a first internal volume containing at least one solid state light source. The first volume containing the solid state light source may communicate with a second internal volume containing electronics as well as other parts and materials commonly used in the manufacture of solid state lighting products. The internal volumes may be sealed from a third volume, separate from and external to the first and second internal volumes. The light fixture may include a vent port between the second internal volume and the third external volume. The vent port may include a vent hole in a structural body or housing allowing the first volume, containing the solid state light source, to communicate with the third, external volume through the intervening second volume. The vent hole may have surfaces designed to allow sealing between the second and third volumes to occur. The vent hole may also have a section allowing retention of a separate removable structural element that supports a sealing action between the first and third volumes. The removable structural element may have surfaces which work with the vent hole sealing surfaces to allow a seal between the second and third volumes to be created. The removable structural element may have surfaces that allow its retention in a structural body or housing. A sealing ring or rings may be positioned relative to the removable structural element such that a seal is formed upon installation of the removable structural element between the second internal and third external volumes.

EXAMPLE EMBODIMENTS

Various additional aspects, features, and functions are described below in conjunction with the embodiments illustrated in the appended drawing figures. In addition, details of embodiments of underwater lighting apparatus and devices that may be used in combination with the disclosure herein are described in co-assigned applications including U.S. Utility patent application Ser. No. 13/482,969, filed May 29, 2012, entitled SEMICONDUCTOR LIGHTING DEVICES AND METHODS, U.S. Provisional Patent Application Ser. No. 61/491,191, filed May 28, 2011, entitled SEMICONDUCTOR LIGHTING DEVICES & METHODS, U.S. Provisional Patent Application Ser. No. 61/536,512, filed Sep. 19, 2011, entitled LIGHT FIXTURE WITH INTERNALLY LOADED MULTILAYER STACK FOR PRESSURE TRANSFER, U.S. Utility patent application Ser. No. 12/844,759, filed Jul. 27, 2010, entitled SUBMERSIBLE LED LIGHT FIXTURE WITH MULTILAYER STACK FOR PRESSURE TRANSFER, and U.S. Utility patent application Ser. No. 12/700,170, filed Feb. 4, 2010, entitled LED LIGHTING FIXTURES WITH ENHANCED HEAD DISSIPATION. The content of each of these applications is incorporated by reference herein in its entirety.

Lighting devices using semiconductor lighting elements have been used in the art for various lighting applications. Example devices include a semiconductor element for generating light output in visible light wavelength, or, in some cases, in Infra-Red (IR) and/or Ultraviolet (UV) wavelengths, as well as shorter wavelengths, such as in the form of Light Emitting Diodes (LEDs). For purposes of brevity, such lighting devices may also be referred to herein as "LED devices."

In a typical LED device, the output wavelength range of the semiconductor element (also referred to herein as an "LED element" or "LED") is fixed, and the output of the LED device is determined by action of another element of the LED device, such as a phosphor element which is illuminated by the light emitted from the LED element and emits other light which may be at different wavelengths. For example, an LED element may emit photons in the range of 450-460 nanometers (nm), which are absorbed by phosphors, with the phosphors then emitting output light at different wavelengths, such as longer wavelengths.

It has been observed that in operation LED devices may fail, sometimes in a rapid fashion. For example, it has been observed that LED devices operating at rated power, well below the expected mean failure time, may suffer from rapid light output drops. This phenomenon has been referred to as "browning," and may include browning or darkening of elements of the LED device which may decrease light output of the LED device (e.g., by making the dome/phosphor interface more opaque). However, other failure mechanisms may also be implicated in browning of lighting elements, as further described below. In various aspects, this disclosure relates to apparatus, devices, and methods for mitigating browning during operation, as well as providing user serviceability to lighting devices to prevent or delay browning or mitigate the effects of browning through venting of contaminants in interior volumes of semiconductor lighting devices.

In order to better describe the operation and failure of a typical LED device, attention is now directed to FIG. 1, which illustrates an exemplary LED device configuration 100. Device 100 includes an output lens or dome structure, such as dome 120, which may be fabricated from a silicone rubber material (e.g., an elastomer, polymer, or other inert synthetic material including silicone) or other transparent material, such as a non-silicone plastic material. Other elements of LED Device 100 (not specifically shown) may also be fabricated from silicone or other plastic materials. A light emitting element or LED element 110 may be mounted below the dome 120 and may be partially, or more typically fully, enclosed by the dome and a substrate 130, which may be a ceramic material to withstand heating of the LED element and conduct heat away. In a typical operating mode, temperatures of 100 Degrees C. or higher may occur.

A phosphor element 114 may be positioned above the LED element 110 to generate output light in a desired wavelength range based on photons emitted from the LED element. The LED element is typically connected to electrical power via a wire bond 112 (or other connection, such as direct solder connection to a pad, etc.) supplied from an electronic circuit element including power and/or control circuitry. A metallization terminal 116 may be used to couple the electrical power over the substrate to the wire bond (or other connection mechanism).

Additional electrical connections may include other metallic or conductive elements, which may be soldered together. For example, a conductor 144 may be coupled to other conducting elements, such as conductor 146, via a soldered connection 140. As further illustrated in FIG. 2, connection flaws, such as solder voids or other flaws, may contribute to browning as discussed subsequently. Materials that emit contaminants, such as circuit elements, soldering fluxes, plastic or rubber materials, or other materials, may cause or contribute to browning. Other elements of a typical LED device may include additional printed circuit boards, such as PCB 150. The various circuit boards, wires and other connectors and conductors, and other elements, such as seals, coating, reflectors, mounting hardware, and the like may include organic compounds or other compounds that can generate or "outgas" potentially harmful contaminants as gases or vapors that contribute to browning. For example, substrate 130 may include an insulating mask of a plastic material, such as insulating mask 132 or other elements, which may emit harmful gases.

As noted previously, a decrease in light output from an LED device, also denoted herein as browning, may occur in a rapid, unpredictable fashion. This has been observed by companies involved in both component design and production, such as LED element manufacturers, as well as product integrators, such as companies making lighting systems comprised of one or more LED elements along with other components. Considerable effort has been expended by LED manufacturers to address this problem, which can be both expensive (by incurring replacement costs for devices that fail prematurely), as well as difficult to correct. For example, one application of interest is underwater lighting or lighting in wet or damp environments, where LED devices such as device 100 as shown in FIG. 1 are integrated into lighting systems for use on underwater or aerial platforms, vehicles, etc. In this environment, it may be very problematic to incur lighting failure and difficult to replace failed elements. Therefore, it is desirable to be able to avoid or at least control browning-type failures.

Research done by DeepSea Power and Light, Inc., assignee of the present invention, has suggested that browning failures are caused by multiple failure mechanisms. For example, while darkening of transparent elements of LED devices may result in some loss of light output, it appears that this may be only partially responsible for the aggregate light output loss. The darkening may be a result of breakdown of silicone materials in the elastomeric dome structure, as well as in other elements of LED devices. Moreover, it is believed that initial breakdown of silicone or other materials may result in a chain-reaction failure where damaged molecules absorb more photons and further contribute to additional creation of molecules that further contribute to breakdown. The damage associated with browning may be caused at least in part by the presence of small organic molecules, in the form of "poisoning" gases, which are in contact with and/or absorbed within elements of lighting devices. For example, these may be gases that can be chemically broken by light emitted from semiconductor devices (e.g., light in the 455 nm range), and which may not be able to freely migrate through sealing mechanisms within lighting devices, such as O-rings or gaskets of materials such as Viton™.

Consequently, it may be desirable to maintain a high degree of cleanliness in manufacturing and handling of lighting device elements and assemblies to reduce the initial presence of "poisoning" gases; however, other mechanisms for emission of small organic molecules, such as from plastic components, may still be inherent in the various lighting device components. In addition, in some cases other sources of "poisoning" may be present. For example, it may be possible that water can contribute to "poisoning" processes to some degree in some applications.

Although damage to silicone elastomer structures of LED devices, such as damage to silicone dome 120, is implicated as a partial cause of browning, it is believed that additional browning effects may be associated with damage or "poisoning" of the phosphor elements. In this failure mechanism, the phosphor elements may be damaged by gases emitted from other elements of the LED devices, such as from solder voids 142, and/or by other contaminant gas emissions from plastics or other materials.

Browning may be caused by a collection of various contaminants at the interface of the phosphor and the silicone. The contaminants may react with each other under the high energy photon flux and the resulting reactant may cause or contribute to the browning effect (rather than damage to the silicone or phosphor)

Figure 2:
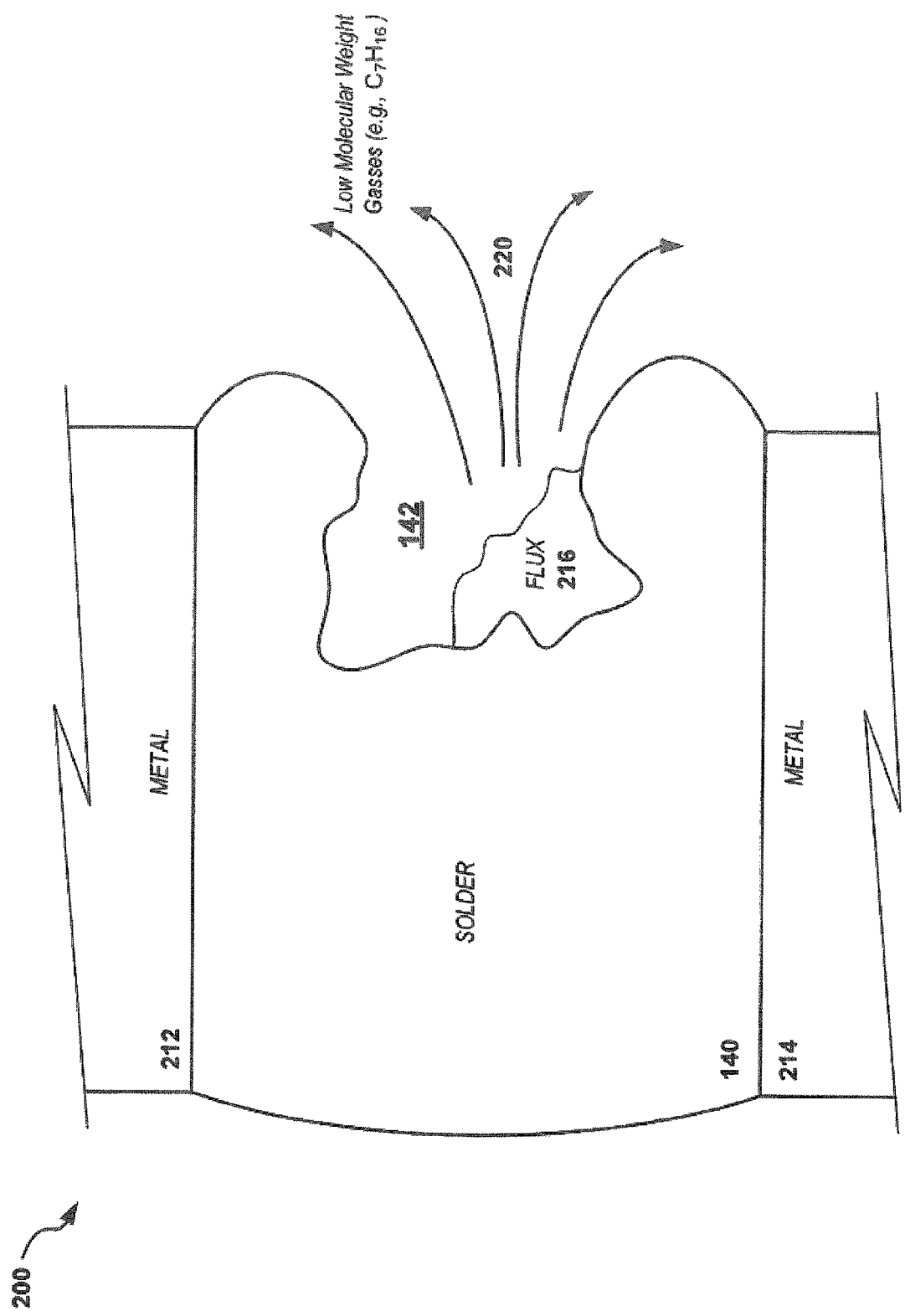
FIG. 2 illustrates an example solder void in a lighting device such as shown in FIG. 1.

FIG. 2 illustrates a potential failure mechanism associated with a solder void such as void 142. In area 200, a solder joint 140, between metal connector elements 212 and 214, may have a void or other structural defect. For example, solder flux 216 may be present in the void. During operation, gases 220 may be emitted from the void area. These gases may be, for example, low molecular weight gases such as Hexane, Octane, Urea, etc. These gases may then interact with other LED device elements, such as silicone elastomer elements, phosphor elements, and/or other elements to decrease light output. In addition, other failure mechanisms may occur as a result of or in consequence of "poisoning" of an internal volume of a lighting device. For example, the LED element temperature may increase in conjunction with browning, which may decrease light output and/or change photon wavelength, further decreasing LED device output.

Figure 3:
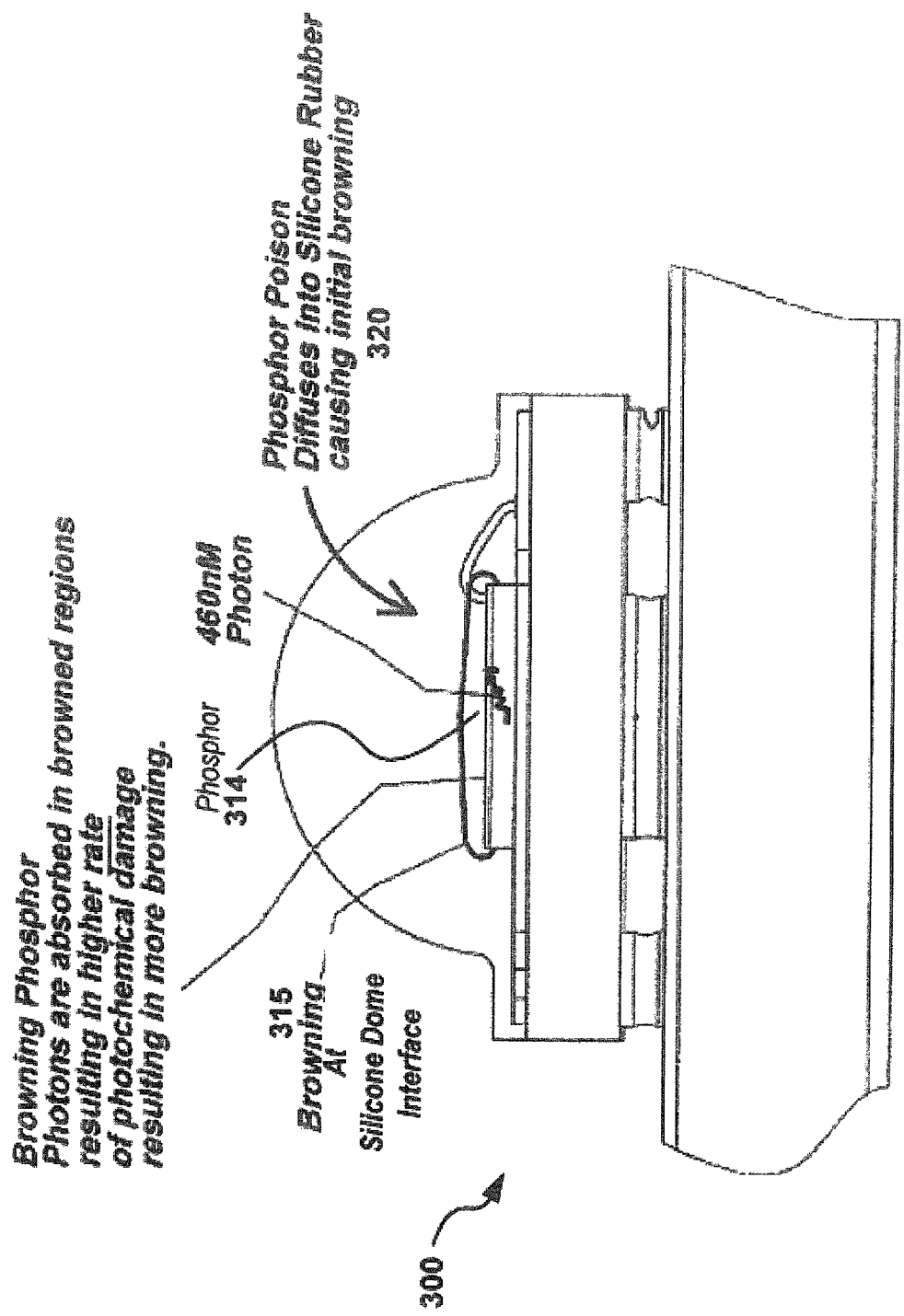
FIG. 3 illustrates an example browning process in a semiconductor lighting device.

FIG. 3 illustrates an example of a chain reaction failure of a phosphor element in an LED device 300, which may be similar to device 100 as shown in FIG. 1. In this failure mode, damage caused to phosphor 314 such as by outgassing, such as from a defect as shown in FIG. 2, initially results in browning of areas of the phosphor. Photons emitted from the LED element are then absorbed in the browned regions, resulting in a higher rate of photochemical reaction and damage, thereby accelerating browning. Additional browning may occur in silicone elements such as at the silicone dome 315 to phosphor 314 interface, silicone rubber dome 320, and/or other elements (not shown) of the lighting device.

Considerable efforts by different companies in the lighting systems and components fields have failed to identify suitable materials and material configurations to solve the browning problem. However, research and study of the problem by DeepSea Power and Light, Inc., assignee of the instant application, has demonstrated that use of sequestering agents, such as adsorbents, absorbents, and/or chemically reactive binders, and/or browning agent destroyers, such as catalysts (for example, platinum or other catalytic materials such as platinum, palladium (as an oxidation catalyst), rhodium (as a reduction catalyst), cerium, iron, manganese, nickel and/or copper), may provide a way to both prevent or limit browning as well as fully or partially repair LED devices damaged by browning failure mechanisms such as those described previously herein. In various embodiments, sequestering agents, either integrated within LED device elements, combined with LED device elements, and/or disposed in proximity to LED device elements, such as in one or more interior volumes of a lighting device, may improve lighting system performance by controlling, limiting, and/or repairing various browning effects.

Appropriate materials may include molecular sieve materials, such as zeolites in an exemplary embodiment, or other molecular sieves. These materials have the ability to adsorb gases emitted from LED device elements and contain them. It is believed that previously studied materials have failed because of their inability to contain captured materials. For example, some materials which have been previously studied may release adsorbed gases upon heating or during other conditions. However, materials such as zeolites have designed pore structures that molecules can diffuse into. Once diffused in, however, these materials contain the gases much more completely than previously studied materials.

One example brand of materials that may be useful for such applications is Tri-sorb® "Zeolite." However, other molecular sieve materials, clay minerals, or other materials capable of capturing and containing small, outgassed molecules, may also be used. Examples of zeolite structures and related information, such as nomenclature and information related to pore shapes and sizes, may be found in the book "Atlas of Zeolite Structure Types," by Meier et al., August 1996, Excerpta Medica, the content of which is incorporated by reference herein. Example clay materials are materials such as those used in the trademarked "Desi Paks" made by Sud-Chemie Inc, based on aluminosilicate clay absorbents.

Some examples that may be used in particular applications include Type 4A molecular sieves that adsorb molecules with a critical diameter of less than four Angstroms, such as Carbon Dioxide. Other materials have different molecular adsorbency characteristics, which may be denoted by type (e.g., Type 3A adsorbs molecules having a critical pore diameter less than three angstroms, such as Helium Hydrogen and Carbon Monoxide, Type 13X for pore diameters less than 10 angstroms, etc.). The specific material used may be tailored to particular gases present in the LED device and which cause browning processes such as those described previously herein.

Tri-Sorb molecular sieve desiccants based on synthetic zeolite (molecular sieve) types 3A, 4A and 13X Zeolites exhibit crystalline structures with well-defined and uniform pores of 3A, 4A and 10A diameters respectively. Tri-Sorb adsorbs water vapor and gas molecules that fit into the pores. The adsorption capacity of Tri-Sorb is relatively high at low humidity levels and remains almost constant as relative humidity increases. The adsorption rate is also high at high humidity levels. The adsorption capacity of Tri-Sorb as a function of temperature remains relatively constant at constant relative humidity and absolute humidity between 20° C. and 50° C.

Figure 4:
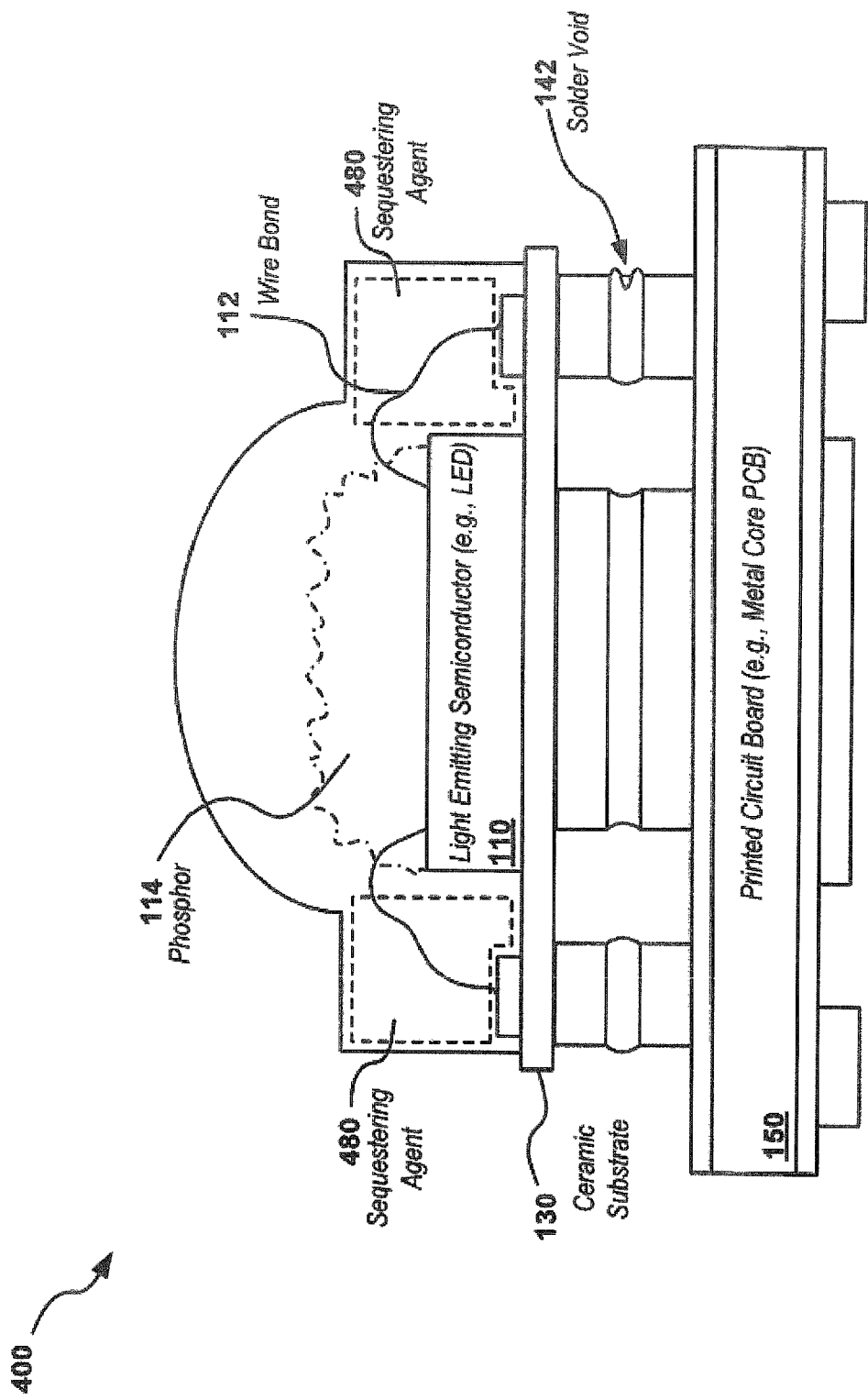
FIG. 4 illustrates details of an embodiment of a lighting device incorporating sequestering agents and/or browning agent destroyer elements in accordance with an aspect of the present invention.

FIG. 4 illustrates details of one embodiment of an LED device 400 including a sequestering agent material 480, which may be an absorbent, adsorbent, and/or chemically reactive binder, and/or a browning agent destroyer material. It is noted that, while the material 480 is shown at a particular location within LED device 400, the material 480 may be disposed in other areas in addition to or in place of the areas shown in various embodiments. For example, material 480 may be disposed adjacent to other elements of LED device 400 and/or may be integrated with other elements, such as in one or more interior volumes of the LED device. In one embodiment, a white clay material may be used and positioned as shown or elsewhere in or adjacent to LED device 400. In one embodiment, a reflective white clay material may be used, such as where reflection of light is desirable or necessary for operation. In some embodiments, sequestering agents may be combined with other elements, such as with white pigments such as titanium oxide (e.g., for reflective elements, white pigments, such as titanium dioxide, may cover sequestering materials such as white clay or other materials). Similar techniques may be used with browning agent destroyers.

Figure 5:
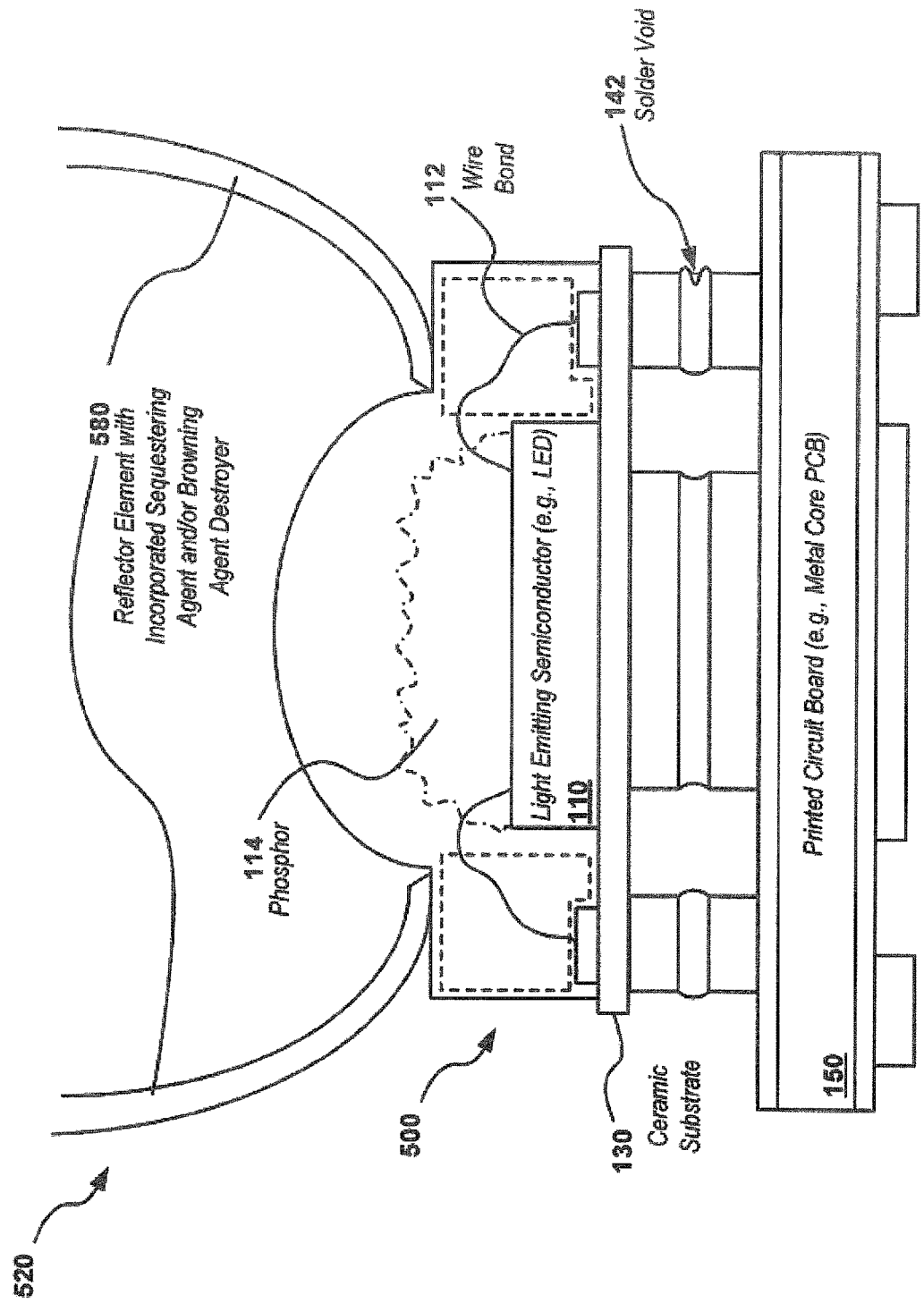
FIG. 5 illustrates details of an embodiment of a lighting device including sequestering agents and/or browning agent destroyers on or in a reflector in accordance with an aspect of the present invention.

FIG. 5 illustrates details of another embodiment of an LED device 500. Device 500 may include an adsorbent and/or absorbent material that may be incorporated in a reflector element 580 of an LED lighting apparatus 520 that may include LED device 500. Other elements as shown in FIG. 5 may be the same as or similar to corresponding elements shown in FIG. 1.

Figure 6:
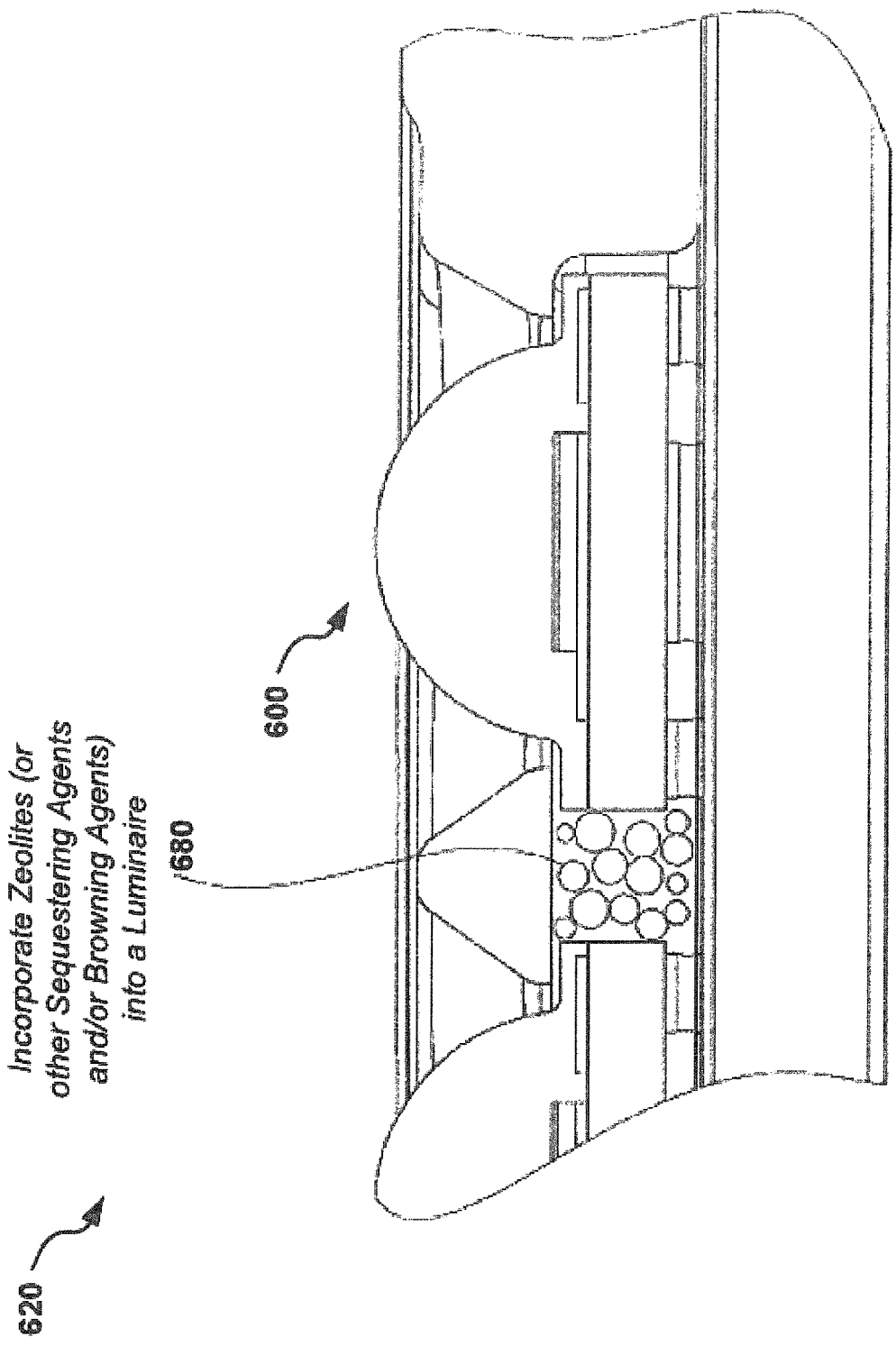
FIG. 6 illustrates details of an embodiment of a lighting device including zeolites in accordance with an aspect of the present invention.

FIG. 6 illustrates details of another embodiment of an LED Device 600 including an adsorbent and/or absorbent material, in the form of absorbents, such as Zeolites, in an LED lighting apparatus 620. The zeolites may be incorporated in a cavity or other interior volume of the device, such as in location 680 as shown.

Figure 7:
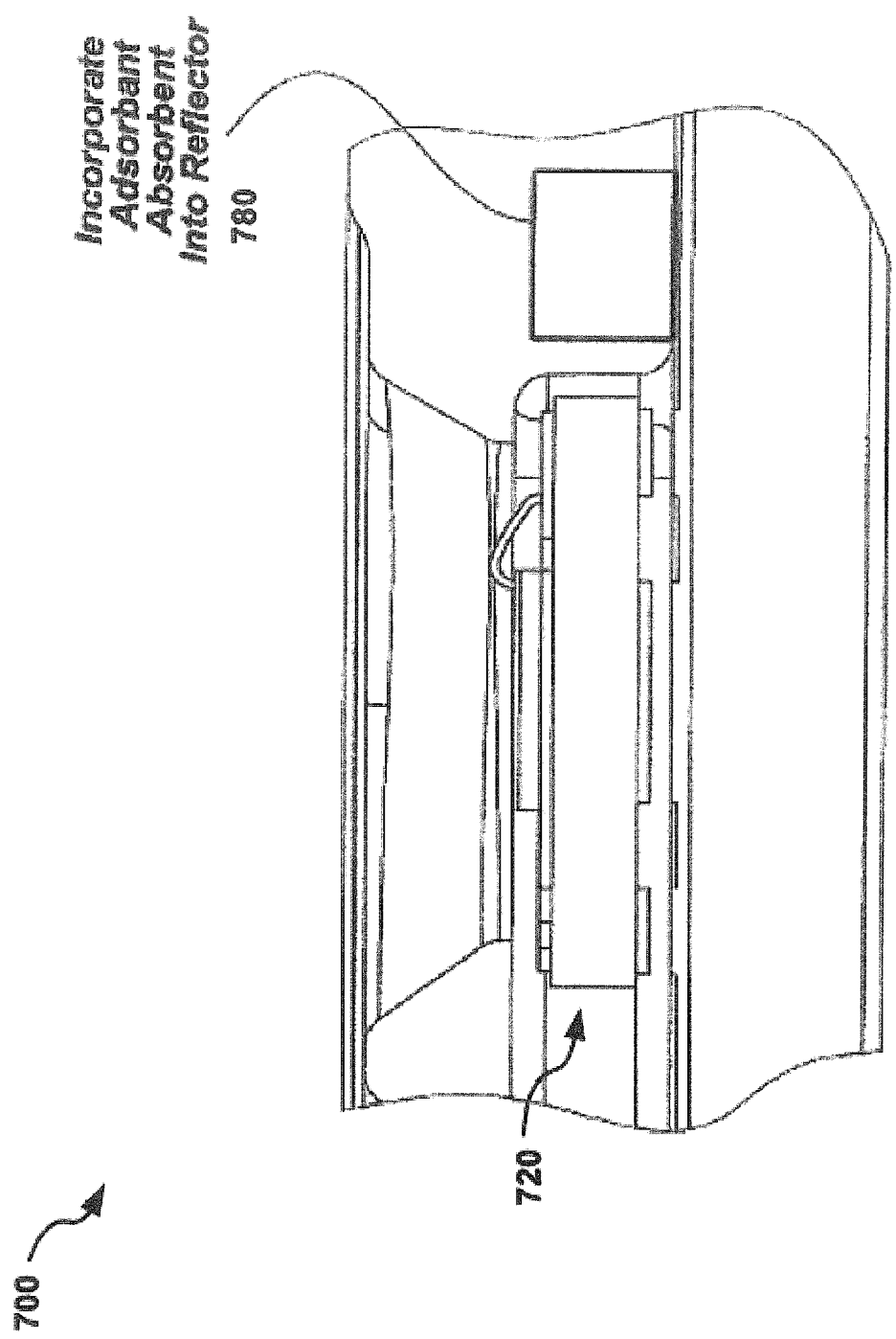
FIG. 7 illustrates details of an embodiment of a lighting device including sequestering agents and/or browning agent destroyers in accordance with an aspect of the present invention.

FIG. 7 illustrates details of another embodiment of an LED Device 720 including an adsorbent and/or absorbent material incorporated into a reflector element 780 of an LED lighting apparatus 700.

Figure 8:
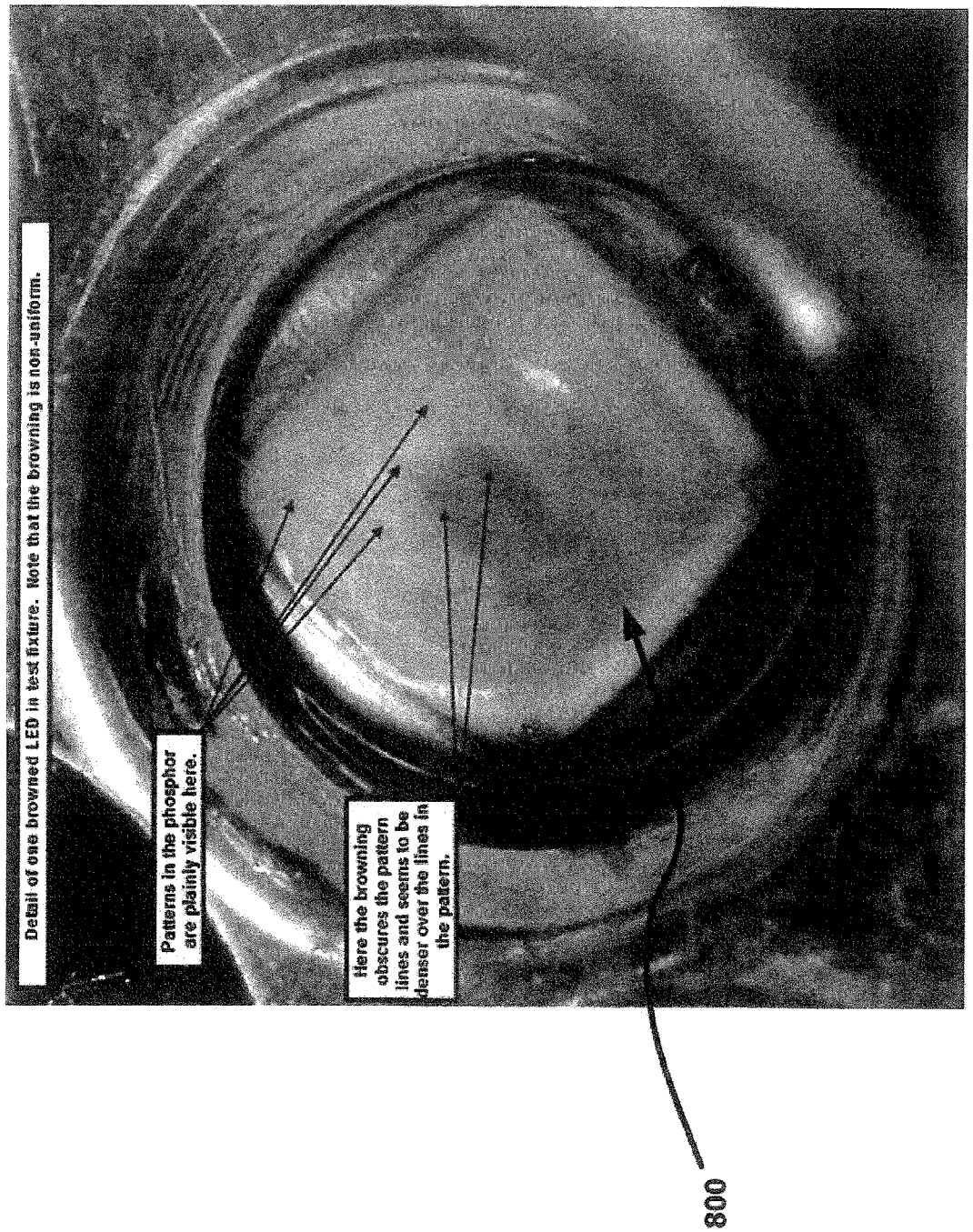
FIG. 8 illustrates details of an example phosphor element with browning.

FIG. 8 is a photograph of an experimental LED Device embodiment 800 with browning. In this example browning failure, the browning is non-uniform and obscures pattern lines, appearing denser over the pattern traces.

Figure 9:
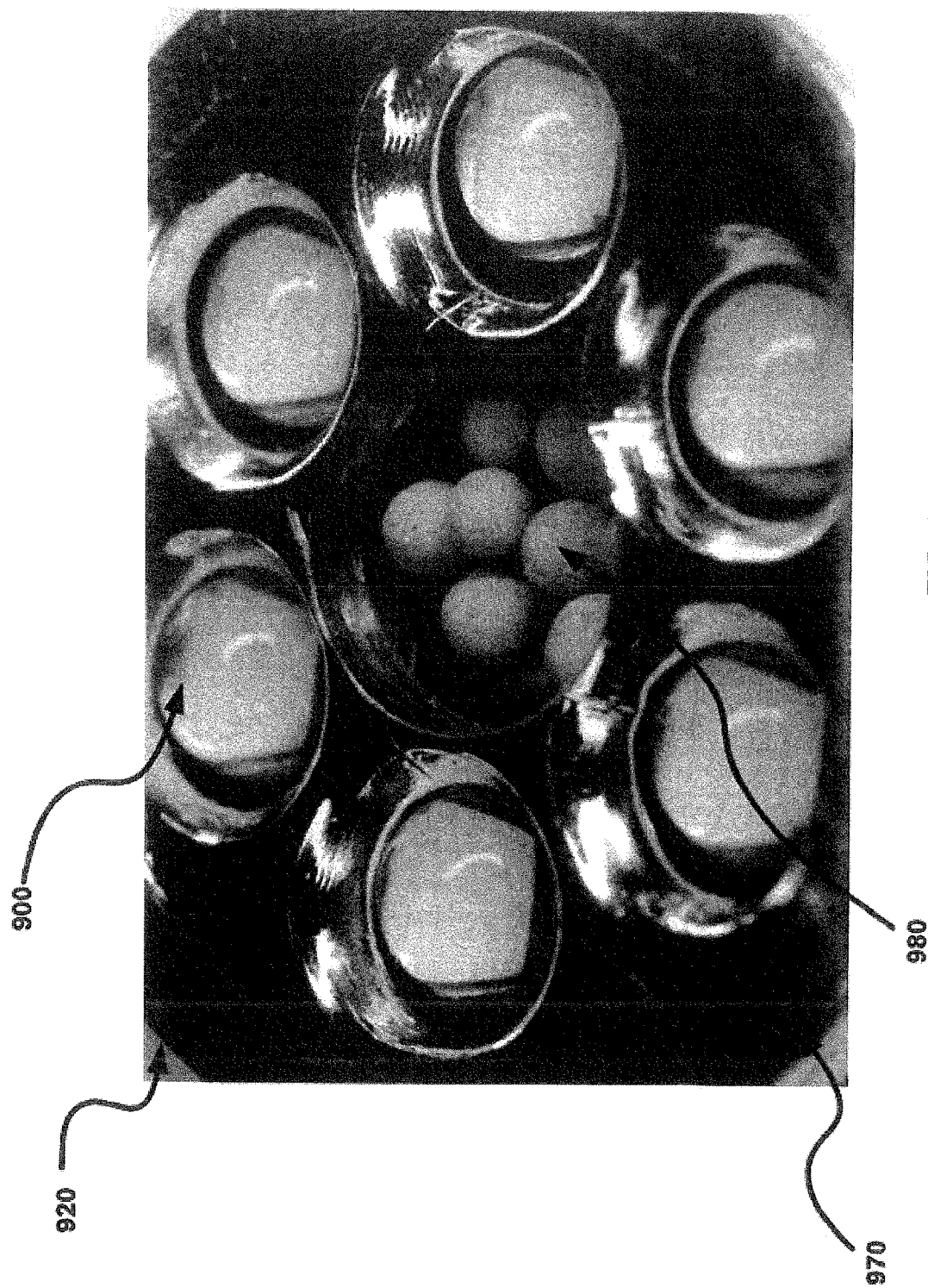
FIG. 9 illustrates details of an embodiment of a multi-element lighting device including a sequestering agent and/or browning agent in accordance with aspects of the present invention.

FIG. 9 is a photograph of an experimental embodiment of an LED Lighting Apparatus 920. Apparatus 920 includes 6 LED Devices 900 disposed within a reflector element 970. Adsorbant and/or Absorbent materials 980 are disposed within the lighting apparatus 920, in this example between the LED Devices 900 as shown. However, in various embodiments, the materials 980 may be disposed in other places within an internal volume of the apparatus 920, such as in proximity to LED Devices 900 and/or integral with LED Devices 900.

In some embodiments, LED Devices may be configured to facilitate chemical reactions to chemically bind the browning agent and/or chemically degrade the browning agent to a harmless or less harmful chemical. This may be done through use of selected chemical compounds for binding to targeted contaminant materials such as those described herein.

In various embodiments, sequestering agents and/or browning agent destroyers may be disposed in various ways within elements of semiconductor lighting elements and devices, such as within the LED elements and LED devices described previously. For example, in some embodiments, sequestering agents may be disposed in one or more interior volumes, and may be packaged in or around the LED element, silicone elements (such as the silicone dome), and/or other elements of lighting devices as described previously and/or as illustrated in the accompanying drawings.

In some embodiments, various combinations of sequestering agents/browning agent destroyers may be combined to provide additional functionality. For example, in some embodiments a mixture of zeolites or similar or equivalent materials may be combined with activated charcoal or other similar or equivalent materials. Dust contamination from activated charcoal may be problematic if it is distributed in interior volumes on electronic or optical circuits or components, but may be addressed through use of compression or full or partial sealing of the activated charcoal material, such as in a silicone rubber membrane or other materials. This may be done by, for example, heat sealing or other binding or enclosure methods known or developed in the art.

In some embodiments water soluble solder pastes may be used in place of typical solder pastes having non-water soluble residues or other contaminants to reduce contaminants. For example, Kester or Alpha Metals pastes WS-809 appear to cause browning. This paste includes modified rosins and ethoxylated amines, which may contribute contaminants when enclosed within interior volumes. In general, fluxes have some sort of acid species for scrubbing surfaces (and/or amines) that may cause or contribute to contamination. Limiting or removing these during manufacturing may aid in reducing contaminants.

In embodiments where HiVac silicone grease or similar materials are used, it may be desirable to avoid direct contact between the silicone grease and other silicone elements such as LED domes in order to avoid transfer of contaminants through solid diffusion. HiVac grease and silicone domes may have similar molecular structures and if placed in contact, molecules from the HiVac may transfer through the dome to high intensity light elements and cause degradation/browning High purity silicone rubber materials (which tend to be expensive, for example on the order of $1000/kg) have been observed to cause little to no browning, while low cost materials have been observed to be more likely to brown.

In another aspect, sequestering agents and/or browning agent destroyers may be used in combination with a graphite material, such as a pyrolitic graphite sheet (PGS) in some embodiments. The graphite material may be used in place of or in addition to gels or other sealing materials to isolate internal volumes of a semiconductor lighting device and/or to aid in heat conduction/thermal transfer between elements of the lighting device, such as mating surfaces, circuit boards, and/or other elements used for transferring heat. For example, in embodiments where the housing includes multiple elements and/or circuit assemblies to define interior volumes and seal them relative to each other, graphite materials, such as pyrolitic graphite sheet (PGS) materials, may be used for sealing of the elements and/or to aid heat conduction therebetween.

Figure 10:
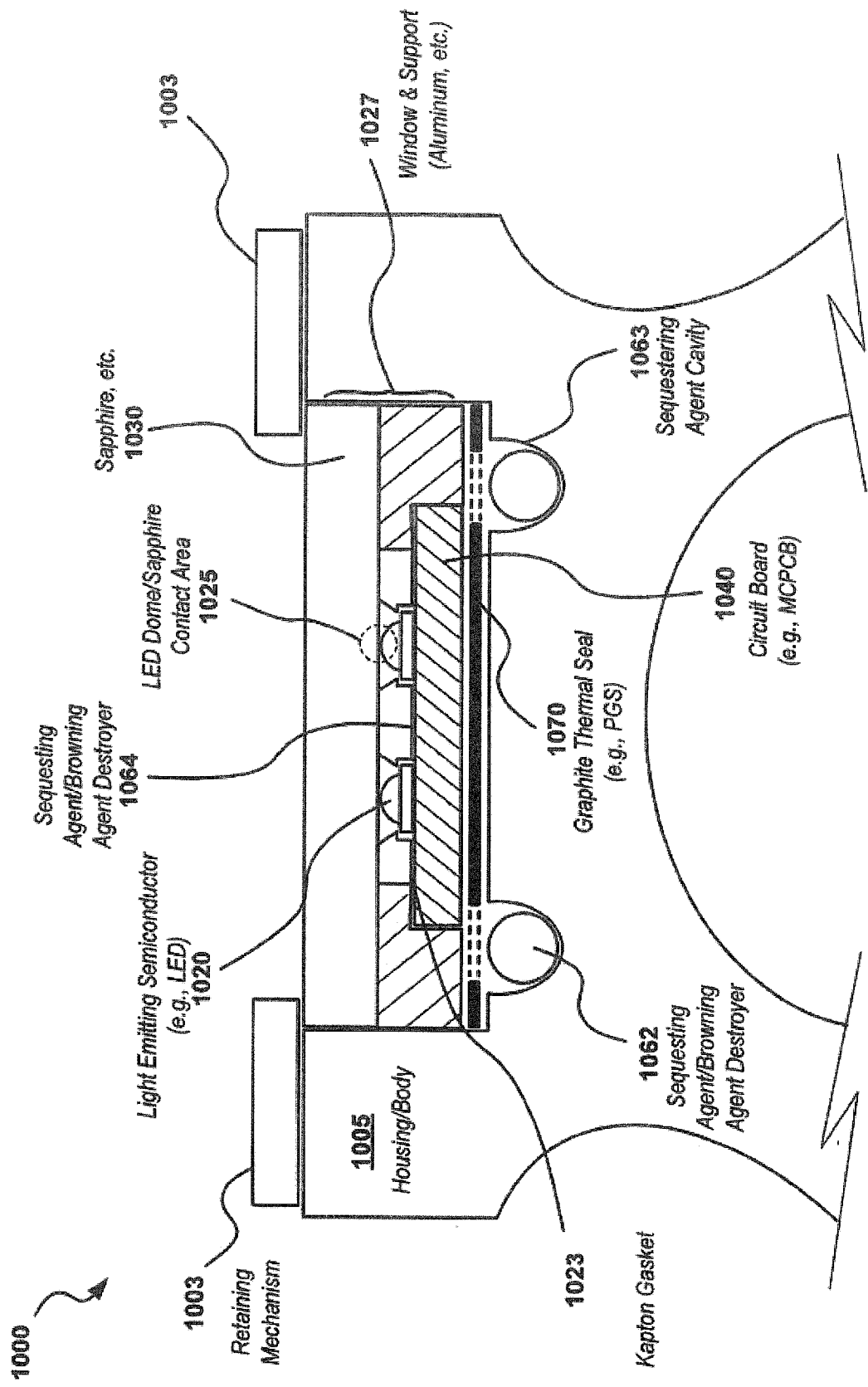
FIG. 10 illustrates details of an embodiment of a lighting device using a graphite material and a sequestering agent and/or browning agent destroyer.

Attention is directed to FIG. 10, which illustrates details of one embodiment 1000 of such a lighting device, in the form of an underwater light configuration, where a graphite sheet 1070 is used for sealing and conduction of heat (generated by LEDs 1020) between a circuit board element 1040 and the housing body 1005 (where the heat may be further dissipated to freshwater or seawater from the body 1005 during underwater operation). Circuit board element 1040 may be a metal core printed circuit board (MCPCB) to facilitate dissipation of heat generated by the LEDs, which can generate considerable heat, especially when high light output LEDs are used.

Figure 12:
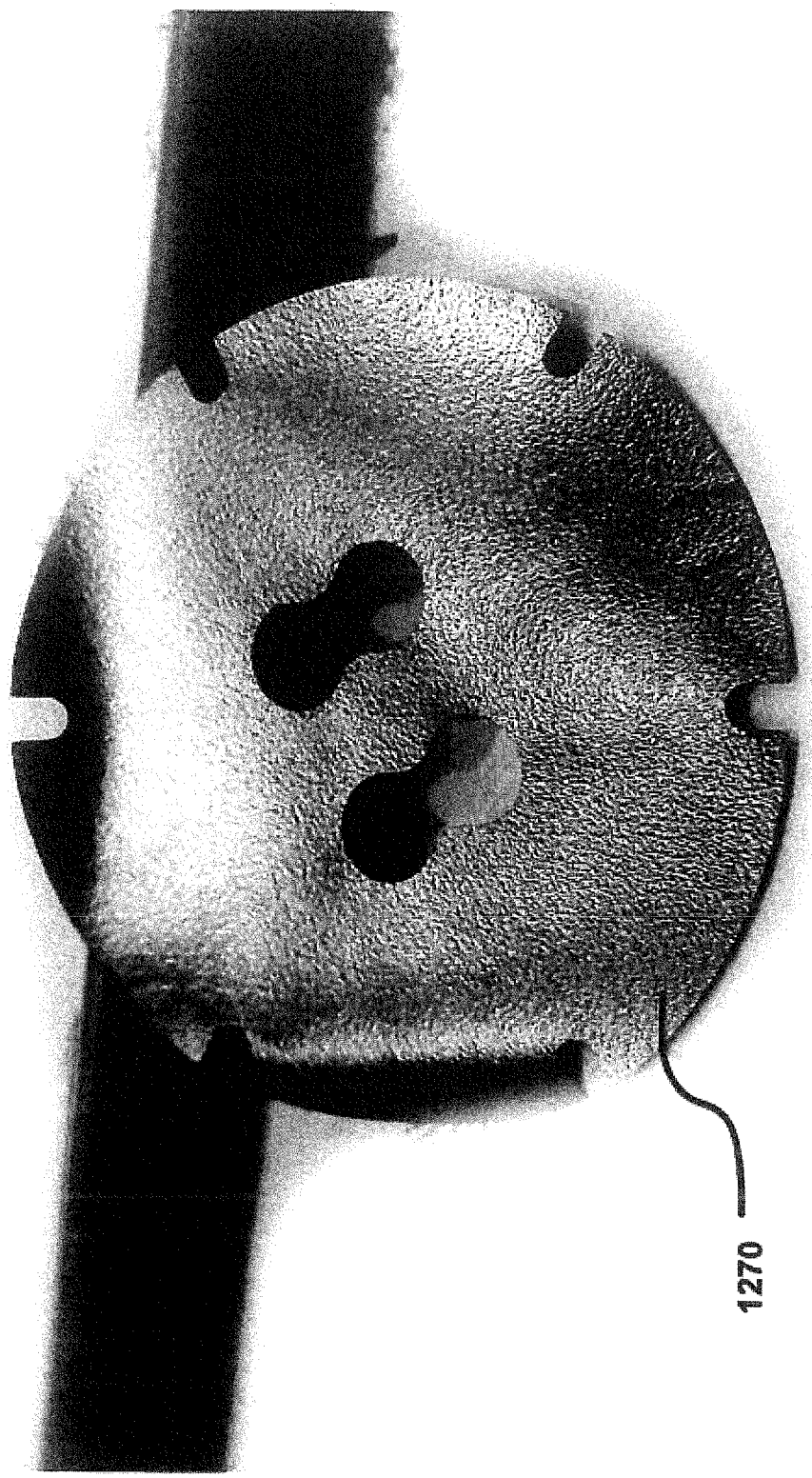
FIG. 12 illustrates one embodiment of a graphite material for heat transfer and/or sealing in the form of a pyrolitic graphite sheet (PGS).

A graphite material 1070, which may be, in an exemplary embodiment, a pyrolitic graphite sheet (PGS) may be used to seal volumes of the lighting device to limit exposure of contaminants to the LEDs from other volumes of the lighting device. Graphite material 1070 may include holes or vents to allow exposure of potential contaminants to sequestering agents/browning agent destroyers 1062 and/or sealing elements, such as silicone o-rings or gaskets, which may be disposed in a cavity 1063 as shown and/or elsewhere in the lighting device such as described previously herein. An example embodiment of such a cavity, defined by an internal volume, is further illustrated in FIG. 13B as cavities 1363, and holes or vents in example graphite sheets are shown in the example embodiment 1270 as shown in FIG. 12.

Additional sequestering agents/browning agent destroyers, such as agents 1064, may be placed as shown in FIG. 10 and/or elsewhere in the device. In particular, these may be located so as to be in contact with contaminants in the air or other gas within internal volumes of the lighting device to neutralize the contaminants. Contaminants may leach out of various elements of the lighting device over time and may be neutralized to limit contact with LEDs or other elements of the lighting device that may be subject to browning.

In some embodiments the LEDs 1020 may be configured to be in contact with a window for delivering light outward from the LEDs, such as a forward optically transparent window component in the form of a sapphire window (or of a glass, plastic, or other transparent material). An example of this is shown in area 1025, where a surface of the LED dome is in contact with the sapphire. A retaining mechanism, such as mechanism 1003 as shown, may be used to secure the sapphire and provide compression between the sapphire and LED domes to enhance contact. The LED domes may be flattened on top to provide additional contact surface area. For example, the domes may be prefabricated with a flat top and/or may have a flat top machined during manufacturing or assembly.

In an exemplary embodiment LED/sapphire contact fabrication may be done using a process where LED elements, such as LEDs 1020, are soldered onto an MCPCB, with a spacer then placed over the assembled LEDs. The spacer may be used to position a cutting tool that is used to trim the LEDs to a predetermined height. The cutting tool may then trim the top of the LED domes to a substantially uniform height. This processing may be advantageously done after assembly of the LEDs on the circuit board to ensure uniformity of height of the trimmed LED tops (since LED height may vary due to variations in lead placement in the circuit board, soldering tolerances, and the like). By providing contact between the LEDs and sapphire (or other window element in some embodiments), LED temperatures may be lowered, which may further aid in reducing browning and output light degradation. For example, in example silicone rubber LED dome materials, it has been experimentally determined that browning is a function of temperature and may be a strong function of temperature. Moreover, it has been experimentally determined that LED device browning may be reversible by lowering operating temperature for a period of time.

It is believed based on experimentation that contact lowers temperature by two mechanisms: (1) by directing conduction of heat to the sapphire window; and (2) by reducing photons scattered back to the LED die. Photons reflected back are absorbed and create heat.

In addition to affecting browning, providing contact between the LEDs and sapphire elements may enhance light output by, for example, reducing Fresnel surface reflections from outside a silicone rubber dome and from inside the window. For example, sapphire has a high level of Fresnel surface reflection because of its high index of refraction (approximately n=1.78), and therefore contact may reduce losses due to reflection.

Reflected photons can be absorbed by the devices and converted into heat energy which also may have a negative impact on the LEDs. Hotter LEDs run at lower efficiencies, converting more of their input power into heat instead of photons. Hotter temperatures also correlate with browning damage modes in experimentation done by the assignee of the instant application.

Figure 24:
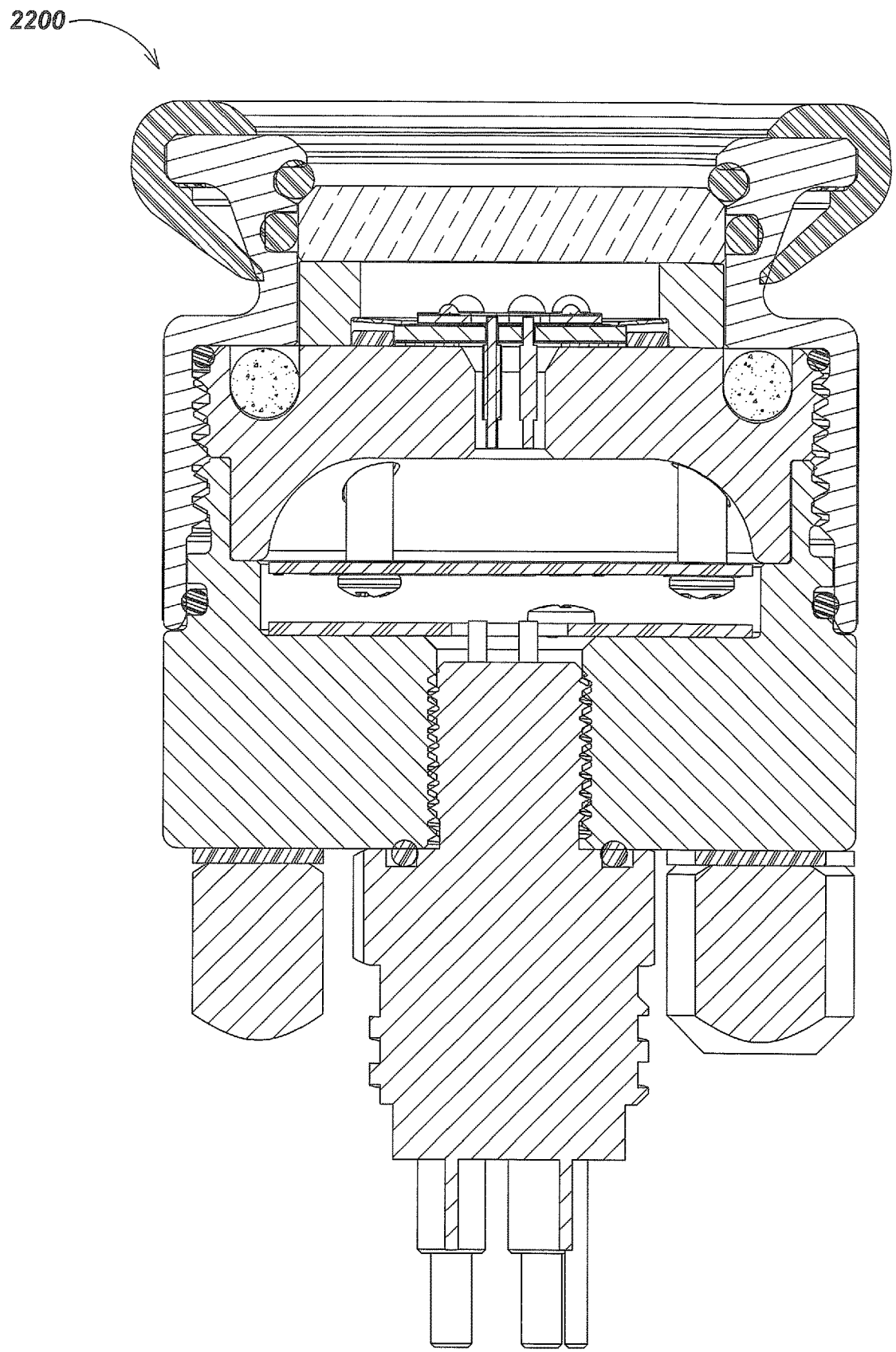
Figure 25:
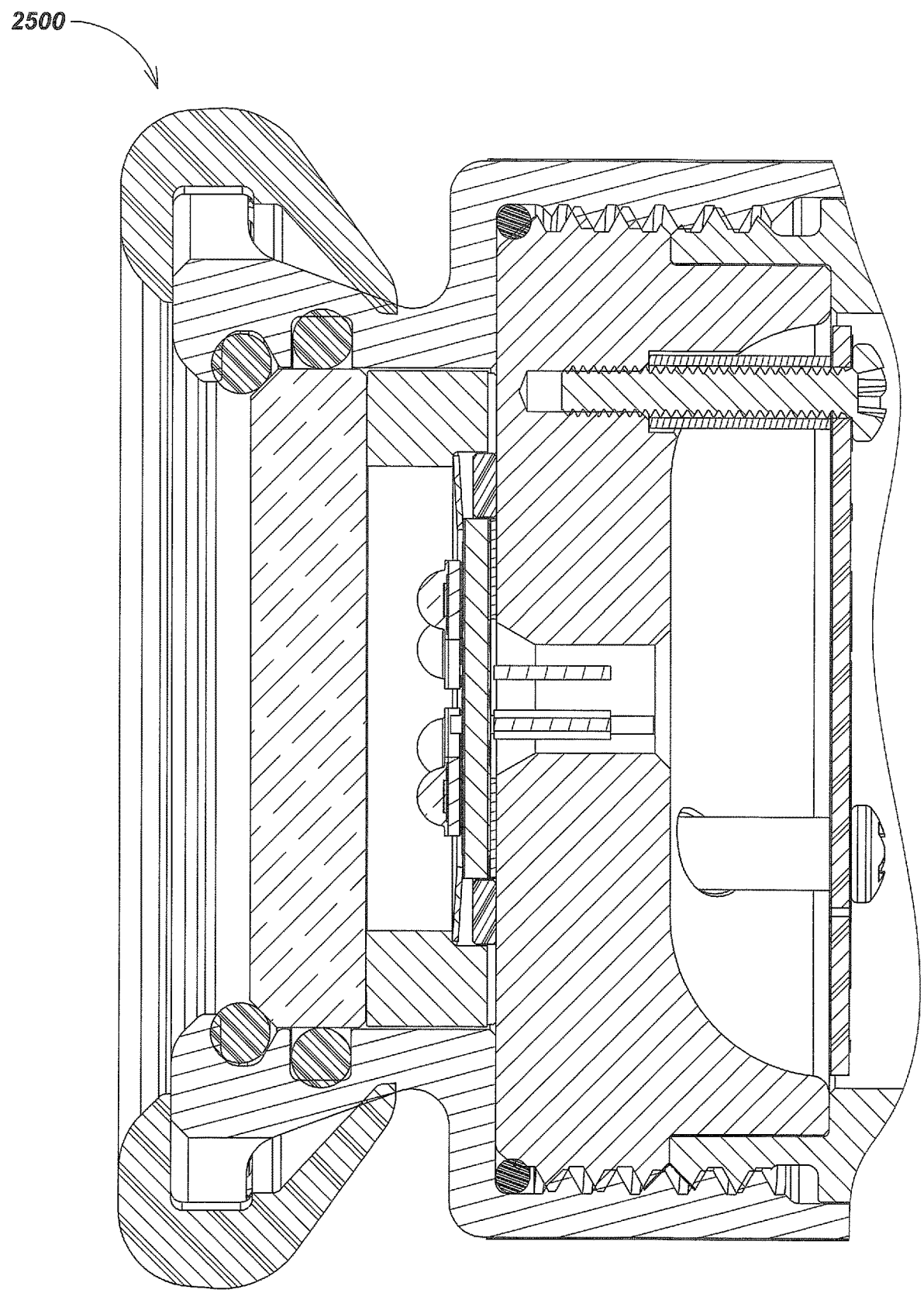

A similar effect may be achieved by using sapphire hemispheres about each LED, with the flat side clamped against the window or by using a sapphire ball lens in trapped contact between the LEDs and the inside of the pressure bearing window. Other variations, such as balls or round-shaped elements with a flat surface may similarly be used. Examples of somewhat similar configurations are described in co-assigned U.S. Utility patent application Ser. No. 11/350,627, filed Feb. 9, 2006, entitled LED ILLUMINATION DEVICES, the content of which is incorporated by reference in its entirety herein. For example, FIG. 24 illustrates such a configuration.

Figure 11A:
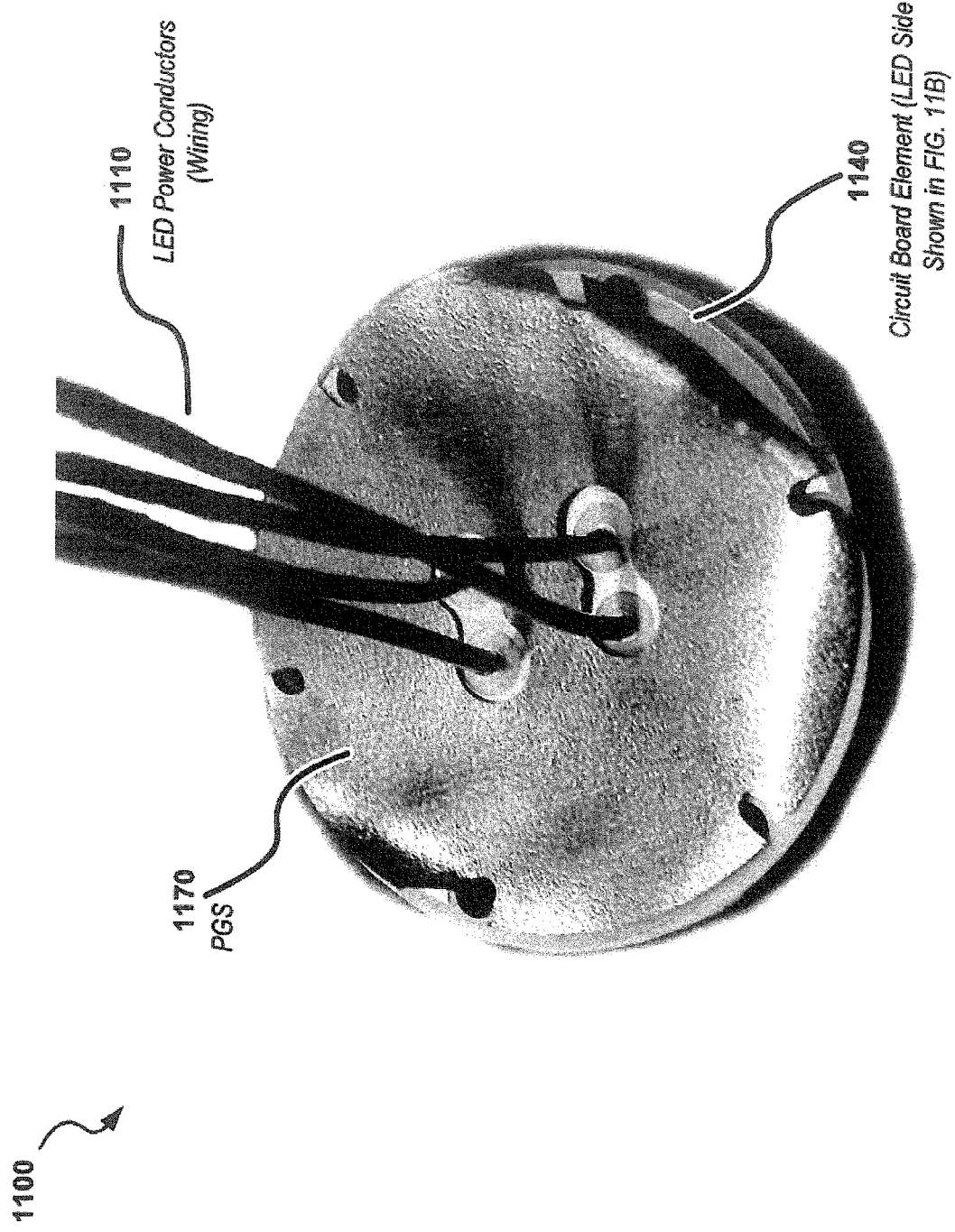
FIGS. 11A-11B illustrate details of an embodiment of a metal printed circuit board element with LEDs and wiring connections along with a graphite sheet for facilitating heat transfer and/or sealing.
Figure 11B:
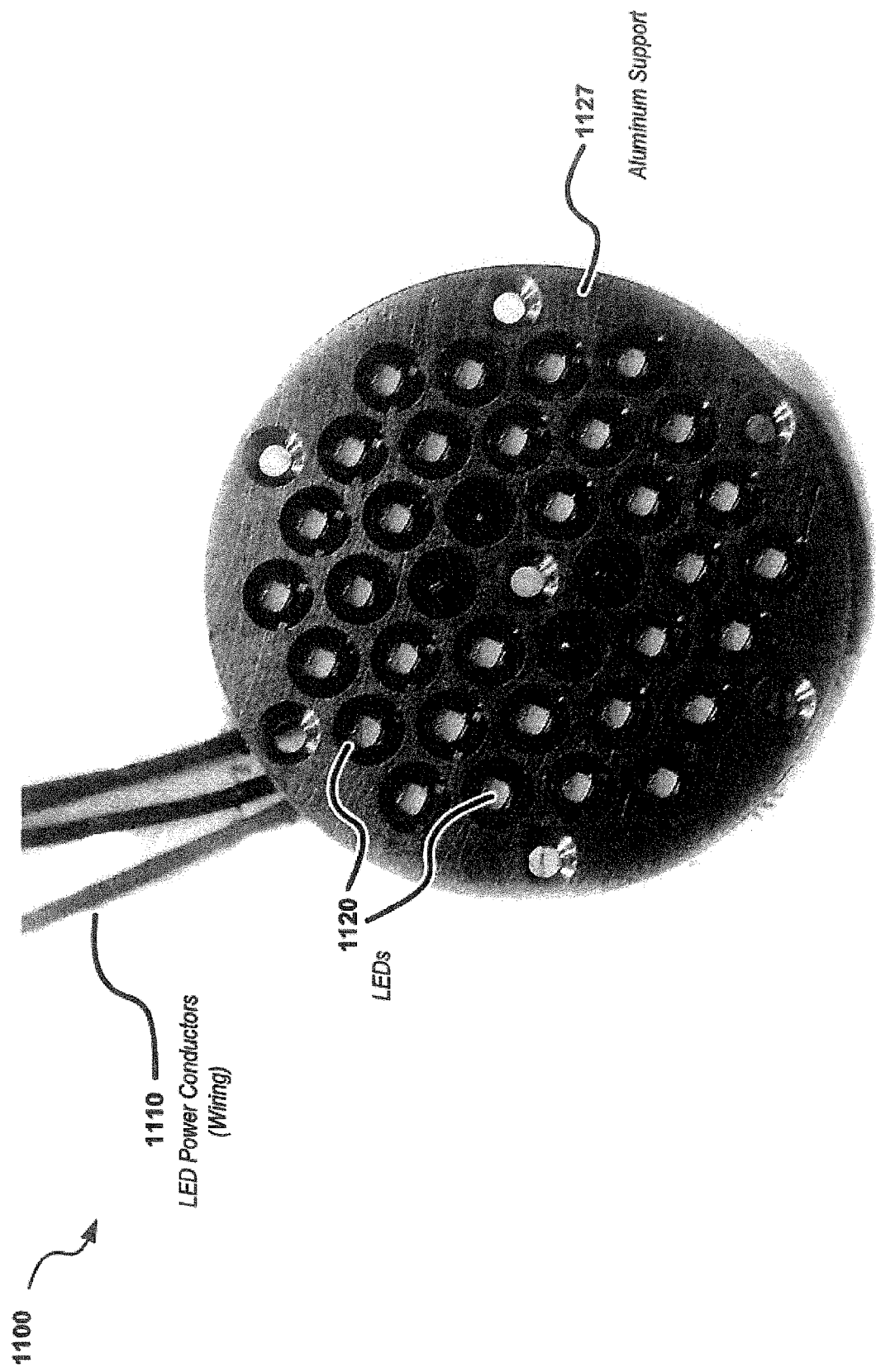

FIGS. 11A & 11B are photographs of one embodiment 1100 of elements of a light including an MCPCB 1140 along with a pyrolytic graphite sheet (PGS) 1170, LEDs 1120, an aluminum support structure 1127, and LED conductor leads 1110. Isolation of elements such as the insulation on leads 1110, as well as other electronic components, packing, etc., through use of the PGS may advantageously mitigate contamination from leakage of contaminating materials from the insulation and/or other components. FIG. 12 illustrates a photograph of one embodiment 1270 of a PGS with access slots/holes to allow contact of gases with potential contaminants to sequestering agents/browning agent destroyers.

Figure 13A:
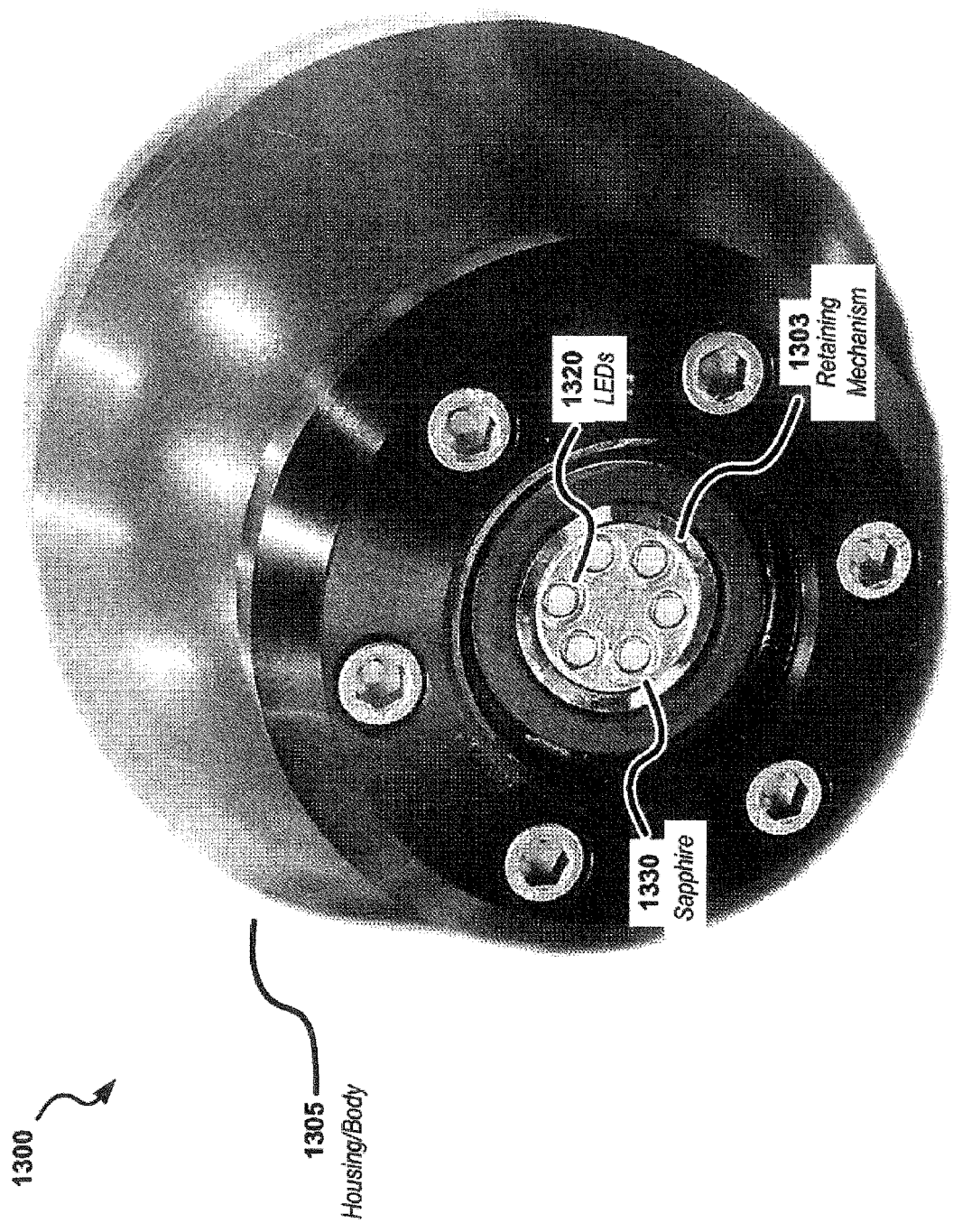
FIGS. 13A-13C illustrate details of one embodiment of an underwater lighting device which may internally include sequestering agents/browning agent destroyers and graphite materials for sealing and/or heat transfer.
Figure 13B:
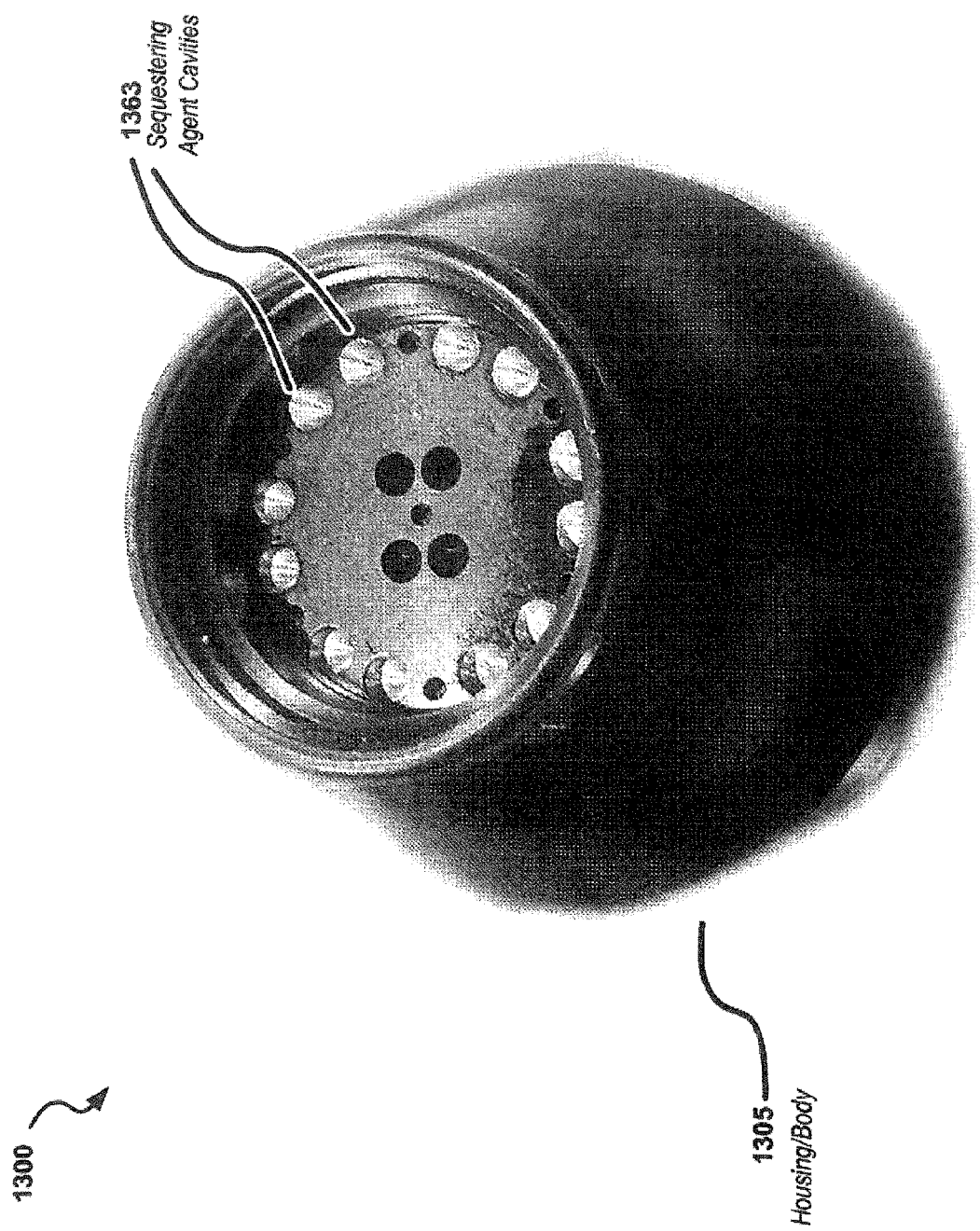
Figure 13C:
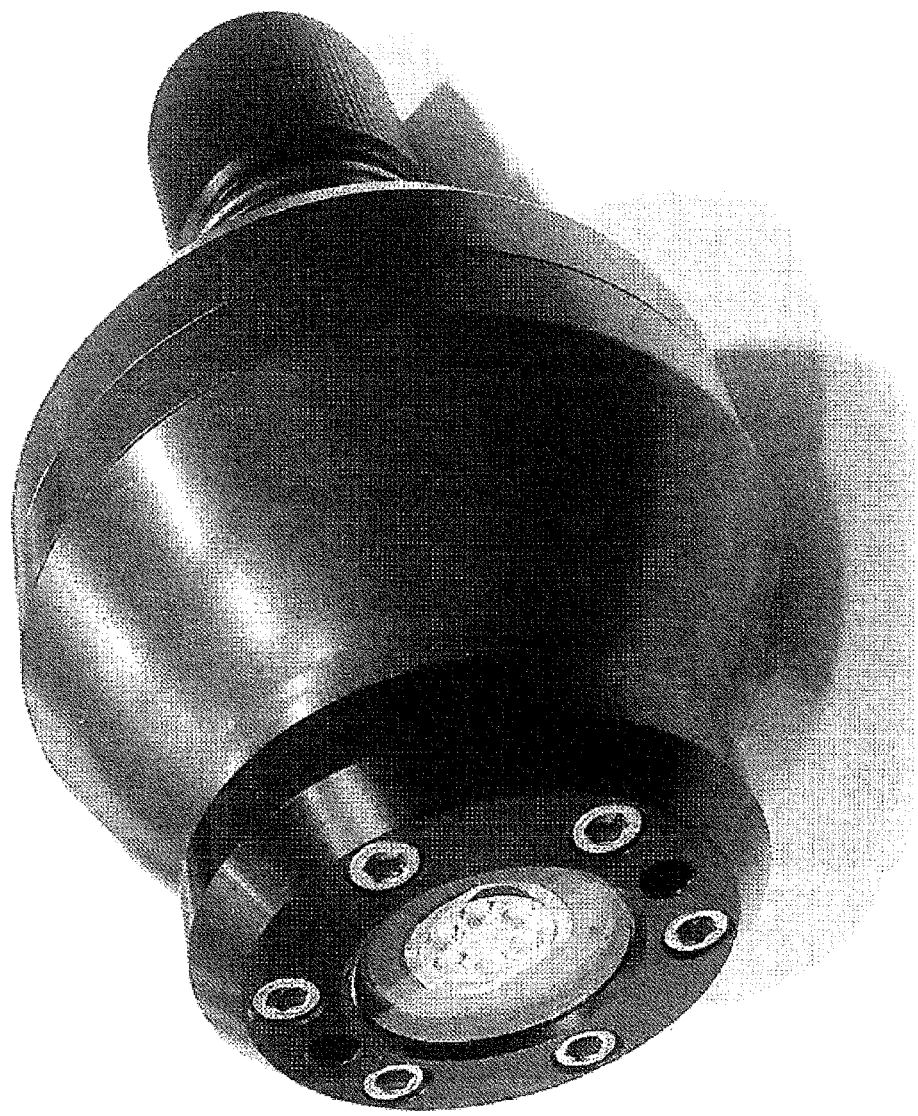

FIGS. 13A-13C are photographs of one embodiment 1300 of an underwater lighting device configured to withstand water pressures such as may be experienced in the deep sea, where pressures may reach thousands of pounds per square inch (PSI). For example, at one mile of depth, the pressure is approximately 2300 PSI, and pressures increase further as depth increases, thereby requiring very high structural integrity to withstand these pressures during operation.

Device 1300 may include, internally, sequestering agents/browning agent destroyers and/or graphite materials, and/or sapphire/LED dome contacts to provide enhanced light output and/or reduce browning or other operational problems while withstanding deep sea water pressures. As shown in FIG. 13A, an optically transparent window 1330 may be in contact with LED elements 1320 of an LED array, and may be held in place in housing/body 1305 and/or compressed with a retaining mechanism, such as ring 1303. FIG. 13B illustrates details of the interior of lighting device embodiment 1300, where cavities 1363 may be used to retain sequestering agents/browning agent destroyers within internal volumes of housing 1305. Graphite materials (not shown in FIG. 13B) may be used to seal certain volumes of the interior of the housing while facilitating heat transfer to the body 1305 and to water in contact with the body. FIG. 13C is a photograph illustrating additional details of underwater lighting device embodiment 1300 in an isometric view.

FIG. 14 illustrates another embodiment of a lighting device 1400 which may be configured similarly to device 1000 of FIG. 10, while extending the graphite material 1470 to additional surfaces of the housing or body. In general, the components shown in FIG. 14 are the same or similar to those shown in FIG. 10, however, the body of device 1400 may include additional components, such as upper section 1403 and lower section 1405.

Figure 15:
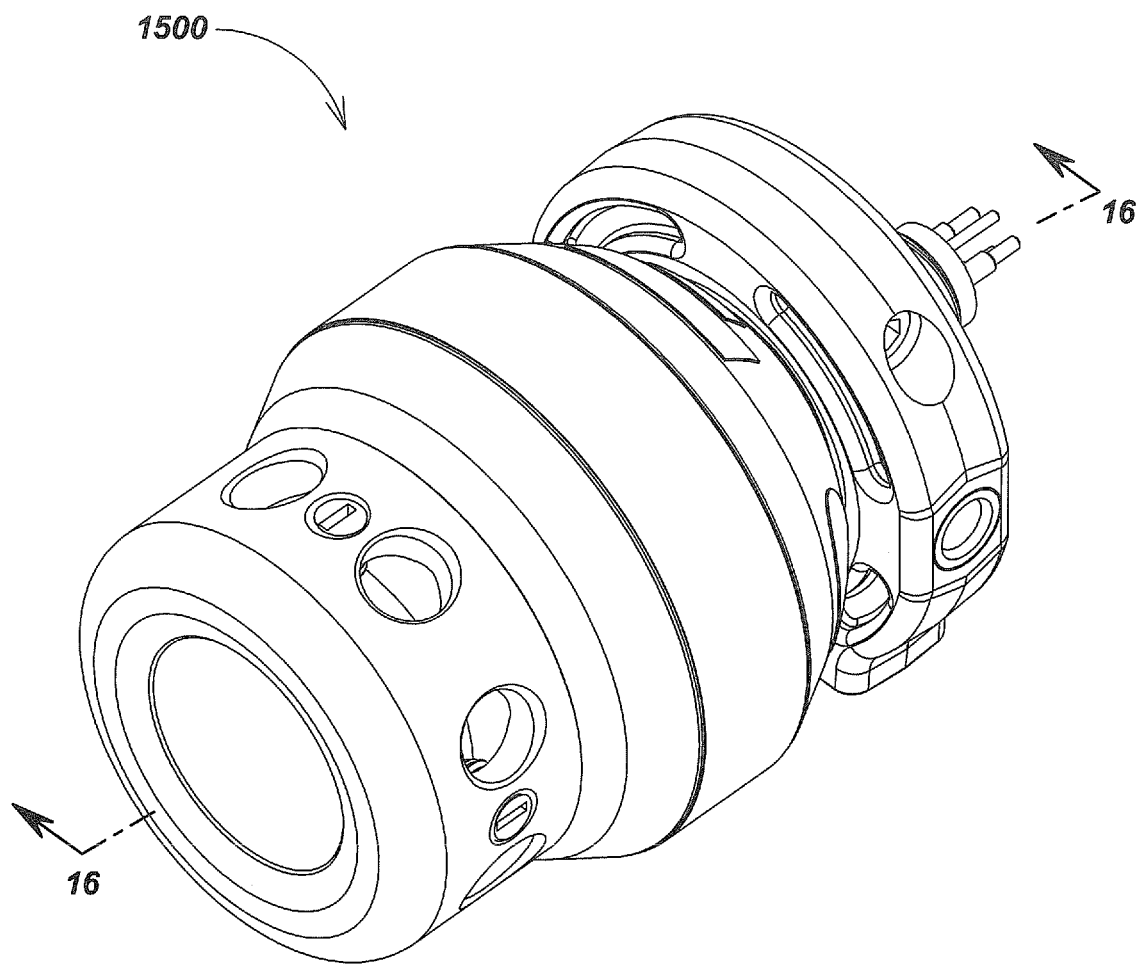
FIGS. 15-31 illustrate details of various embodiments of lighting devices that include sequestering agent/browning agent destroyers and/or graphite materials.
Figure 16:
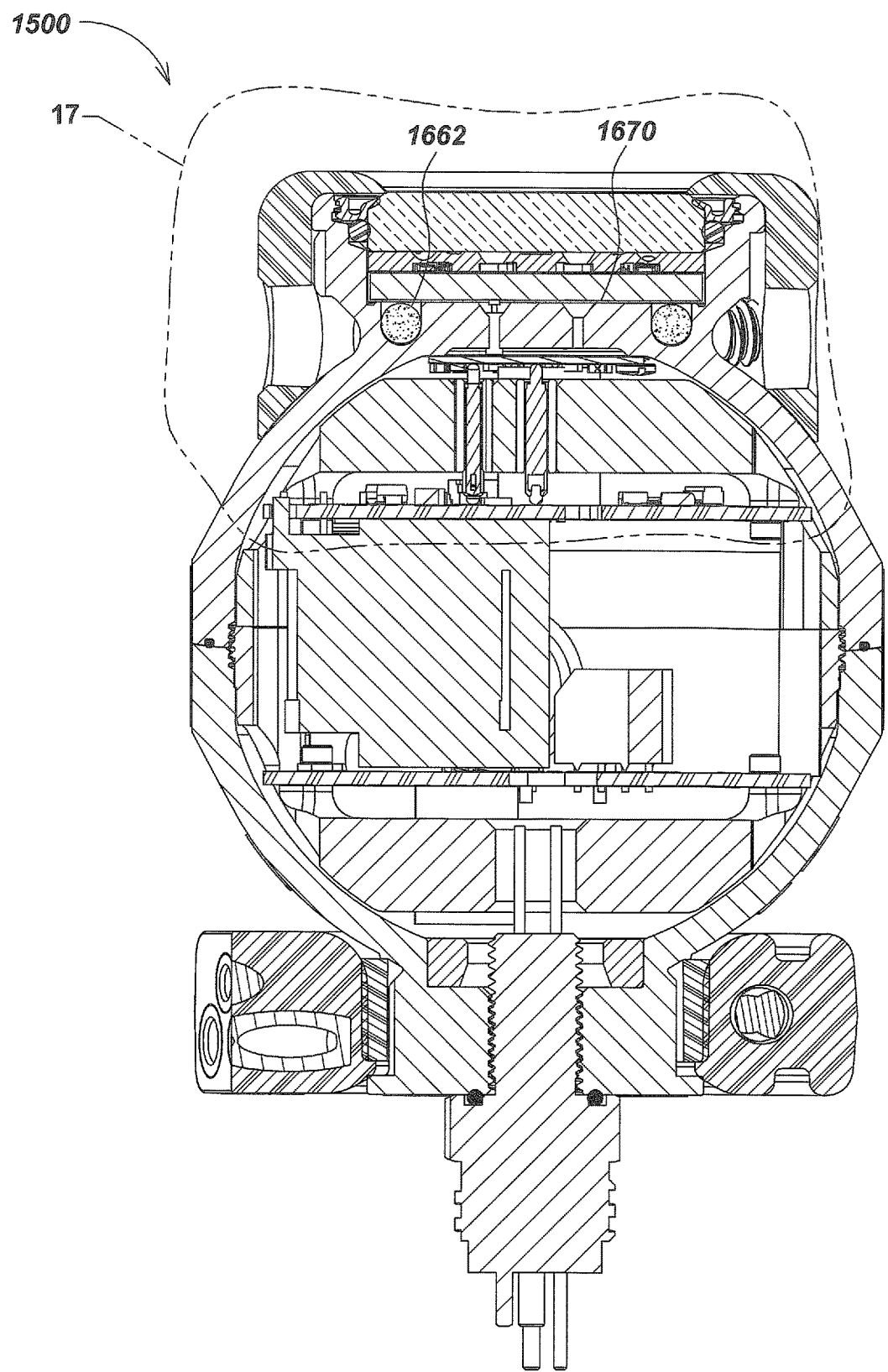
Figure 17:
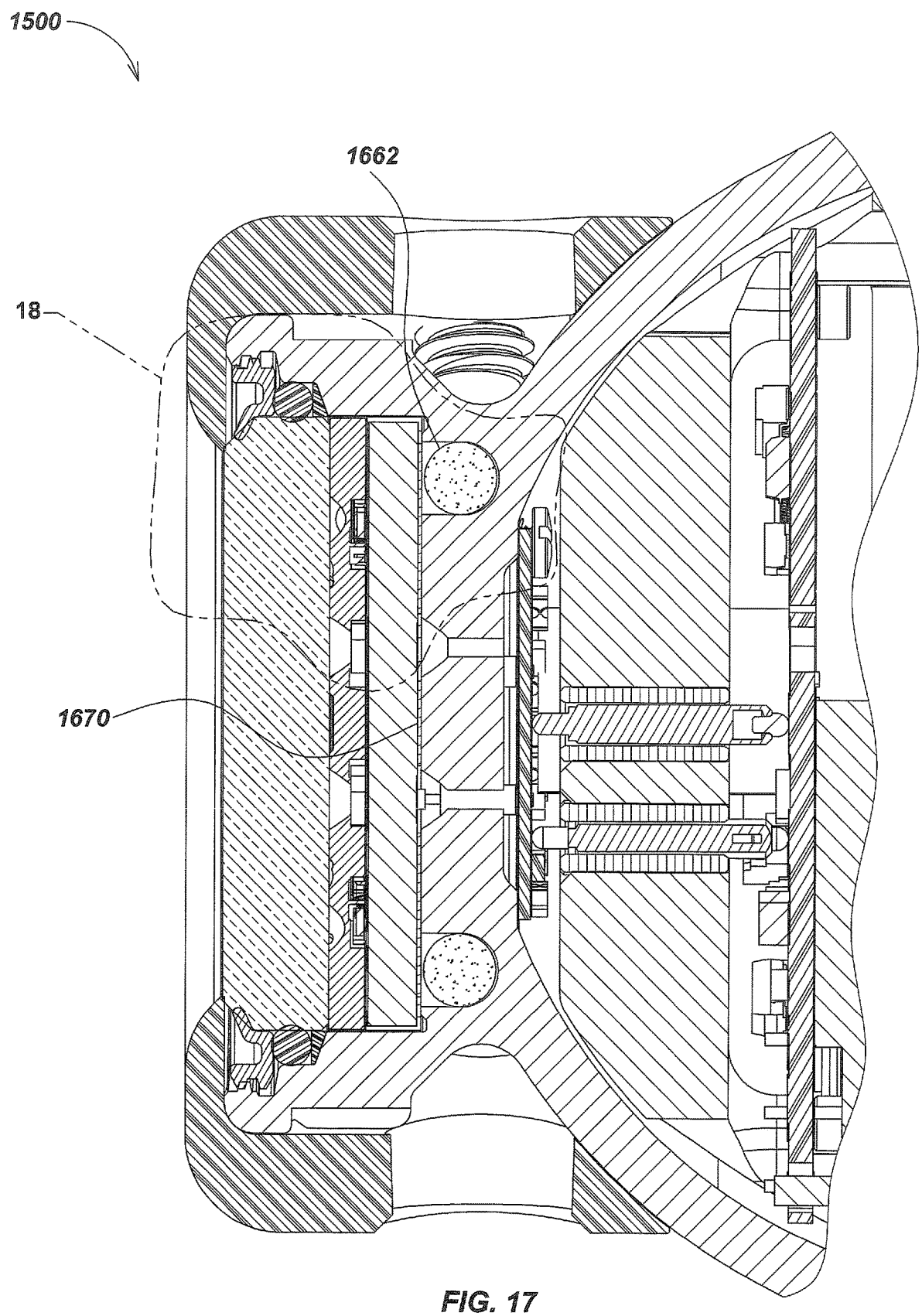
Figure 18:
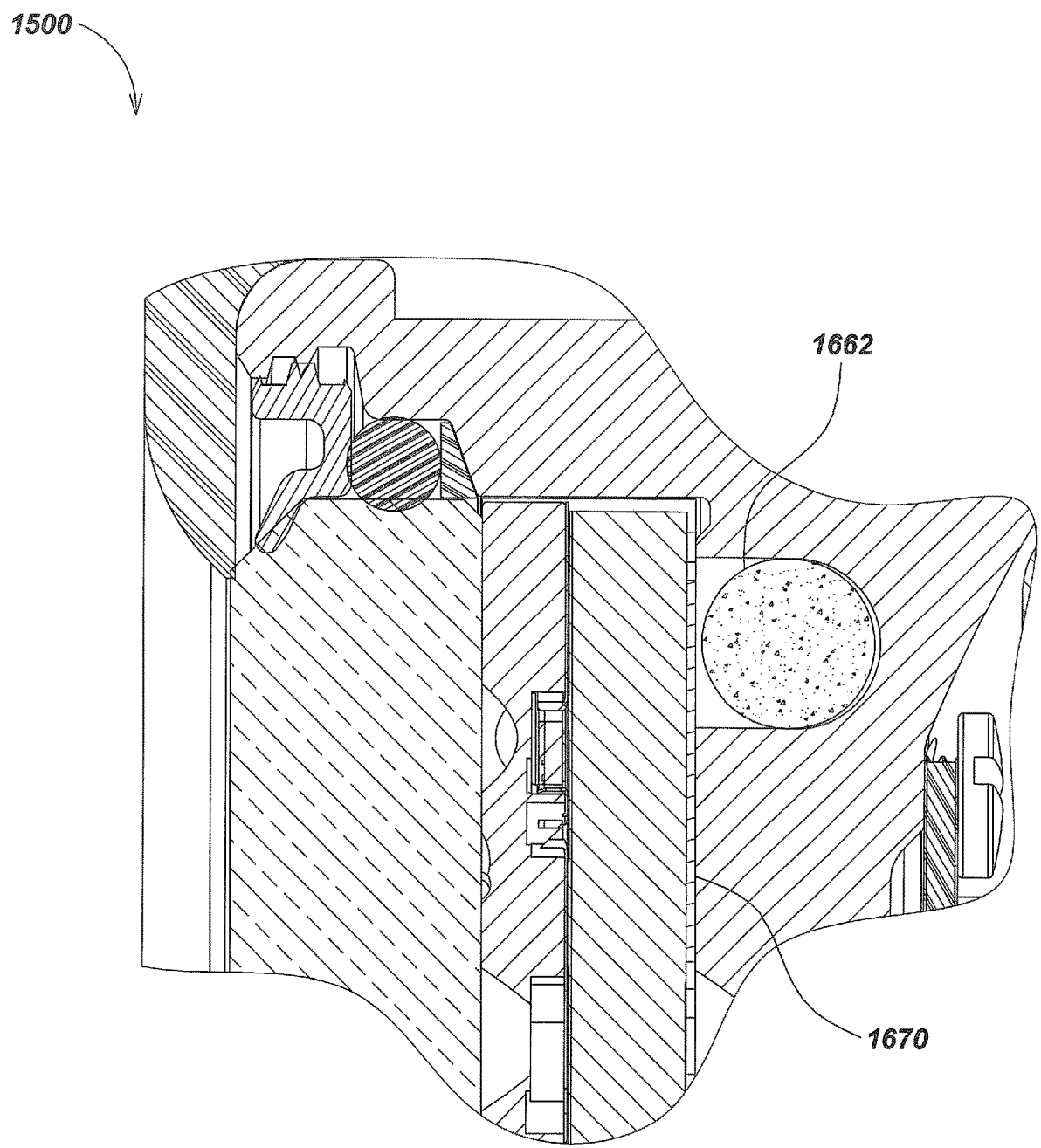

FIG. 15 illustrates details of another embodiment of a lighting device 1500 which may include graphite materials and/or sequestering agents/browning agent destroyers internally. FIGS. 16-18 show additional details of embodiment 1500. For example, device 1500 may include sequestering agents/browning agent destroyers 1662 which may be positioned in the device 1500 as shown. Graphite materials 1670, such as a PGS sheet or other graphite materials, may also be included to facilitate heat transfer and/or seal volumes of the lighting device.

Figure 19:
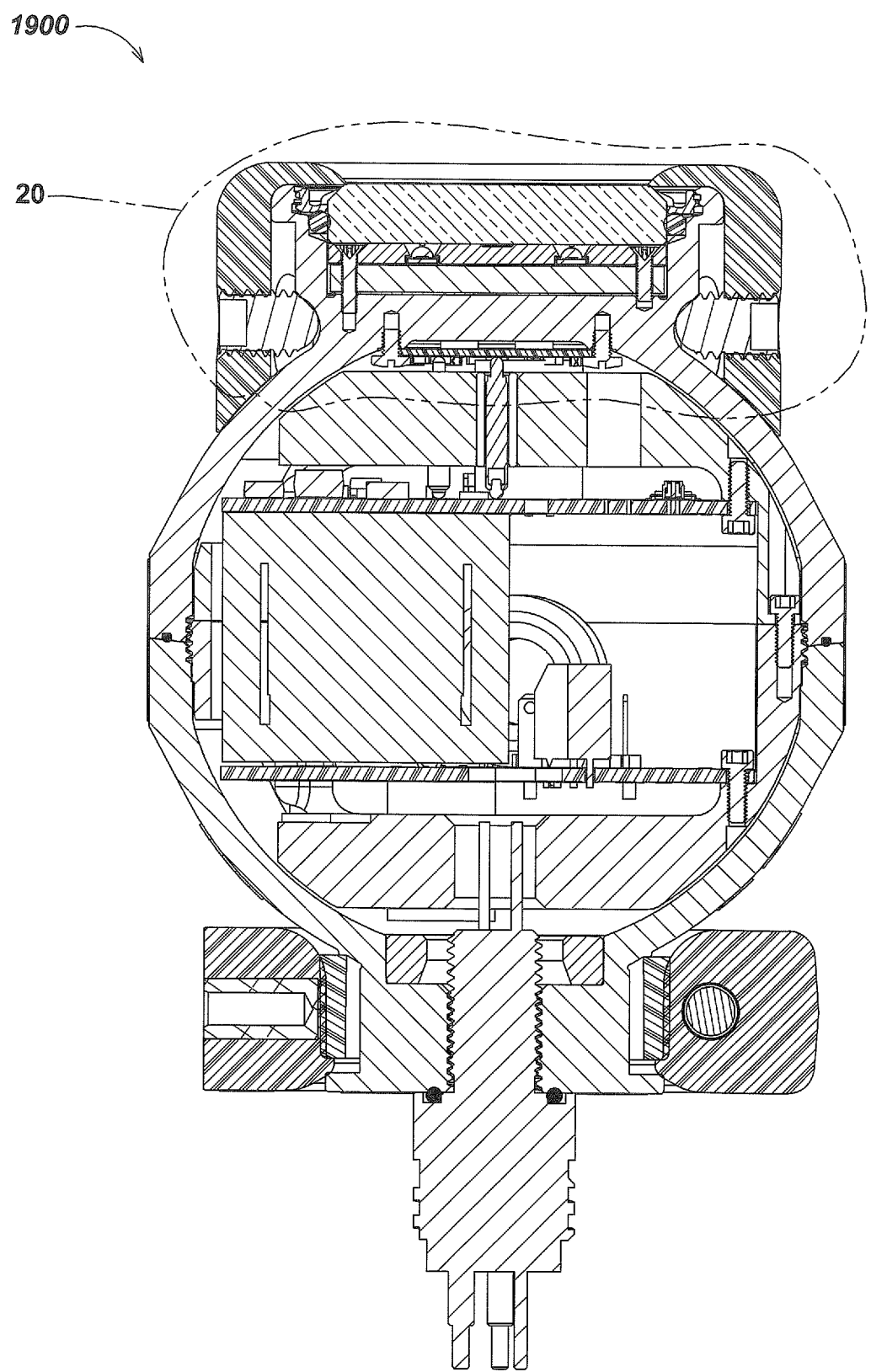
Figure 20:
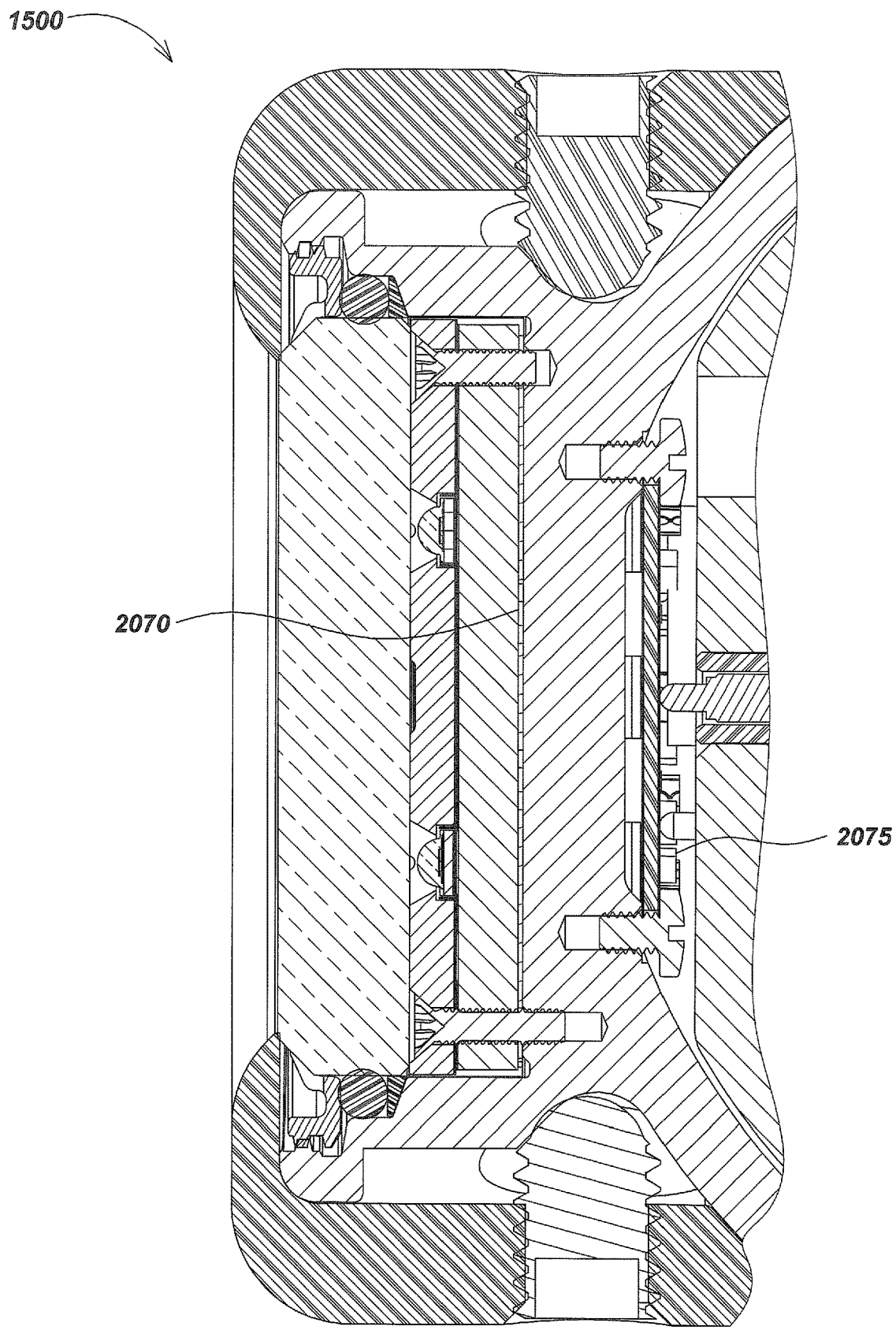

FIGS. 19 & 20 illustrate details of another embodiment 1900 of a lighting device and associated graphite materials 2070 and a thermal control PCB 2075.

Figure 21:
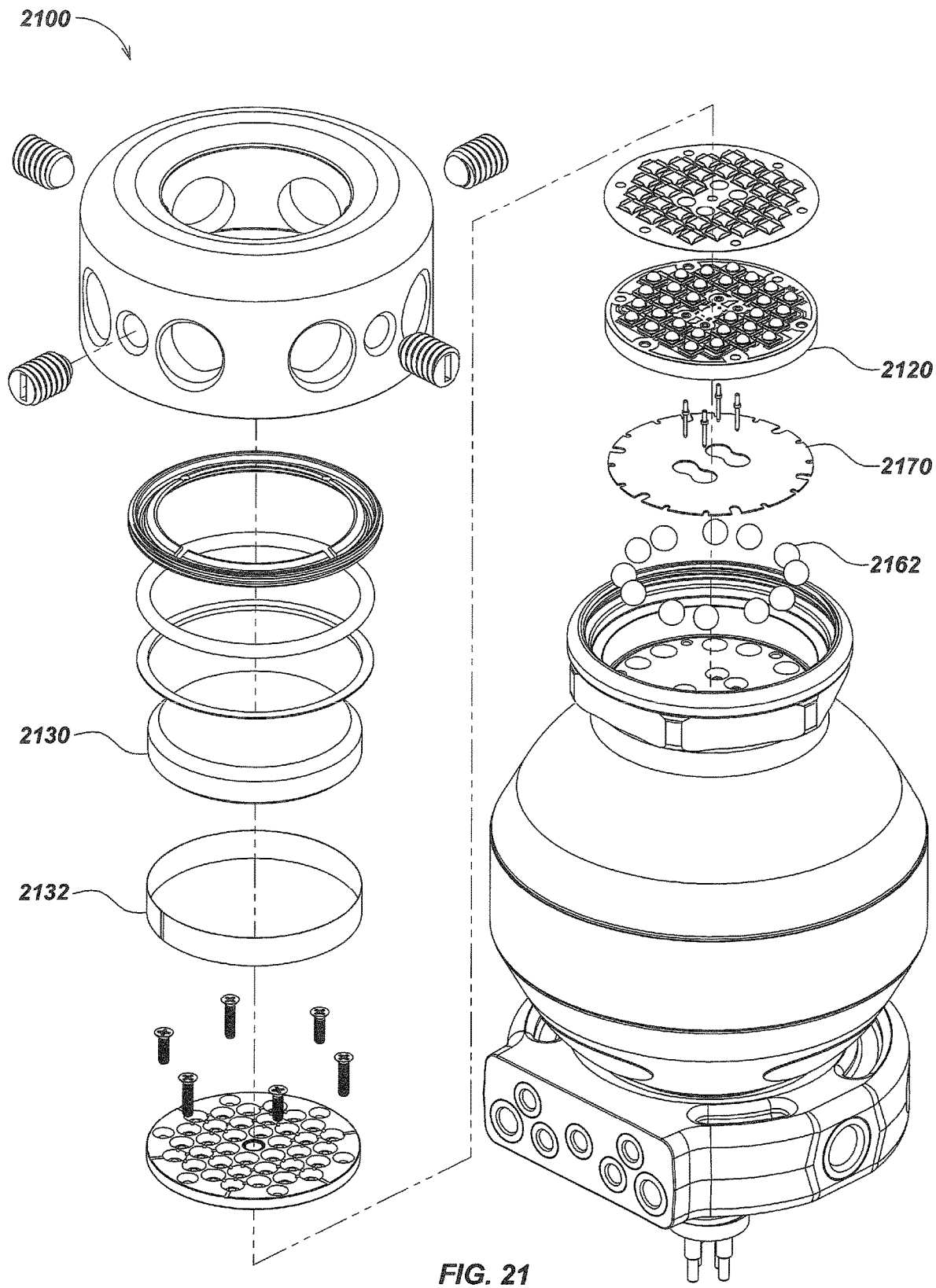
Figure 22:
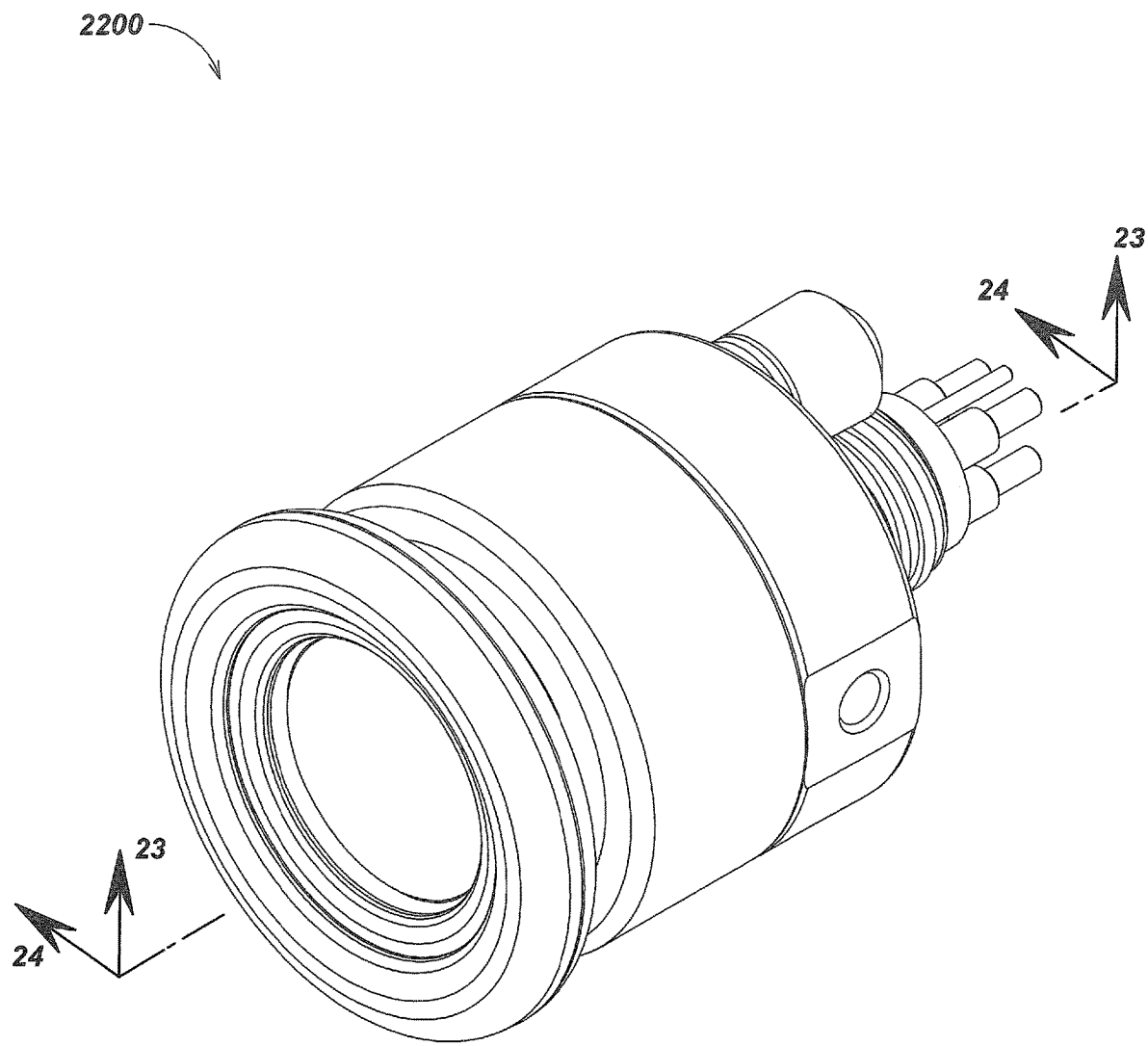
Figure 23:
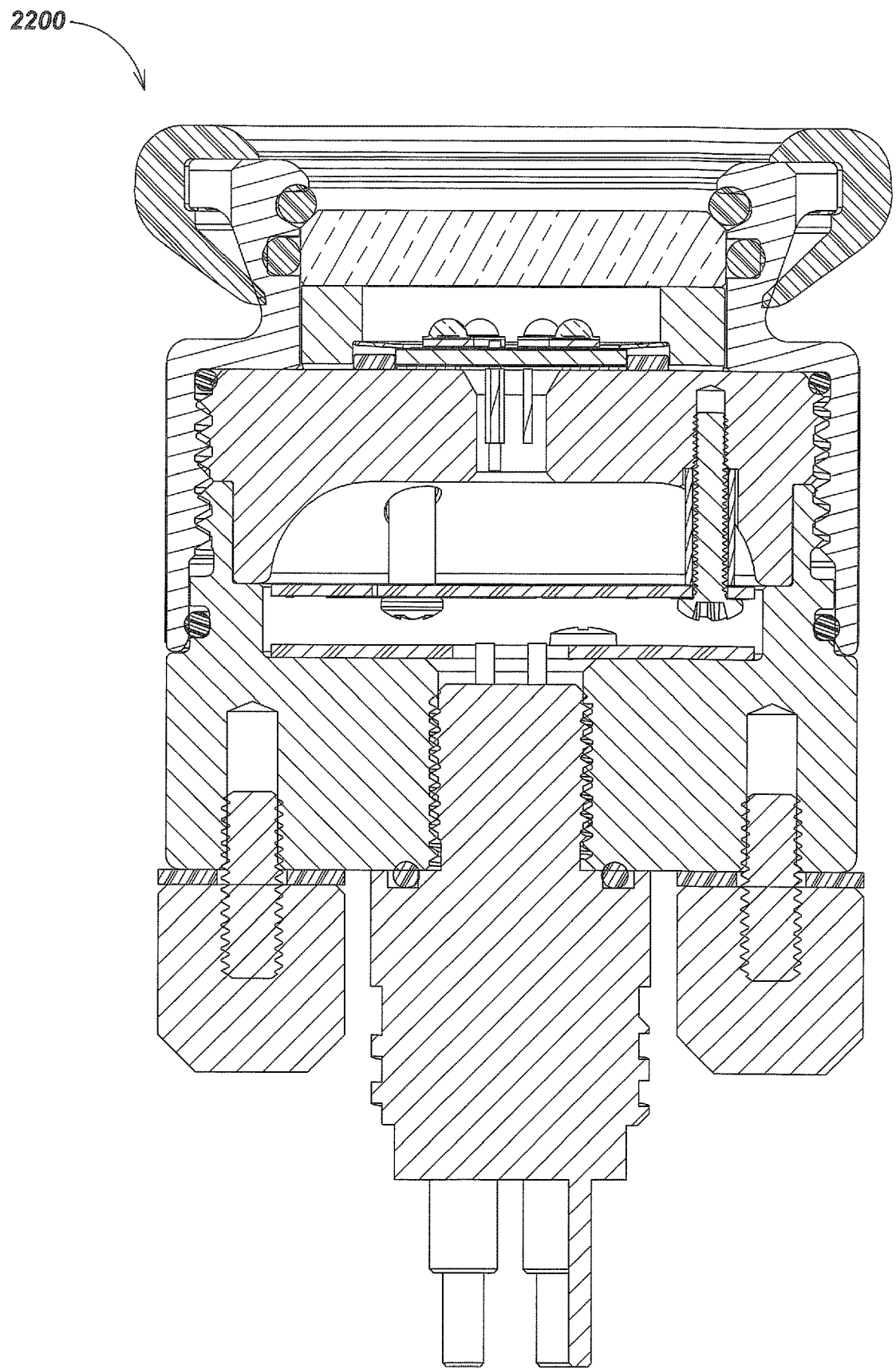

FIG. 21 illustrates an exploded view of an embodiment 2100 of a lighting device. As shown in FIG. 21, lighting device 2100 may include a window 2130, which may be a sapphire window, along with mechanical and structural elements and body elements, which may be assembled as shown. A kapton side sheet 2132 may be used in the window assembly as shown. Internally, sequestering agents/browning agent destroyers 2162 may be disposed in the body. An LED array 2120 may be mounted on a circuit element and may have a graphite material 2170, such as a PGS material, in contact with the circuit element and body, such as is shown.

FIGS. 22-25 illustrate details of embodiments 2200, 2400, & 2500 of lighting devices which may internally include sequestering agents/browning agent destroyers and/or graphite materials for heat transfer and/or internal volume sealing.

Figure 26:
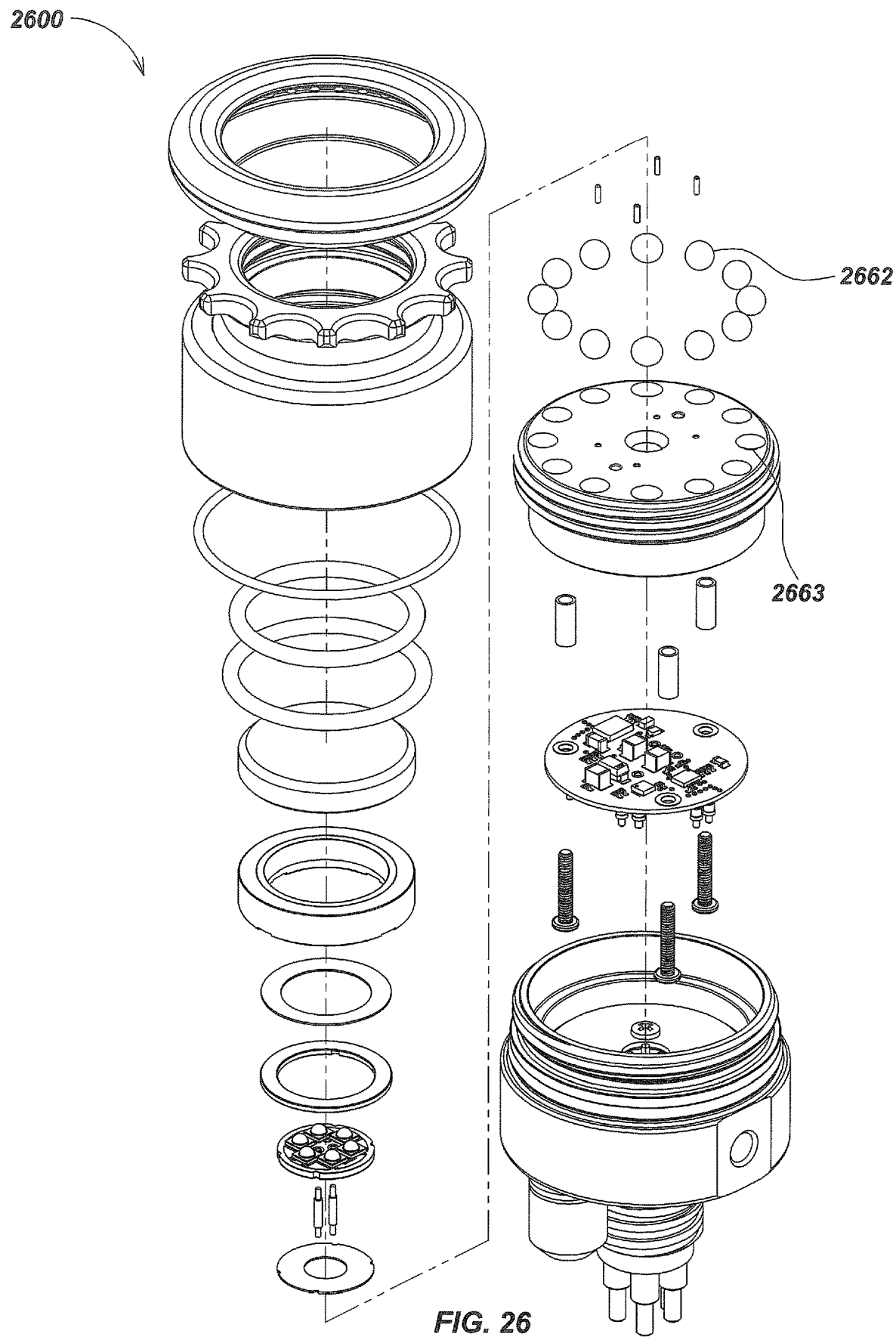

FIG. 26 illustrates exploded views of details of an embodiment 2600 of a lighting device that may include sequestering agents/browning agent destroyers 2662, which may be disposed in cavities 2663 as shown.

Figure 27:
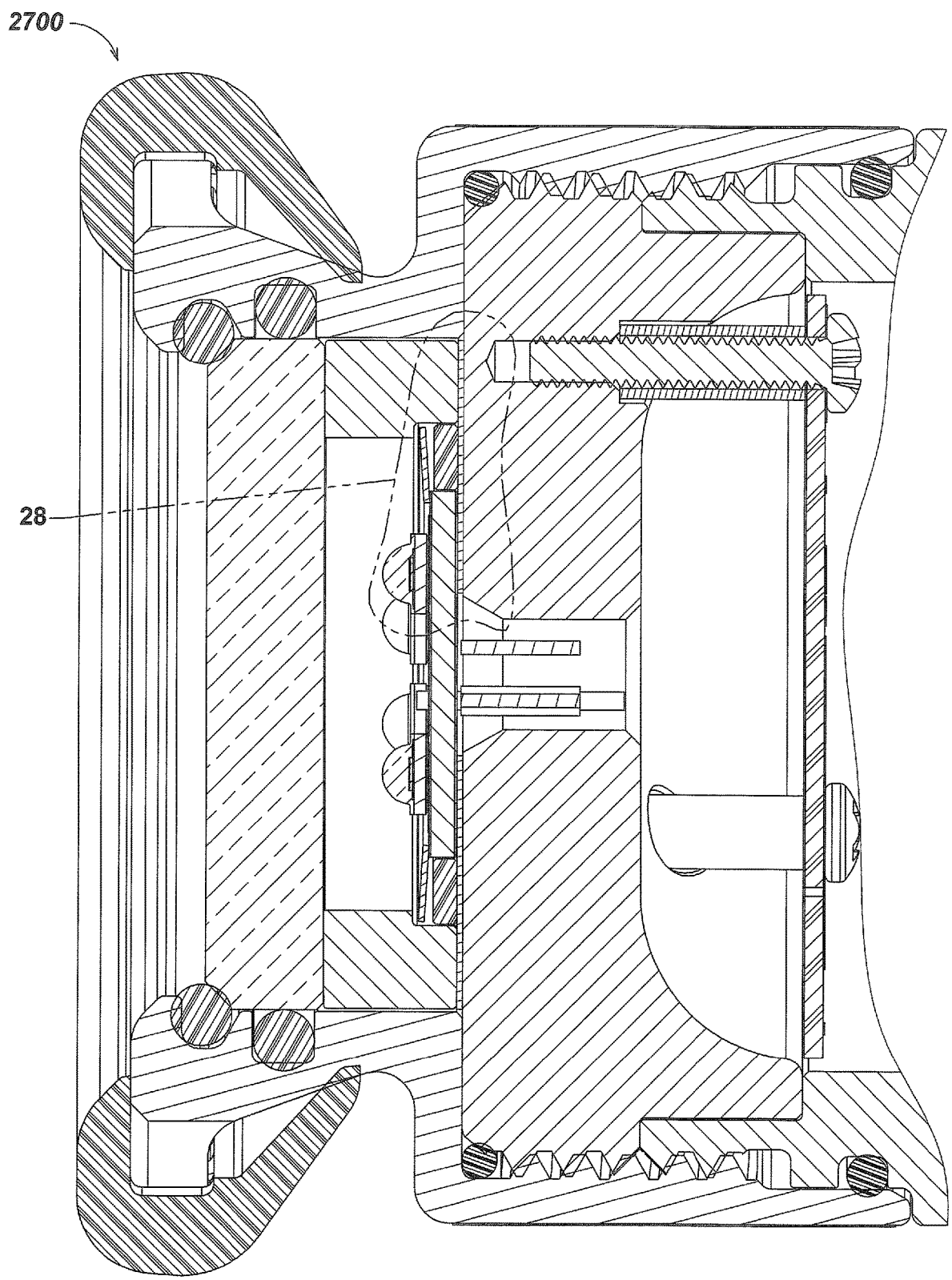
Figure 28:
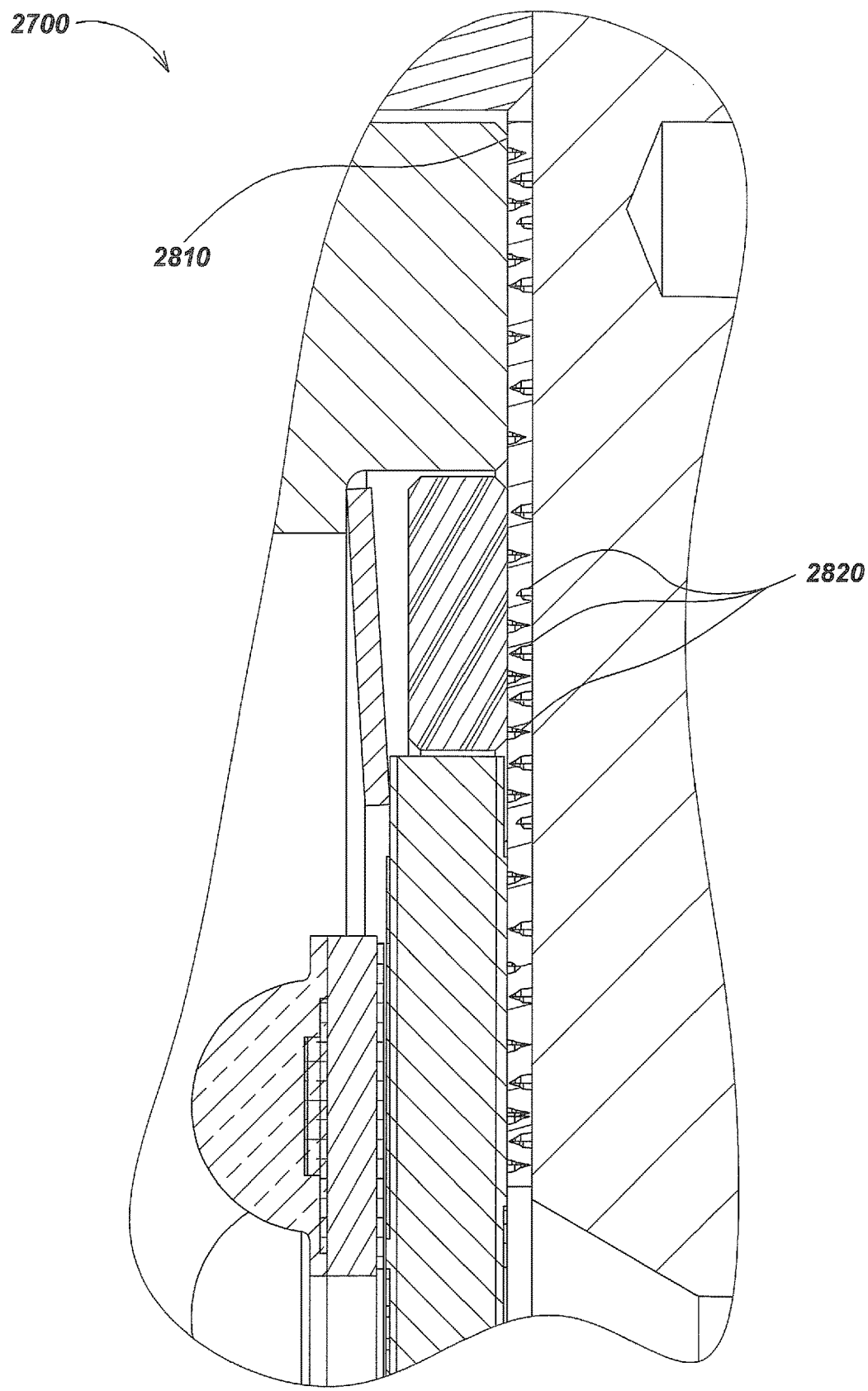

FIGS. 27 & 28 illustrate additional details of a lighting device embodiment 2700 which may internally include sequestering agents/browning agent destroyers and/or graphite materials. As shown in FIG. 28, embodiment 2700 may further include heat transfer spikes or particles 2820, such as diamonds or other conductive materials, which may be embedded in a graphite sheet 2810 for enhancing heat transfer. Further examples are described subsequently with respect to FIGS. 34 and 35.

In one implementation, a diamond dust/silicone grease slurry was fabricated and used in place of the graphite. The temperature drop was more than using grease or diamond dust alone, which may make this advantageous in some applications.

Figure 29:
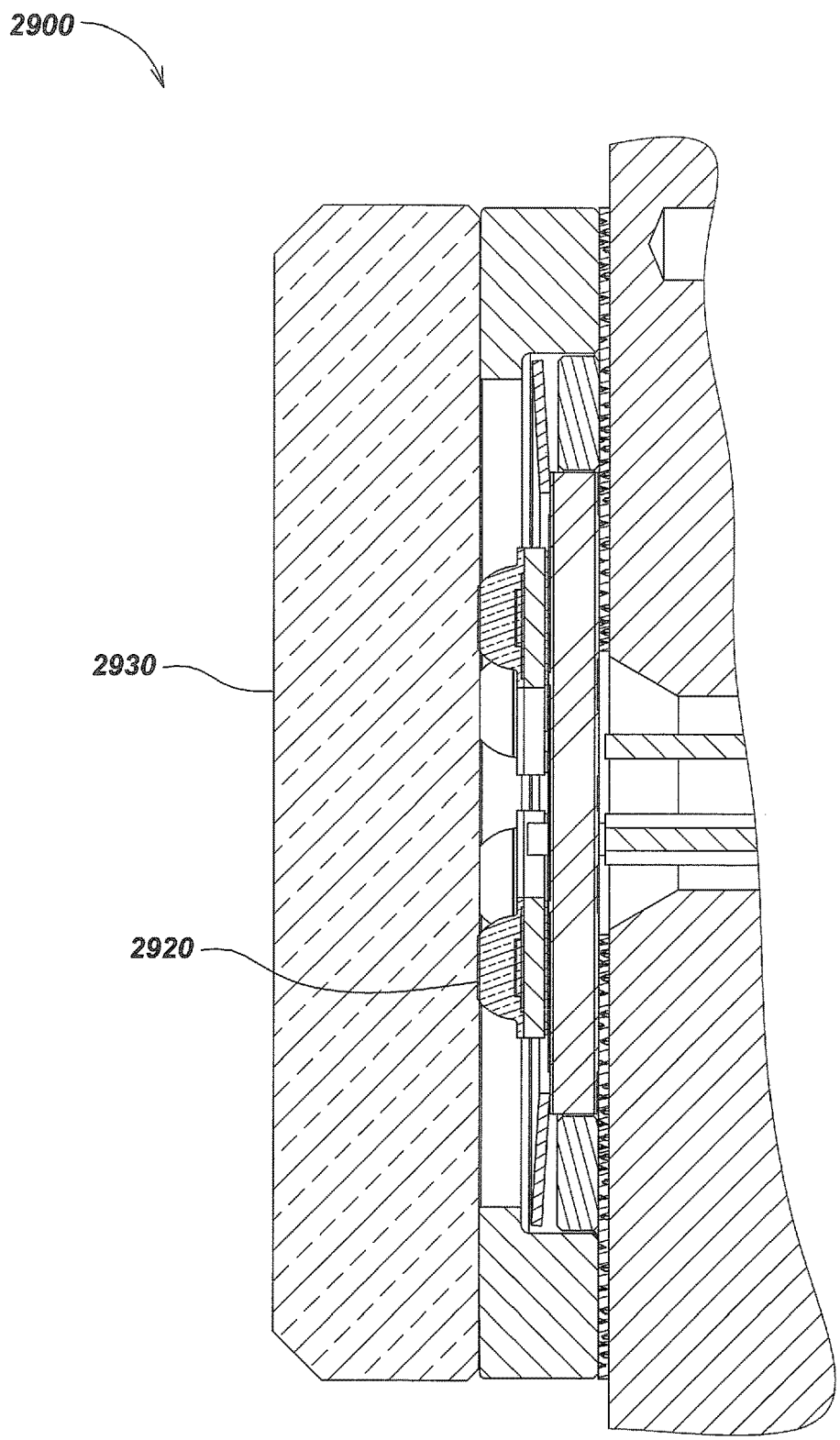

FIG. 29 illustrates additional details of a lighting device embodiment 2900 wherein an optically transparent window 2930 is configured to be in contact with a flat top surface of LED elements 2920, such as silicone LED domes, such as described previously herein.

Figure 30:
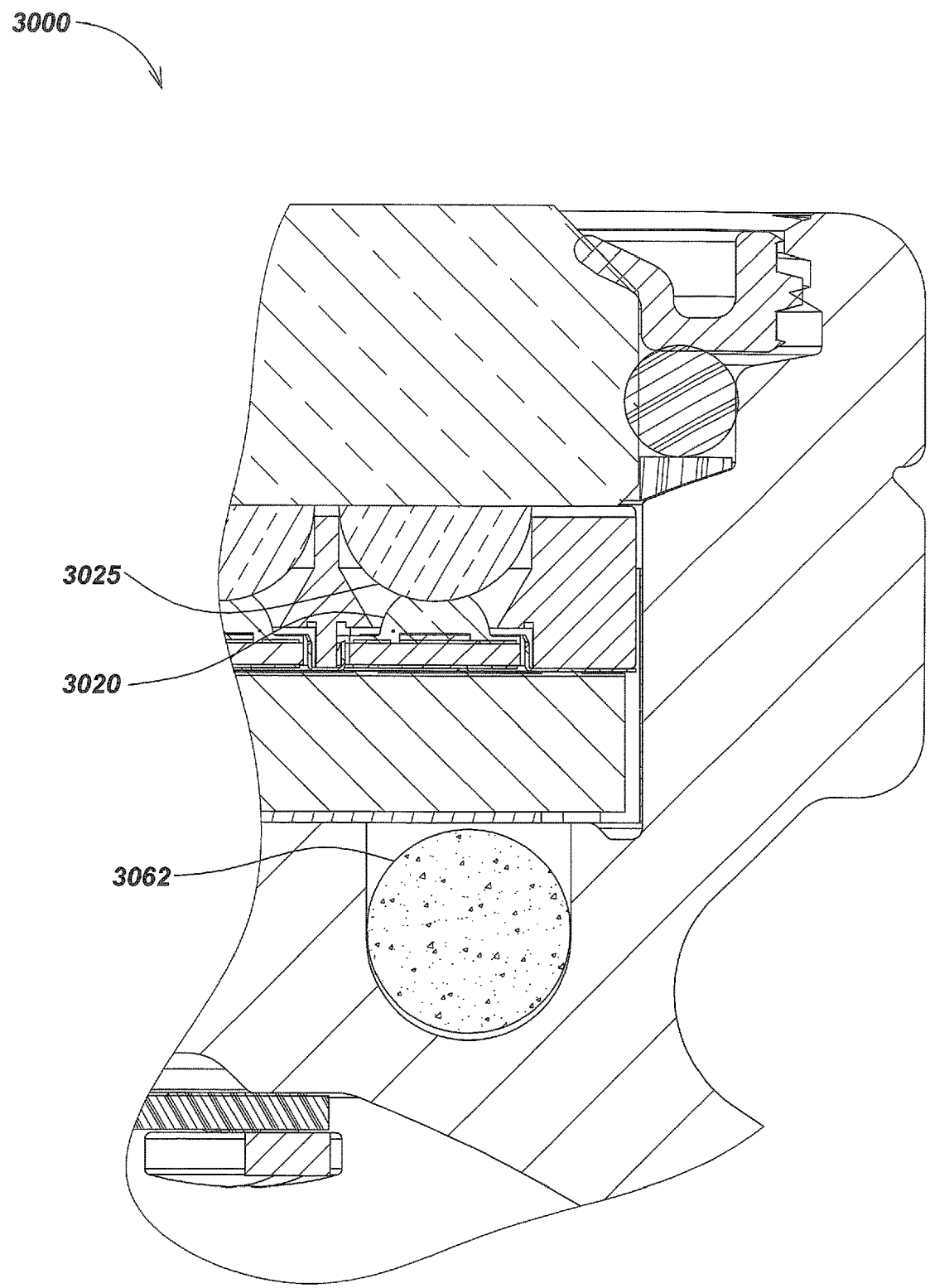
Figure 31:
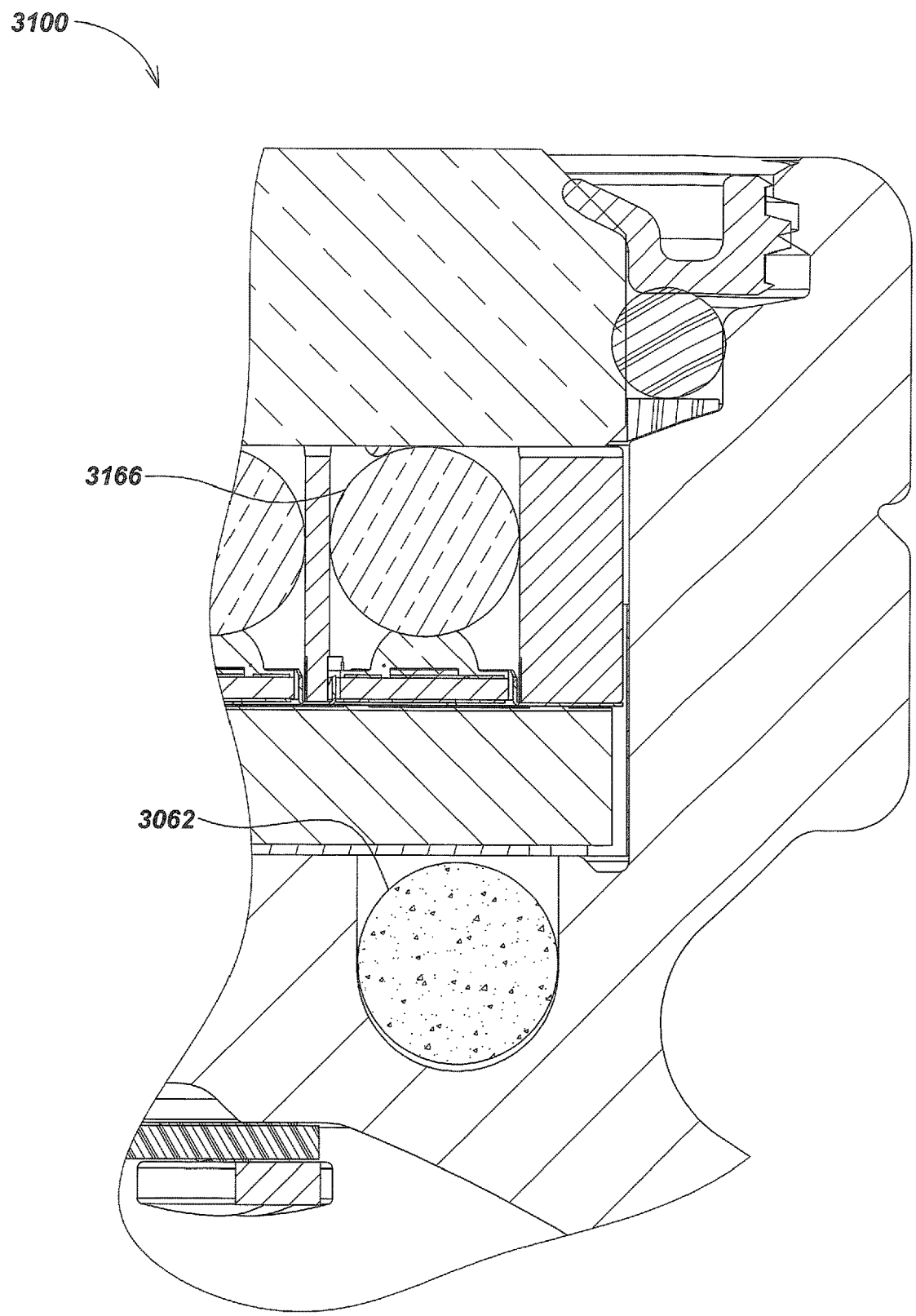

FIGS. 30 & 31 illustrate details of embodiments 3000 & 3100 of lighting devices including rounded elements, such as hemisphere 3025, in contact with a dome of LED 3020 to facilitate optical output improvement and/or reduce browning such as described previously herein. FIG. 31 illustrates a sphere 3166 that may be similarly configured to aid in light output and/or browning reduction. Embodiments 3000 & 3100 may include a sequestering agent/browning agent destroyer 3062 disposed internally in a cavity as shown as well as graphite materials such as PGS (not shown) to aid in sealing and/or heat transfer.

FIGS. 32A & 32B illustrate details of corresponding embodiments 3200A and 3200B of graphite materials in the form of pyrolitic graphite sheets (PGSs). In a typical graphite sheet material, heat conductivity is asymmetric due to atomic structure. Consequently, heat transfer may be larger, and, in some cases, substantially larger (e.g., on the order of 10× or more) in certain axes. For example, in the embodiments shown in FIGS. 32A & 32B, heat conduction may be greater in the X-y plane than in the Z axis. Consequently, if the PGS is used as a sealing gasket, such as described previously herein, heat conduction between mating surfaces may be less than heat conduction across the gasket. In order to improve heat conduction, the PGS material and/or associated mating surfaces may be modified to improve Z-axis heat conduction.

Figure 33:
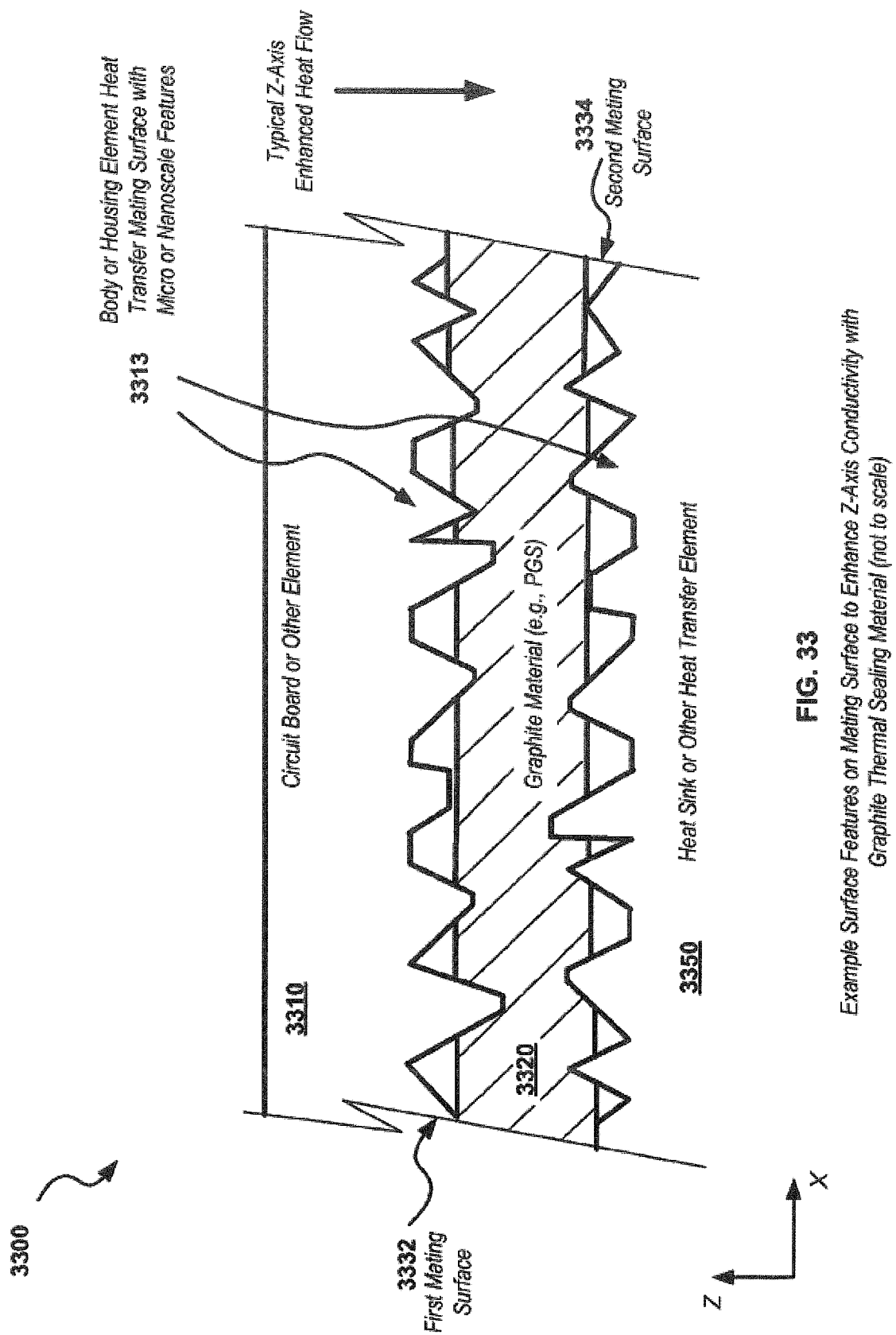
FIG. 33 illustrates details of an embodiment of a sealing and/or heat transfer junction between elements of a lighting element where mating surfaces include micromachined and/or nanostructured features to aid in heat conduction.

One example of such a modification is shown in FIG. 33, which illustrates details of an embodiment 3300 of a heat conduction interface between two elements of a lighting device. The elements may be, for example, a circuit board such as an MCPCB, or other component, and an element of the body of the lighting device or other heat transfer element. For example, a PGS 3320 may be positioned between a circuit board element 3310 and a heat sink or other heat transfer surface of the device body 3350. This configuration results in two mating surfaces, 3332, and 3334, in contact with the graphite material 3320. In order to improve heat conduction in the Z-axis, such as heat conduction away from the MCPCB to dissipate heat generated by the LEDs, the first 3332 and/or second 3334 mating surfaces may be configured with micro or nano-scale features 3313 to contact and/or penetrate portions of the graphite sheet 3320 to aid in Z-axis heat conduction. For example, sharp features as shown may be micro-machined, nanofabricated, or otherwise formed into one or both mating surfaces to partially or, in some cases, fully penetrate the PGS 3320. In general, in order to provide sealing, it may be undesirable to fully penetrate the PGS 3320, however, in some cases the surface may be configured to allow full penetration, particularly if sealing is not necessary in the particular surface mating area(s) and/or if penetration can be done such that some sealing is maintained.

Figure 34:
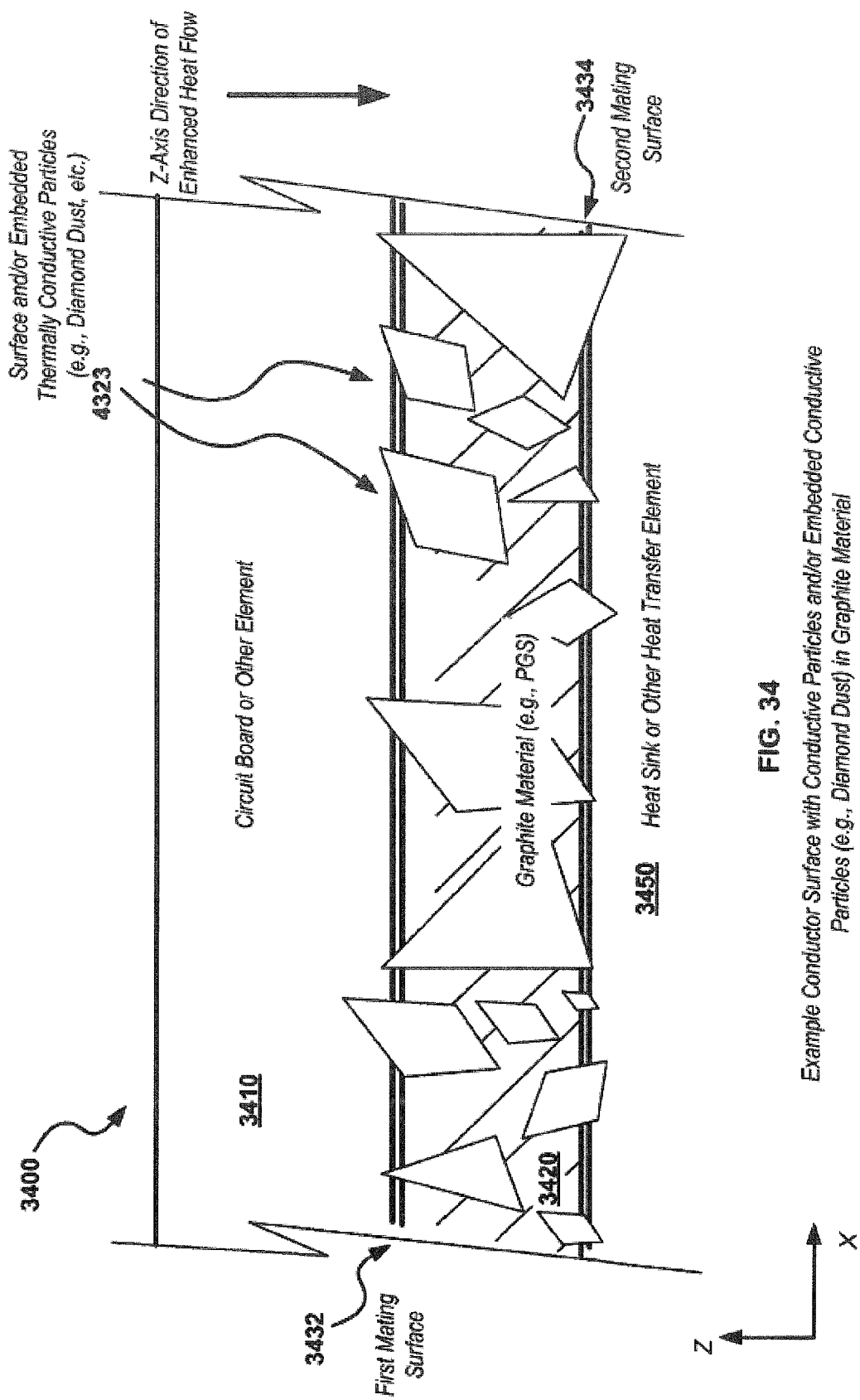
FIG. 34 illustrates details of an embodiment of a sealing and/or heat transfer junction between elements of a lighting element where a graphite material includes surface and/or embedded conductive particles, such as diamond dust, to aid in heat conduction.

FIG. 34 illustrates details of another embodiment of a modification 3400 to aid in heat conduction. In this configuration, thermally conductive spikes or particles 4323, such as, for example, diamond dust or other heat conductive spikes or particles, may be disposed on the mating surfaces 3432, 3434, and/or embedded in the graphite material and/or the mated elements (e.g., the circuit board 3410 and heat sink 3450) to aid in Z-axis heat conduction. In this configuration, different particle sizes may be used depending on the associated parameters such as mating surface preparation, graphite material type and/or thickness, or other related parameters. For example, in some embodiments the conductive particles may be sized on the order of the thickness of the graphite sheet or slightly larger. In other embodiments, smaller particle sizes, such as those shown in FIG. 35, may be used alternately or in addition.

Figure 35:
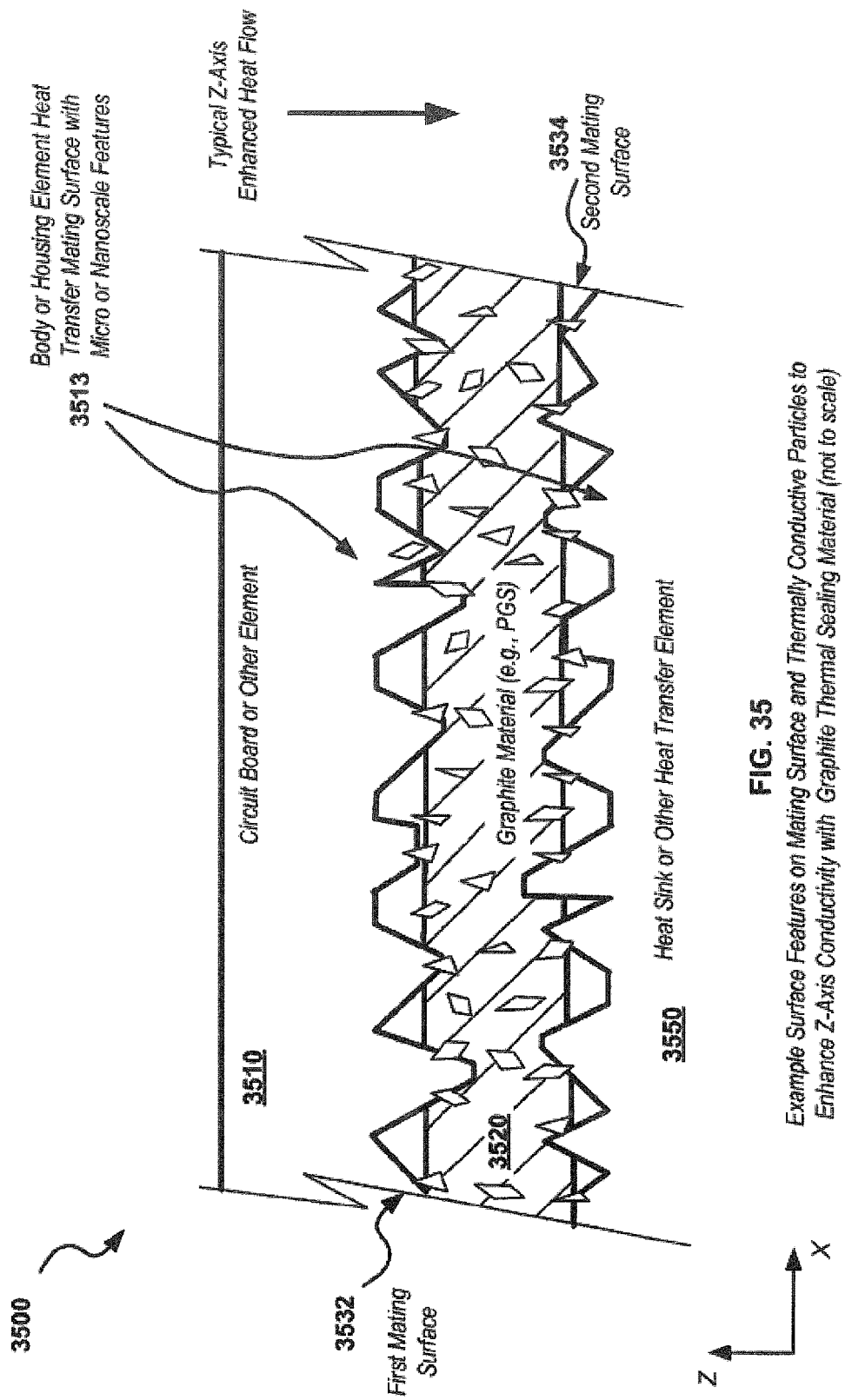
FIG. 35 illustrates details of one embodiment of a sealing and/or heat transfer junction between elements of a lighting element where a graphite material includes surface and/or embedded thermally conductive particles, such as diamond dust, and where mating surfaces include micromachined and/or nanostructured features to aid in heat conduction.

FIG. 35 illustrates another embodiment of a modification 3500 to aid in heat conduction. This configuration may be viewed as a combination of the configurations illustrated in FIGS. 33 and 34 where mating surfaces 3532 and/or 3534 of elements 3510 and 3550 respectively are configured to aid Z-axis heat conduction along with particles 3513 on the surfaces and/or within PGS 3520. Although the particle 3513 sizes shown in FIG. 35 are smaller than those of FIG. 34, in some embodiments they may be the same size and/or larger, and/or in combinations of sizes.

Figure 36:
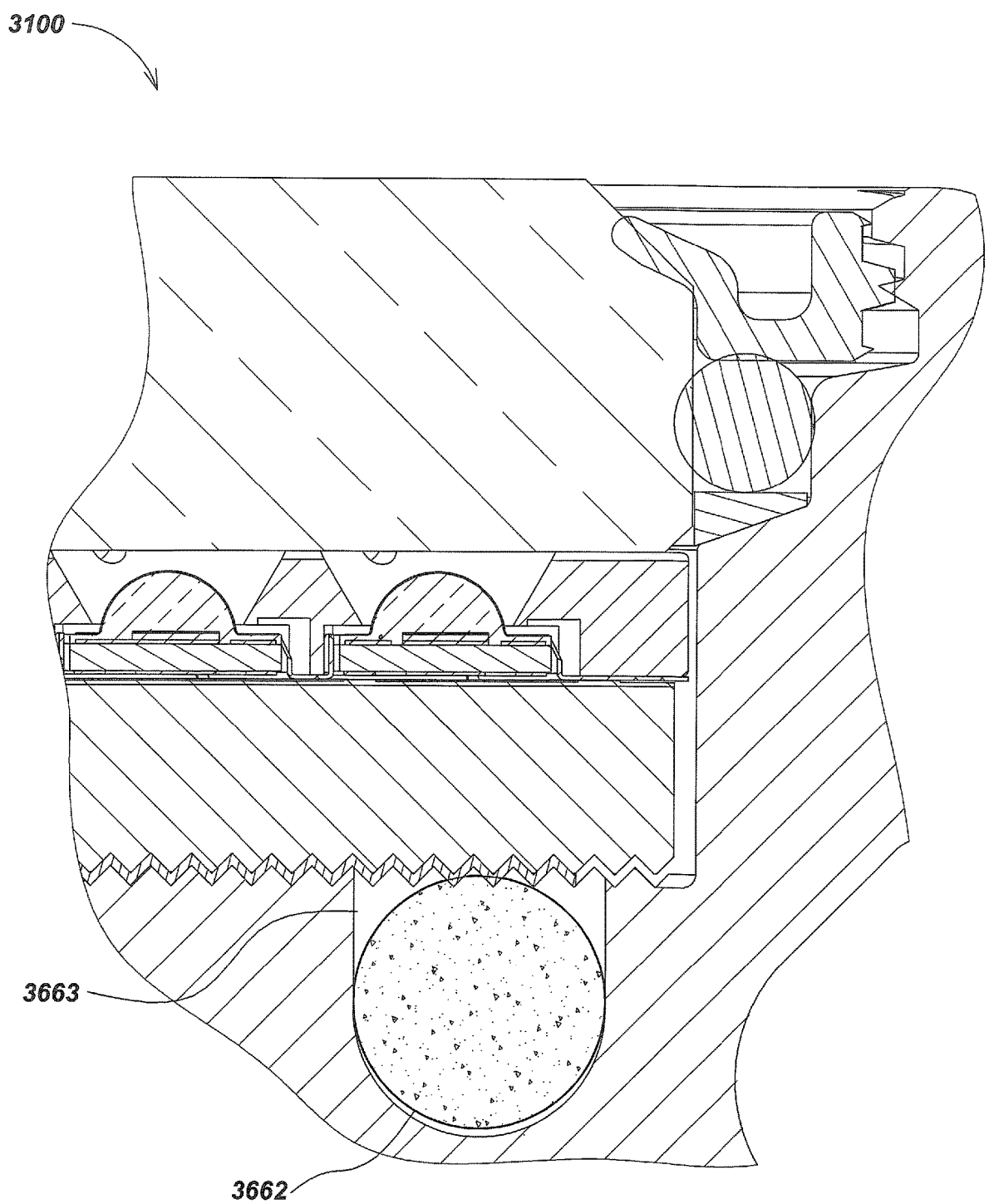
FIGS. 36-39 illustrate details of example embodiments of lighting devices including surface mating configurations and/or graphite materials for increasing heat conductivity in certain dimensional axes.

FIG. 36 illustrates details of another embodiment 3600 of a lighting device that may include graphite materials and/or sequestering agents/browning agent destroyers 3662, which may be disposed in a formed cavity 3663 as shown. Mating surfaces may be roughened or patterned such as through micromachining as shown to further aid in heat transfer.

Figure 37:
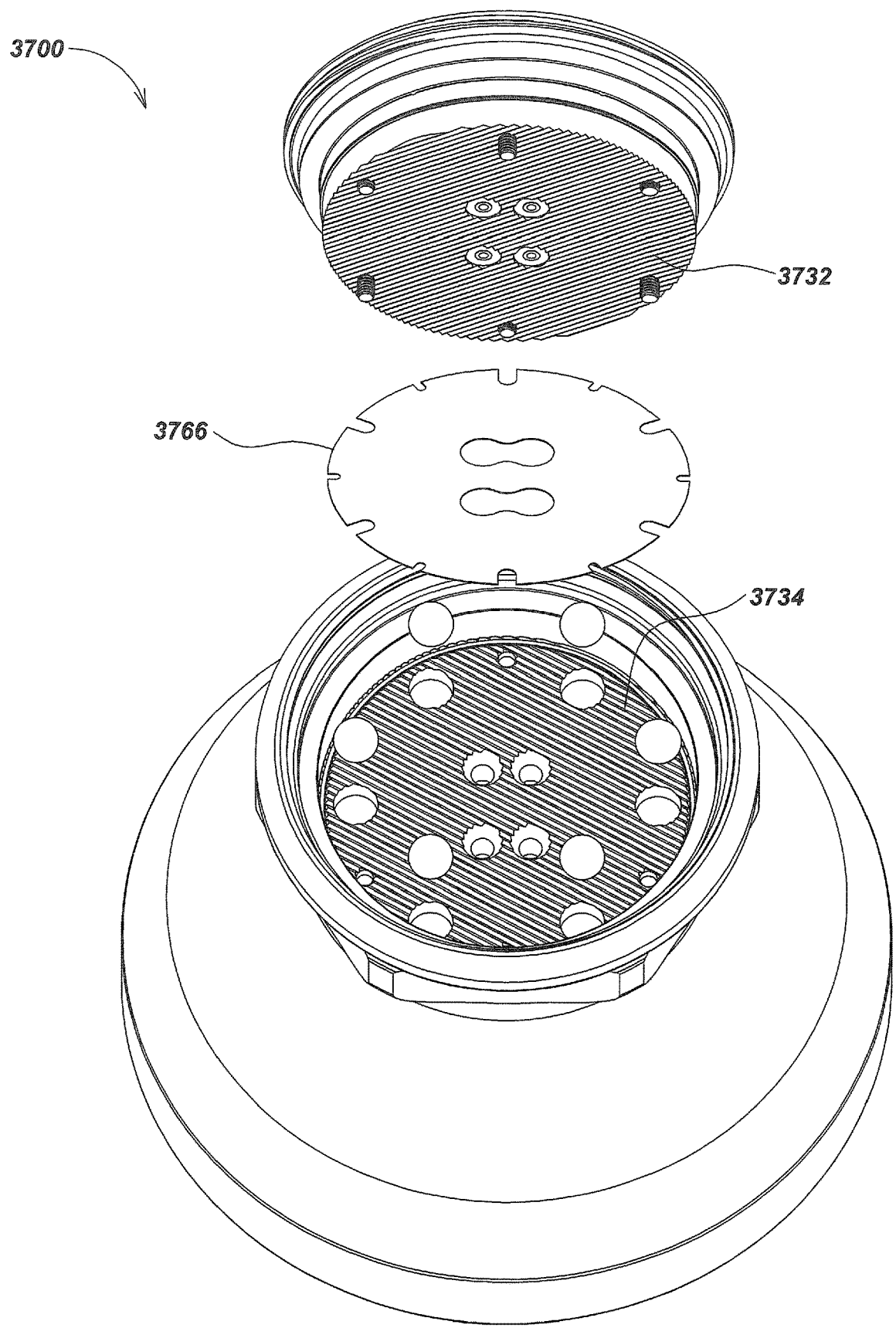
Figure 38:
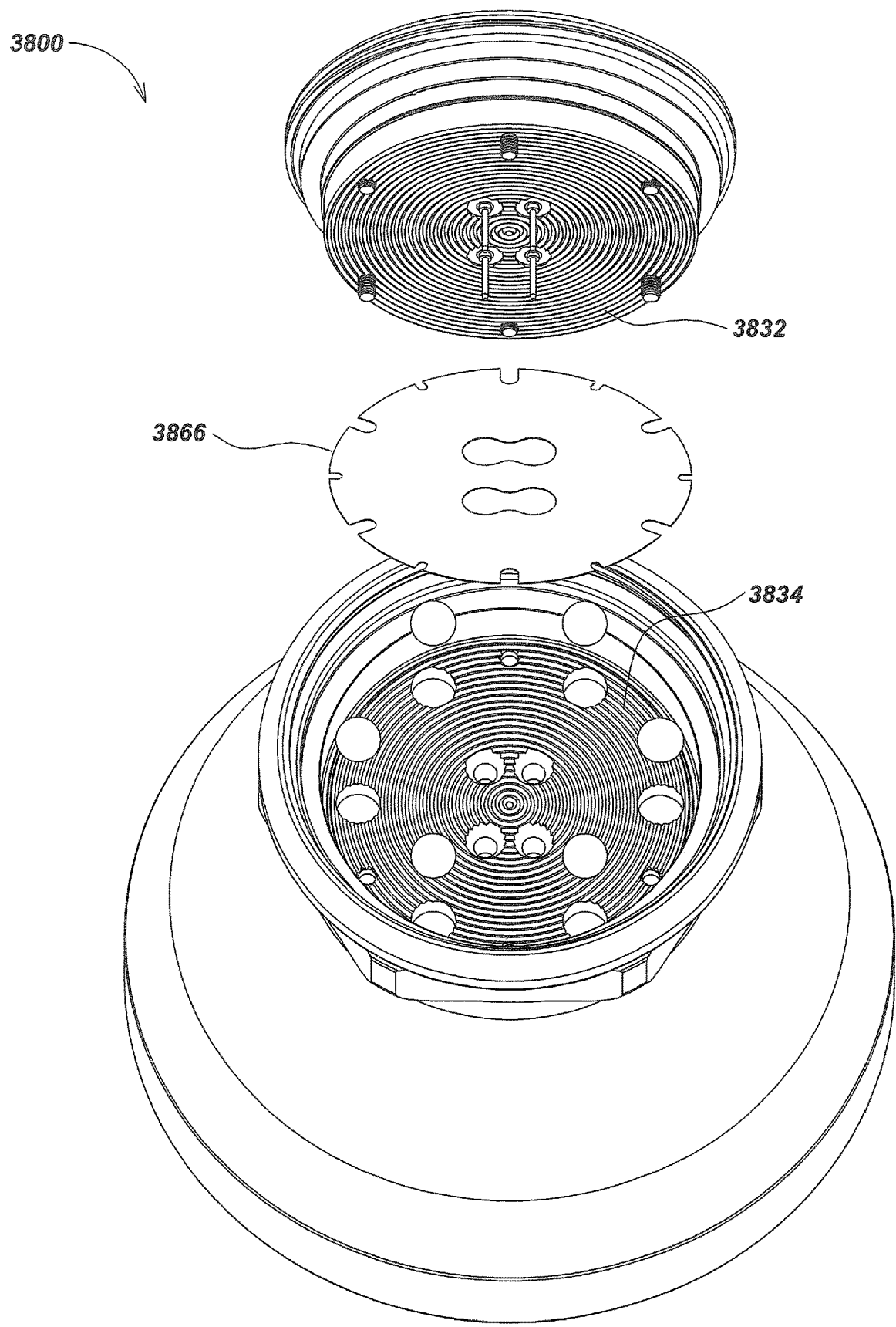
Figure 39:
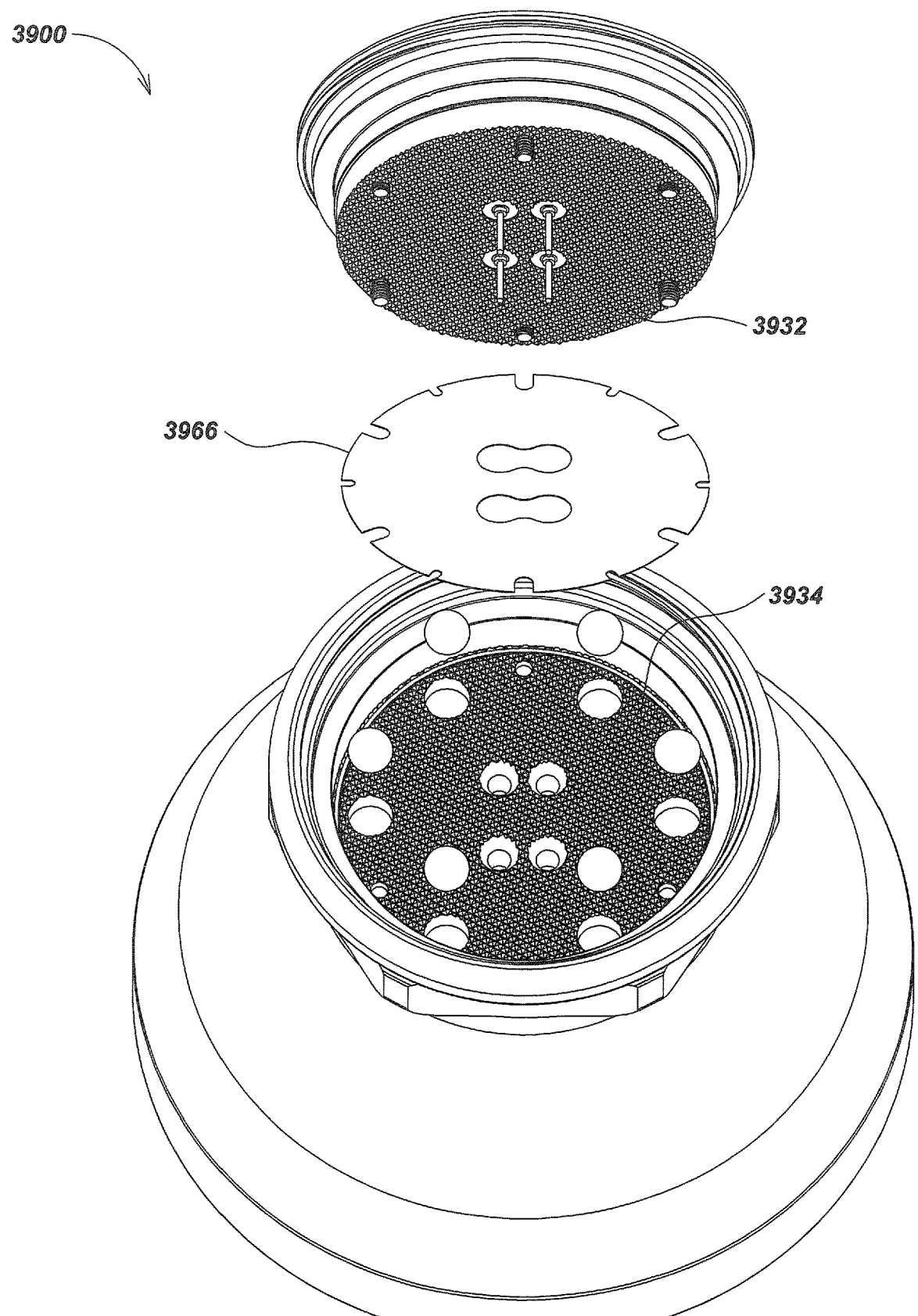

FIGS. 37-39 illustrate details of embodiments 3700-3900 of lighting devices that includes micromachined surfaces to aid in heat transfer, such as was described previously with respect to FIG. 33. In FIG. 37, the micromachined surfaces 3732 and 3734 include straight line ruled features to allow interlocking of the surfaces with a graphite material 3766, which may be a PGS as described previously herein. Surfaces 3832 and 3834 of FIG. 38 include ring line features for interlocking with graphite material 3866, and surfaces 3932 and 3934 of FIG. 39 include pyramid style features for interlocking with graphite material 3966. The features illustrated may include points or tips, which may have, for example, tips of 90 degrees or less. The features may be configured to interlock with each other and/or with the graphite materials.

In some embodiments, graphite materials may be processed prior to or during manufacture to aid in performance. For example, a graphite sheet, such as a sheet of PGS material, may be pre-compressed before or during installation into a lighting fixture to improve heat transfer and/or sealing performance. The pre-compression may be done to reduce the size to approximately ⅓ or ¼ of the initial size in an exemplary embodiment to remove all or substantially all porosity and/or trapped air or other gases. In some lighting devices subject to high external pressure, the material may be installed and then compressed during a testing or initial operational pressurization. Alternately, or in addition, the sheets may be polished with materials such as silicone grease, etc., to aid in performance. In addition, circuit board holes, such as vias in multi-layer boards or other holes or cavities, may be filled with a filler material such as grease or other materials to provide a vacuum-tight seal. This may be done to reduce transfer of contaminants between internal volumes of the light. While graphite sheets may be used, the vias or other holes may be separately sealed using materials such as hi-vac grease and the like.

In some embodiments of lighting devices of various types, a selectively permeable barrier element, such as in the form of a membrane, barrier, gasket, o-ring, or other permeable structure may be used to allow diffusion of contaminants from interior volumes of the light to the exterior of the light, such as to an external liquid or gaseous environment. For example, internal volumes in contact with electronic circuitry, such as on printed circuit boards or other substrates, or in contact with lighting elements such as LEDs, or in contact with wiring, plastics, or other materials that give off contaminants that may affect light output as described previously herein may be in contact with the selectively permeable barrier element to allow diffusion of contaminants to the exterior environment. Various configurations of housings with internal volumes and associated electronic circuitry may be configured to use a selectively permeable barrier. For example, in a basic configuration, all or most of the electronic circuitry (e.g., circuit boards and associated electronic components, lighting elements such as LEDs, wiring, and other materials that can generate contaminants) may be enclosed in a single interior volume, which may be in contact with one or more selectively permeable barrier elements. Alternately, some lighting devices may include multiple internal volumes, one or more of which may include electronics or other components and one or more of the volumes may be in contact with individual selectively permeable barrier elements. Some representative examples are described subsequently below.

Figure 40A:
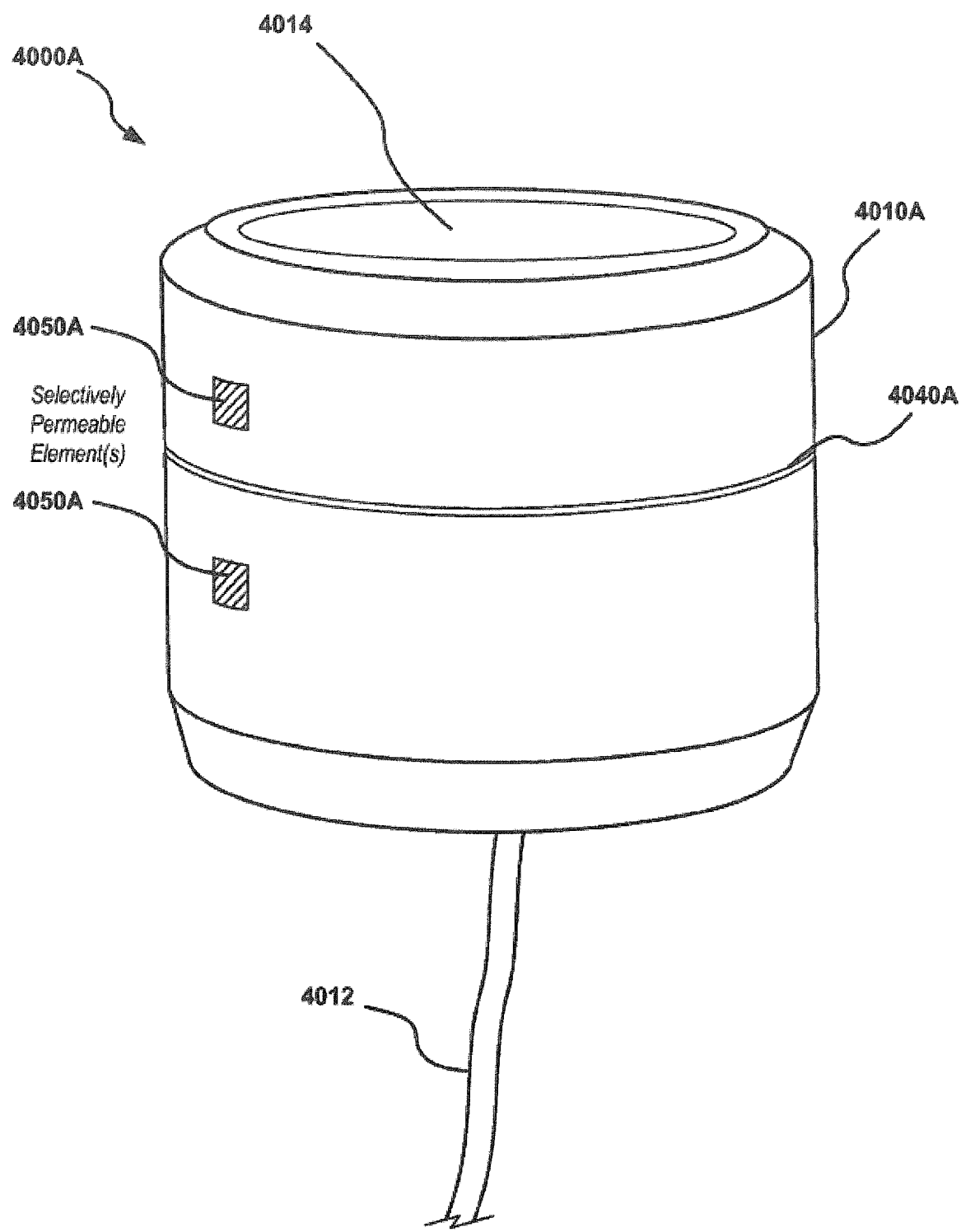
FIGS. 40A-40D illustrate details of example embodiments of lighting devices including selectively permeable barrier element.

For example, FIG. 40A illustrates an example embodiment of a lighting device embodiment 4000A that includes a selectively permeable barrier element 4050A in the form of a window or membrane. In an exemplary embodiment, the selectively permeable barrier element may comprise silicone or another selectively permeable compound or structure that allows transfer of contaminants out of the housing while restricting entry of liquid water or other liquids or solids. For example, silicone or fabrics such as Gore-Tex or other materials such as acoustic vents may be used in various embodiments. In applications where there are not significant pressure differences between the interior and exterior of the lighting device, such as in air above the surface, the selectively permeable material may be configured in a movable or flexible fashion. Alternately, in applications subject to pressure differences, such as for underwater lighting where pressure differences may be substantial, the selectively permeable material may be rigid or semi-rigid, such as in the form of a silicone gasket, window, membrane, dome, o-ring, and the like.

As is known in the art, certain materials, such as silicones, are generally considered undesirable for use in applications where liquid water sealing is needed, such as in lights subject to water exposure, and in particular in underwater lighting applications, due to their permeability. This is described in, for example, a Rockwell International paper entitled "Rate of Moisture Permeation Into Elastomer Sealed Electronic Boxes," John H. Kolyer, Rockwell International Corporation, June 1986, Advanced Materials, Manufacturing, and Testing Information Analysis Center. These applications normally use materials such as Viton™, a well known brand of synthetic rubber and fluoropolymer elastomer (trademark registered to DuPont Performance Elastomers LLC), which is much less permeable, so as to prevent water ingress. However, this can also act to contain contaminants such as described previously herein within internal volumes. By instead using selectively permeable materials such as silicone materials, gaseous water may diffuse through membranes, o-rings, etc., however, they may also aid in allowing contaminants to diffuse out, thereby improving anti-browning performance.

As shown in FIG. 40A, lighting device 4000A includes a body or housing 4010A, which may comprise one or more pieces. For example, lighting device 4000A includes an upper and lower shell joined by a gasket, o-ring, grease, or other sealing mechanism 4040A. Housing 4010A includes a window or port 4014 allowing light generated internally by lighting elements such as LEDs to project outward into the exterior environment. One or more selectively permeable barrier elements 4050A may be disposed in various ways in or on housing 4010A. For example, as shown in FIG. 40A, two selectively permeable barrier elements 4050A may be used to allow diffusion from two internal volumes (shown in FIG. 40B). Various other configurations of sizes, shapes, positions, and the like for the selectively permeable barrier elements may be used in various other embodiments. A cable 4012 may be used to provide power and/or control signaling to the lighting device 4000A. In applications where sealing is required the cable 4012 may be insulated or sealed to the housing 4010A (not shown) to prevent ingress of water. The sealing may also be made from selectively permeable materials in some embodiments.

Some embodiments may include a hollow tube or other cavity down the core of the cable to vent the contaminants, but still maintain a water seal on the exterior of the cable to housing. This may be particularly advantageous in applications such as boat lights, pond lights and architectural lights.

Venting ports may be included in the lighting elements in various configurations. The venting ports may be configured so that the permeability changes as the outside pressure changes, thereby allowing an unpressurized light to have an exposed permeable barrier, and then providing barrier isolation using a pressure actuated valve or other pressure actuated mechanism. For example, in one implementation, a lower permeability seal may be closed by pressure actuation, with a more permeable seal then isolated by outside applied pressure. An example pressure valve embodiment is described subsequently herein with respect to FIGS. 51 and 52.

Figure 40B:
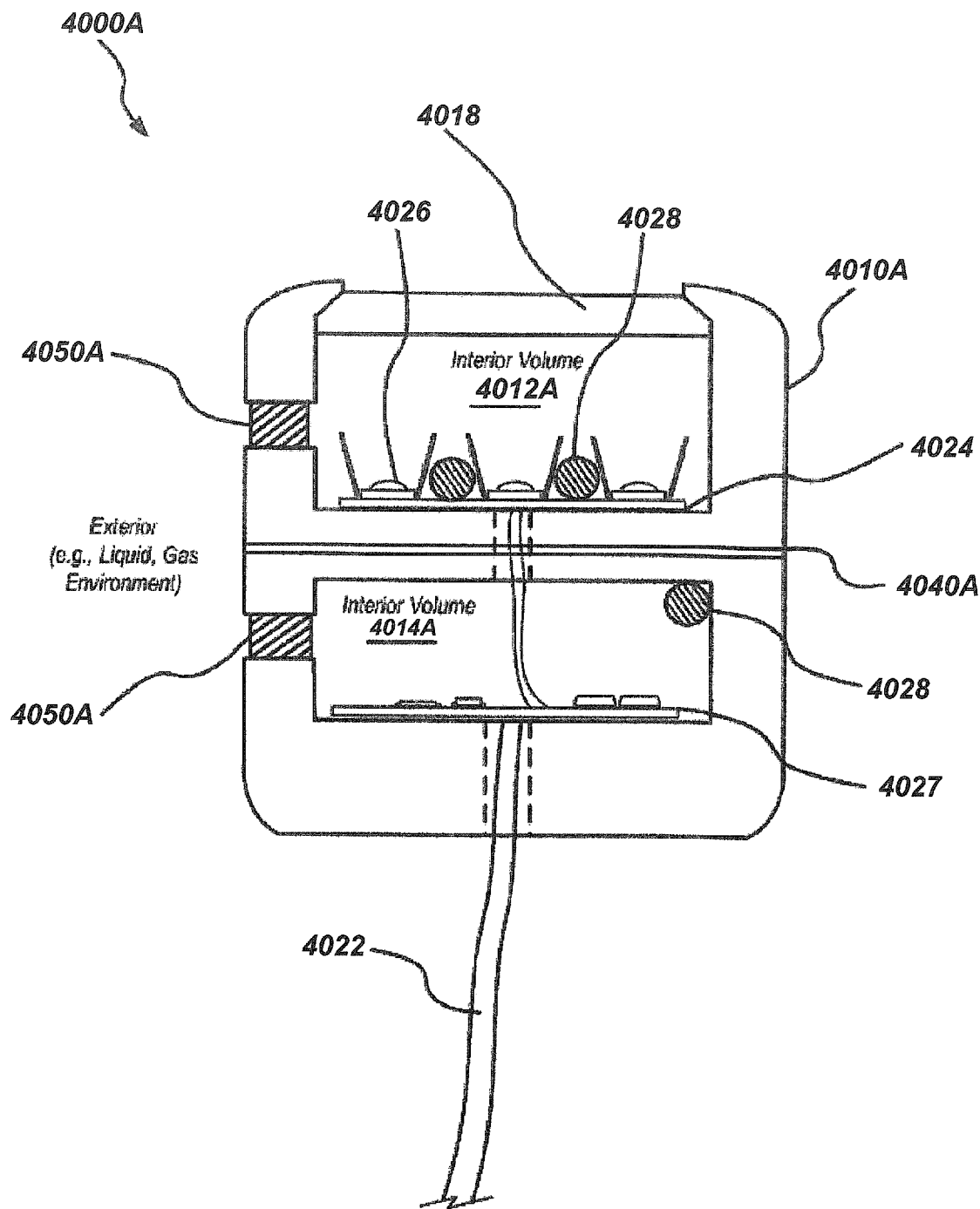

FIG. 40B illustrates additional details of lighting device embodiment 4000A in a cutaway side view. A lighting device may have one or more internal volumes defining internal cavities. For example, lighting device 4000A may have an upper interior volume 4012A and a lower interior volume 4014A. Some devices may have more or fewer volumes, and in some embodiments the volumes may be configured to be in communication so that gases or liquids can flow between them. Alternately, they may be fully or partially sealed with gaskets, o-rings, or other sealing mechanisms. In FIG. 40B, sealing mechanism 4040A may be a gasket or o-ring comprising a material such as graphite as described previously herein.

Upper interior volume 4012A may define a cavity that contains the lighting elements, such as one or more LEDs 4026 as shown. These may be mounted on a circuit board 4024 or other circuit or mounting element. In some embodiments, a sequestering agent/browning agent destroyer element 4028 may be disposed within the volume and/or in one of the components of lighting device, such as described previously herein. One or more selectively permeable barrier elements 4050A may be disposed on or in the housing, such as in the form of a side port or window as shown in FIG. 40B. Alternately, the selectively permeable element may be in the form of an o-ring, gasket, or other structure that is in contact with a portion of one or more of the interior volumes and the exterior of the lighting device. For example, if the lighting device is used underwater, the exterior will be in contact with fresh or salt water, and the selectively permeable element will be in contact with a portion of the fresh or salt water to allow outward diffusion of contaminants from interior volumes defining interior cavities. Alternately, in air or other gaseous environments a portion of the selectively permeable barrier element will be in contact with the exterior air or other gas rather than water.

Lighting device 4000A includes two internal volumes, where the upper volume includes LED lighting elements 4026, optional sequestering agents/browning agent destroyers 4028, and other related electronic and mechanical components such as reflectors, optical lenses (not shown), phosphor elements (not shown), or other components such as described previously herein. Lower interior volume 4014A defines a cavity containing a power and electronics circuit, which may include discrete electronic, optic, and/or mechanical components, as well as components on a printed circuit board 4027 or other substrate. The power and electronics circuit may be configured to provide electrical power and/or control signaling to LED or other lighting elements.

One or more sequestering agents/browning agent destroyers 4028 may also be disposed on or within interior volume 4014A. One or more selectively permeable barrier elements 4050A may be positioned on or within the housing to similarly allow diffusion of contaminants from the lower interior volume 4014A. In some embodiments, the upper volume may be merely sealed from the lower volume so that contaminants from the lower volume cannot enter the upper volume and affect light output. In this case, the lower selectively permeable barrier element may not be included. Alternately, the upper and lower volumes may be coupled so that contaminants can flow in-between. In this case, a single or multiple selectively permeable barrier element may be used to allow outward diffusion.

Figure 40C:
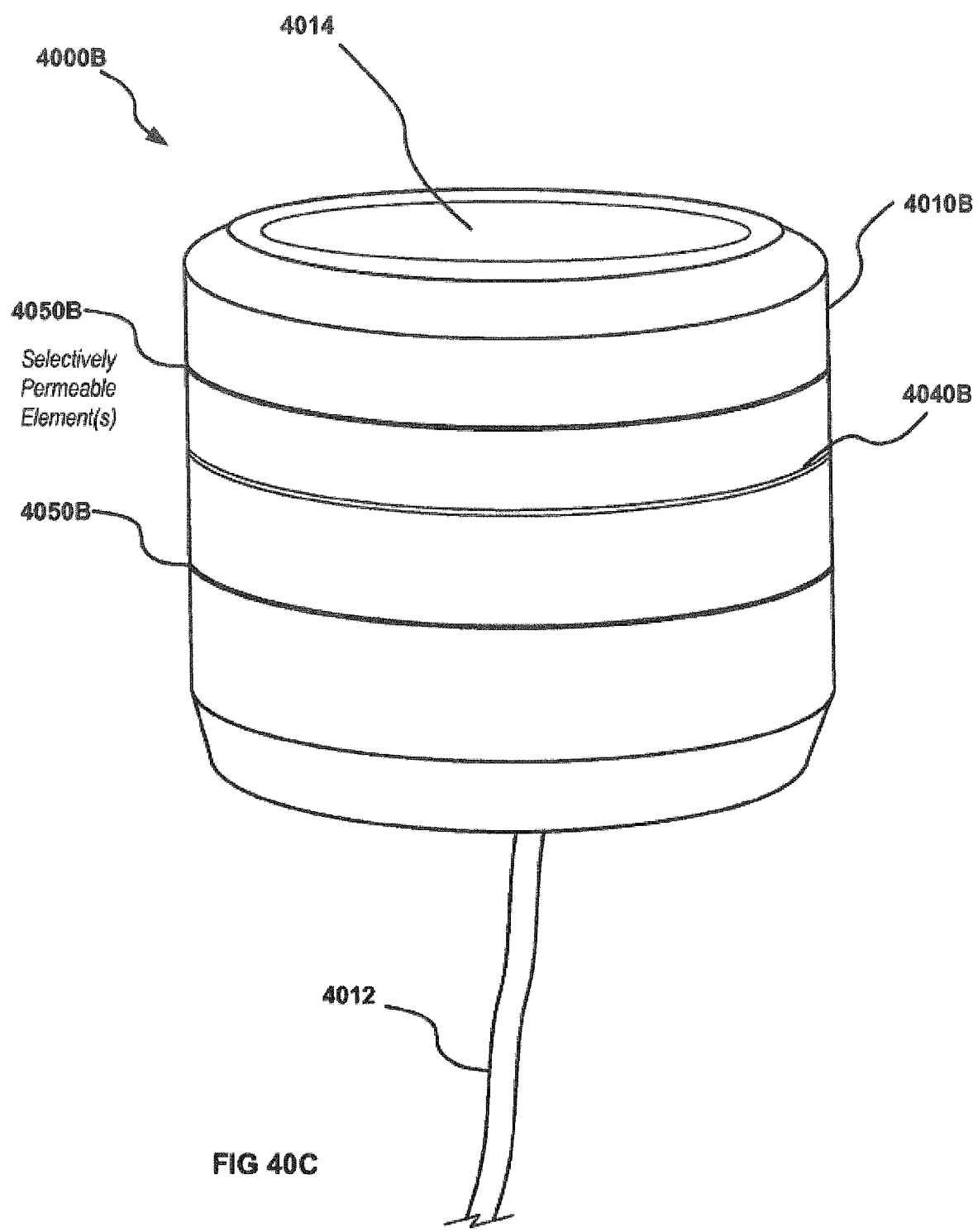
Figure 40D:
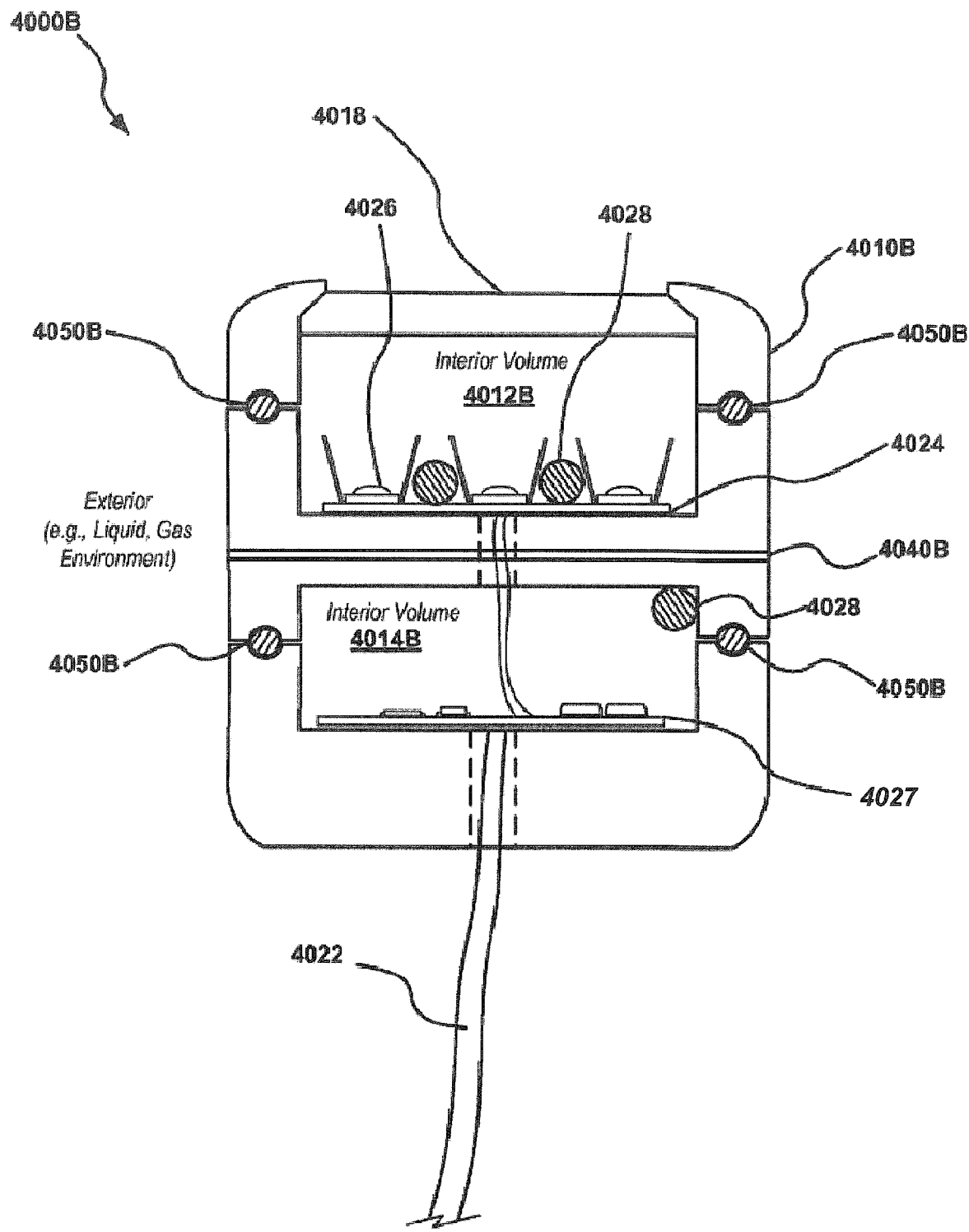

FIGS. 40C and 40D illustrate another embodiment of a lighting device 4000B including a selectively permeable barrier element 4050B. In this case, the selectively permeable barrier element 4050B may be a silicone o-ring or gasket, or other silicone sealer, grease, membrane or other sealing material, or may be an o-ring, gasket, etc., of another appropriate selectively permeable material to allow diffusion of contaminants outward from interior volumes. Similar to lighting device 4000A, there may be two interior volumes 4012B and 4014B containing electronics, lighting elements, wires, sealants, or other materials capable of emitting or generating contaminants. These contaminants may be diffused through one or more of selectively permeable barrier elements 4050B, such as silicone o-rings, gaskets, or other sealing mechanisms, via channels between housing elements. A gasket, o-ring, or other sealing mechanism 4040B may be used to join elements of the housing. In this case, the housing may comprise four elements as shown—two forming the upper half and two forming the lower half, with corresponding o-rings or gasket between. The halves may be fastened together with bolts, screws, clamps, or other connecting mechanisms (not shown).

Figure 41:
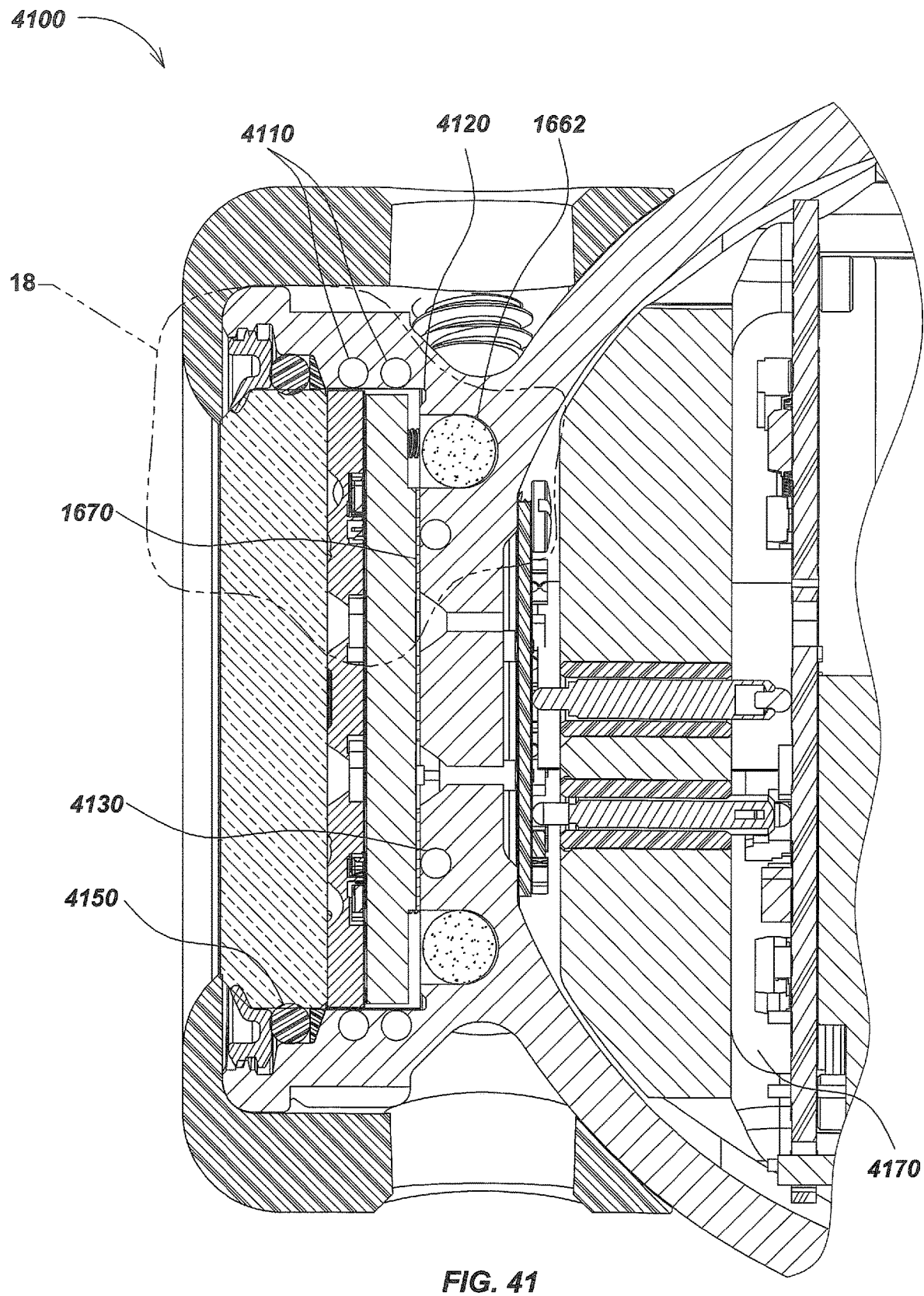
FIG. 41 illustrates details of an example embodiment of a lighting device similar to the device of FIG. 17 with selectively permeable silicone o-rings.

FIG. 41 illustrates details of another embodiment of a lighting device 4100 including selectively permeable barrier elements. This embodiment may be configured similarly to the lighting device illustrated previously herein with respect to FIG. 17. For example, lighting device 4100 may include a lower volume 4170 defining a cavity wherein electronics power and/or control circuits are housed. This volume may be fully or partially isolated from other volumes by gaskets or o-rings. For example, internal o-rings 4130 comprising a material such as Viton™ or other low permeability materials may be used to seal upper and lower halves of the light. Secondary o-rings 4110 may be used as selectively permeable barrier elements to allow diffusion of contaminants to the exterior environment. These may be, for example, silicone o-rings with high permeability to gases. One or more formed or punched gaps 4120 may be used to allow transfer of gases from the interior volume to the o-rings 4110. Upper o-rings 4150 may be used to provide a primary seal to the exterior environment. These o-rings may be Viton™ or other low-permeability materials in some embodiments. Alternately, in some embodiments they may be selectively permeable materials such as silicone. One or more graphite sheets, such as graphite sheet 1670, may be used to aid in sealing and/or in providing high thermal conductivity to direct heat away from the upper half of the housing, such as described previously herein. One or more sequestering agents/browning agent destroyers, such as elements 1662, may be used to further capture and contain contaminants. The sealing of the graphite thermal layer may be controlled by compressing it to remove internal voids and additionally by applying a thin layer of grease to either side prior to installation. If the graphite is used dry and uncompressed, it does not typically seal; however, if the graphite is compressed and greased it does seal. In this manner the graphite treatment can be used to selectively seal or vent between the LED volume and other internal volumes, such as the electronics driver volume or other internal volumes of the lighting device.

In addition to the above-described aspects, vent ports and associated vent paths may be incorporated in semiconductor lighting devices to allow user servicing and post-operation browning reduction and contaminant removal. Such vent ports and/or vent paths may be incorporated in any of the previously described lighting device embodiments, and the above-described aspects may be combined in the subsequent exemplary embodiments illustrating venting ports and internal housing volume venting paths. Vent ports may be configured with a gas permeable pressure valve, such as the automatic pressure relief valve embodiments described subsequently herein with respect to FIGS. 51 and 52 to provide selective permeability, or based on other similar or equivalent pressure relief valve configurations to provide similar functionality. Although the subsequent embodiments are shown with a single vent port, in various embodiments, two or more ports may be used depending on the particular lighting device configuration, operating environment, servicing mechanism, and the like.

Figure 42:
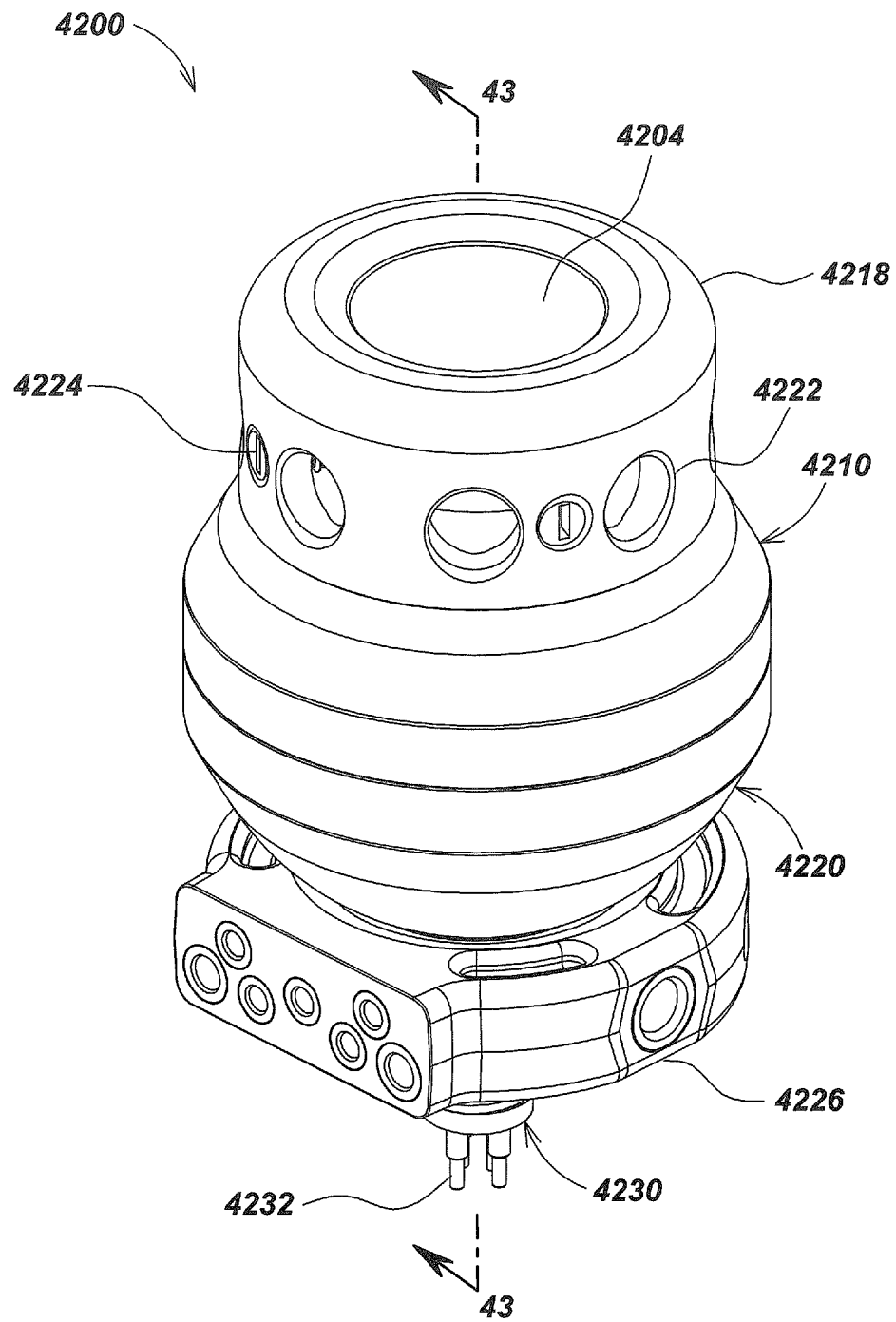
FIG. 42 is an isometric view of an embodiment of an underwater spherical LED light fixture.

Turning to FIG. 42, an exemplary embodiment of an underwater LED light fixture 4200 in accordance with certain aspects, including venting ports, is illustrated. Light fixture 4200 may include a pressure housing, which may include one or more components or assemblies, such as a forward pressure housing (or body) 4210 and an aft pressure housing (or body) 4220. In a typical embodiment, window 4204, which may extend across the aperture and may be sealed to the forward housing 4210, may be made of a suitably high strength transparent material, such as glass, acrylic, sapphire, or other suitable material for providing optical clarity for the passage of light, mechanical strength, such as for example, resistance to external pressure, and heat dissipation. A mount 4226 may be disposed around the cylindrical neck of the aft pressure housing 4220, which may be used for attaching the light fixture 4200 to an underwater structure (not shown). An electrical connector, such as a three-pin underwater electrical connector 4230 may be fitted into the neck of the aft pressure housing 4220. For example, electrical connector 4230 may include a male threaded segment that screws into a female threaded bore or aperture that extends through the cylindrical neck of aft housing 4220. The connector 4230 may also include one or more conductive contact pins 4232 for providing power to the circuit boards inside the light fixture 4200. A label, such as a tamper-evident label, or a cover may optionally be disposed over the seam where the forward pressure housing 4210 and the aft pressure housing 4220 mate to indicate and/or deter tampering, to provide an additional permeation barrier, and/or to provide an additional mechanical coupling for the forward and aft housings 4210 and 4220. The label or cover may include a threaded coupler (not shown) with female threads that couple to male threads on the exterior wall of the housings 4210 and 4220 (not shown). An alternative cover may attach to one or more of the housings 4210 and 4220 using fasteners, adhesive, tongue-and-groove, a clamping mechanism, or other feature.

Referring again to FIG. 42, mount 4226 may typically be made of one or more materials, such as a glass-filled plastic. The forward pressure housing 4210 and the aft pressure housing 4220 may comprise one or more suitable metals, such as anodized aluminum alloy, beryllium copper, stainless steel, titanium, and the like.

In an exemplary embodiment, a crash guard 4218 may be retained by a plurality of fasteners, such as plastic set screws 4224. In accordance with one aspect, crash guard 4218 may include one or more vent holes 4222 configured to provide flow through of ambient fluid (e.g., seawater) for enhanced cooling.

Figure 43:
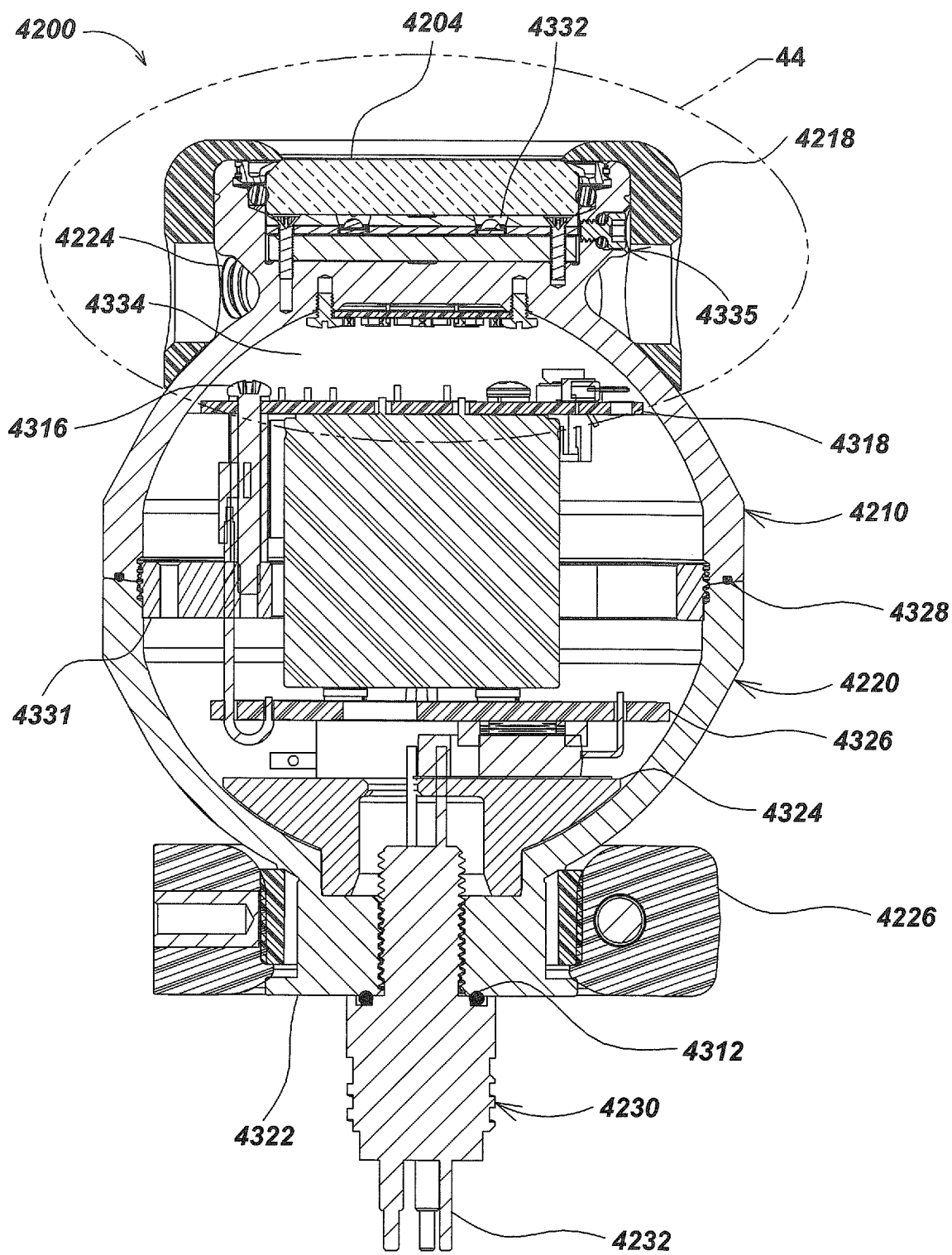
FIG. 43 is a section view of the underwater LED light fixture embodiment of FIG. 42, taken along line 43-43.
Figure 44:
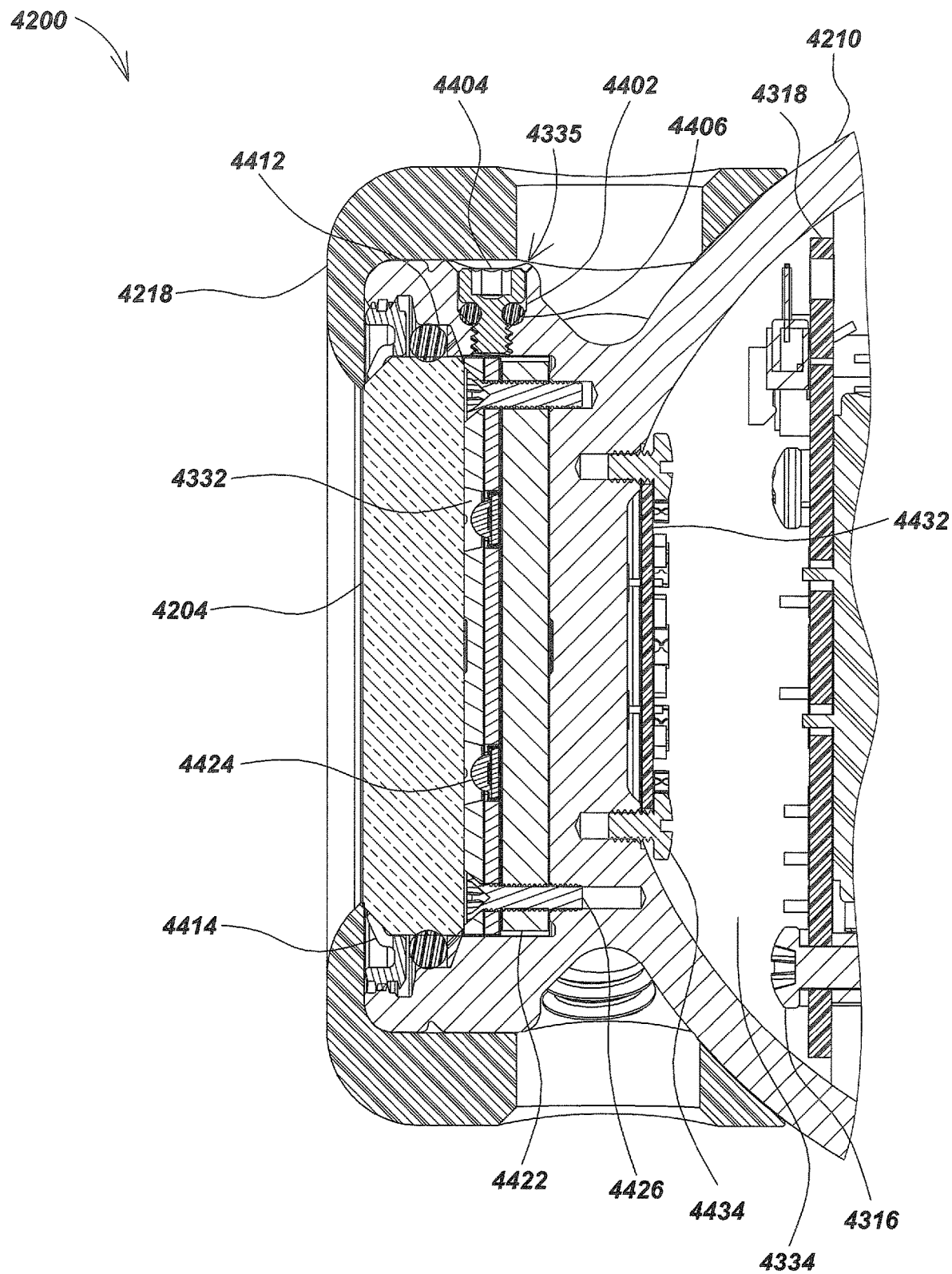
FIG. 44 is an enlarged section view of the light source volume of the underwater LED light fixture embodiment as shown in FIG. 43, and designated as illustrative section 43.

FIGS. 43 and 44 are section views illustrating additional details of the underwater spherical LED light fixture embodiment 4200 of FIG. 42, taken along line 43-43. In an exemplary embodiment, the forward pressure housing 4210 and the aft pressure housing 4220 may be joined by a coupling element, such as an interior threaded center coupling element 4331 to form a generally spherical housing. One of skill in the art will appreciate alternatives to the threaded center coupling element 4331, including an exterior threaded coupling element (e.g., a coupling element with female threads that couples to male threads formed on the exterior walls of the housings 4210 and 4220). The threaded coupling element 4331 may be designed using the same or similar materials as the forward pressure housing 4210 and the aft pressure housing 4220. The material of the coupling element 4331 may be selected to provide direct heat transfer from the interior of the spherical housing, to the forward and aft pressure housings 4210 and 4220, and then to the external environment (e.g., the ocean). To allow user servicing of the light fixture embodiment 4200, one or more vents or ports may be included in a housing element. The ports may be sealed and serviceable by various mechanisms, such as threaded plugs, hinges, and the like to allow venting of the interior of the housing to remove contaminants that may cause browning, moisture, and the like. In an exemplary embodiment, the vented port may be configured as port 4335 as shown in FIG. 43 and further illustrated in FIG. 44. However, in alternate embodiments other vented port configurations may be used.

Various elements and sub-assemblies may be configured with the forward pressure housing 4210 and aft pressure housing 4220, to provide a pressure-resistant and leak-resistant housing having an interior volume that remains dry and at surface air pressure (or some other desired and/or controllable pressure). For example, a sealing element, such as a housing O-ring 4328, may be disposed between forward pressure housing 4210 and aft pressure housing 4220. In an exemplary embodiment, housing O-ring 4328 may be seated into the annular groove (not shown) disposed on the forward pressure housing 4210, and compressed in assembly between forward pressure housing 4210 and aft pressure housing 4220 to provide a seal at the interface or seam. A sealing element, such as connector O-ring 4312, may be disposed between the connector 4230 and the aft pressure housing 4220.

The mount 4226 clamps to the exterior of a cylindrical neck 4322 of aft pressure housing 4220. In an alternate embodiment (not shown), the mount 4226 may be configured to alternatively or to also grip an exterior section of the forward pressure housing 4210. In yet another embodiment (not shown), the mount 4226 may be configured to alternatively or to also grip exterior sections of the forward and aft pressure housings 4210 and 4220 where those housings 4210 and 4220 mate. Such an embodiment would provide additional mechanical strength for coupling the housings 4210 and 4220, and would provide more exterior surface area in contact with the external environment (e.g., the ocean) for transferring thermal energy to that external environment from the interior of the housing. Electrical power may be provided to the light fixture through one or more contact pins 4232 of the underwater connector 4230.

One or more PCBs may be disposed in a driver volume 4334, such as, for example, a PCB LED driver 4318, and a PCB interconnect 4432. PCB LED driver 4318 may be mounted with one or more fasteners, such as screws 4316.

A thermally-conductive plug 4324 (which may be press fit inside the aft housing 4220), may thermally connect various elements to the housing to dissipate heat from the interior of the LED light fixture 4200 and away from other heat producing elements in the forward section. Thermally-conductive plug 4324 may, for example, be made of metal, such as an aluminum alloy, or other equivalent material.

An LED PCB 4422 (as shown in FIG. 44), may be disposed in a vented space, such as light source volume 4332, as shown in FIGS. 43 and 44. The venting mechanism as shown in FIG. 44 may be described in further detail below.

FIG. 44 is an enlarged section view light fixture embodiment 4200 as shown in FIG. 43, and designated as illustrative section 43. In an exemplary embodiment, a sealing element, such as window O-ring 4412 may be disposed between the window 4204 and a surface of the forward pressure housing 4210, and secured by window retainer 4414. For example, in assembly, the window retainer 4414 may be configured with the forward pressure housing 4210, such that window O-ring 4412 is clamped between window 4204 and a surface of the forward pressure housing 4210, to provide the water-tight seal. In some embodiments, the O-rings may assist in the transfer of thermal heat. In some embodiments o-rings may be made from selectively permeable materials. LED PCB 4422 may be disposed in a vented space, such as light source volume 4332 (FIGS. 43 and 44). One or more LEDs 4424 may be mounted to LED PCB 4422. LED PCB 4422 may be secured to the forward pressure housing 4210 with one or more fasteners, such as screws 4426.

One or more PCBs may be disposed in a driver volume 4334, such as, for example, a PCB LED driver 4318, and a PCB interconnect 4432, which may be secured with one or more fasteners, such as screws 4434. PCB LED driver 4318 may be mounted with one or more fasteners, such as screws 4316.

In an exemplary embodiment, vent port 4335 may be formed with a fastener, such as a threaded fastener, or vent screw 4404, which may be sealed in a vent hole 4402 in a forward pressure housing 4210 with an O-ring 4406. Vent port 4335 may allow "poisoning" or contaminant gases, which are in contact with and/or absorbed within elements of lighting devices, to escape to the external environment (e.g., the ocean). Such a mechanism may prevent browning and/or may be used to de-brown affected LEDs. De-browning may be done as described subsequently herein by opening of the vented port to allow the "poisoning" gases to exit the interior volumes of the housing. The O-ring 4406 may be formed from a highly permeable material or a selectively permeable material such as various silicone rubber materials or other similar or equivalent materials. O-ring 4406 also may be formed from more highly impermeable materials such as Viton rubber.

As is known in the art, it is generally not desirable in underwater lights to create additional opportunities for leakage, especially for lighting subject to high pressures. Additional parts and openings in a housing provide the potential for leakage, as well as an opportunity for certain types of corrosion to occur, as in the case of galvanic corrosion, where dissimilar metal parts are in contact with each other while submerged in an electrically conductive environment such as the ocean, and may compromise the seal or even the structural integrity of the pressure housing. As such, adding a vent port and/or pressure valve(s) as described herein is taught away from in the art since additional openings can create the above-described as well as other problems. However, despite these potential disadvantages, addition of vent ports and/or pressure valves as described herein may provide the unexpected advantage of mitigating browning, despite creating the potential for leakage and/or corrosion.

Figure 45:
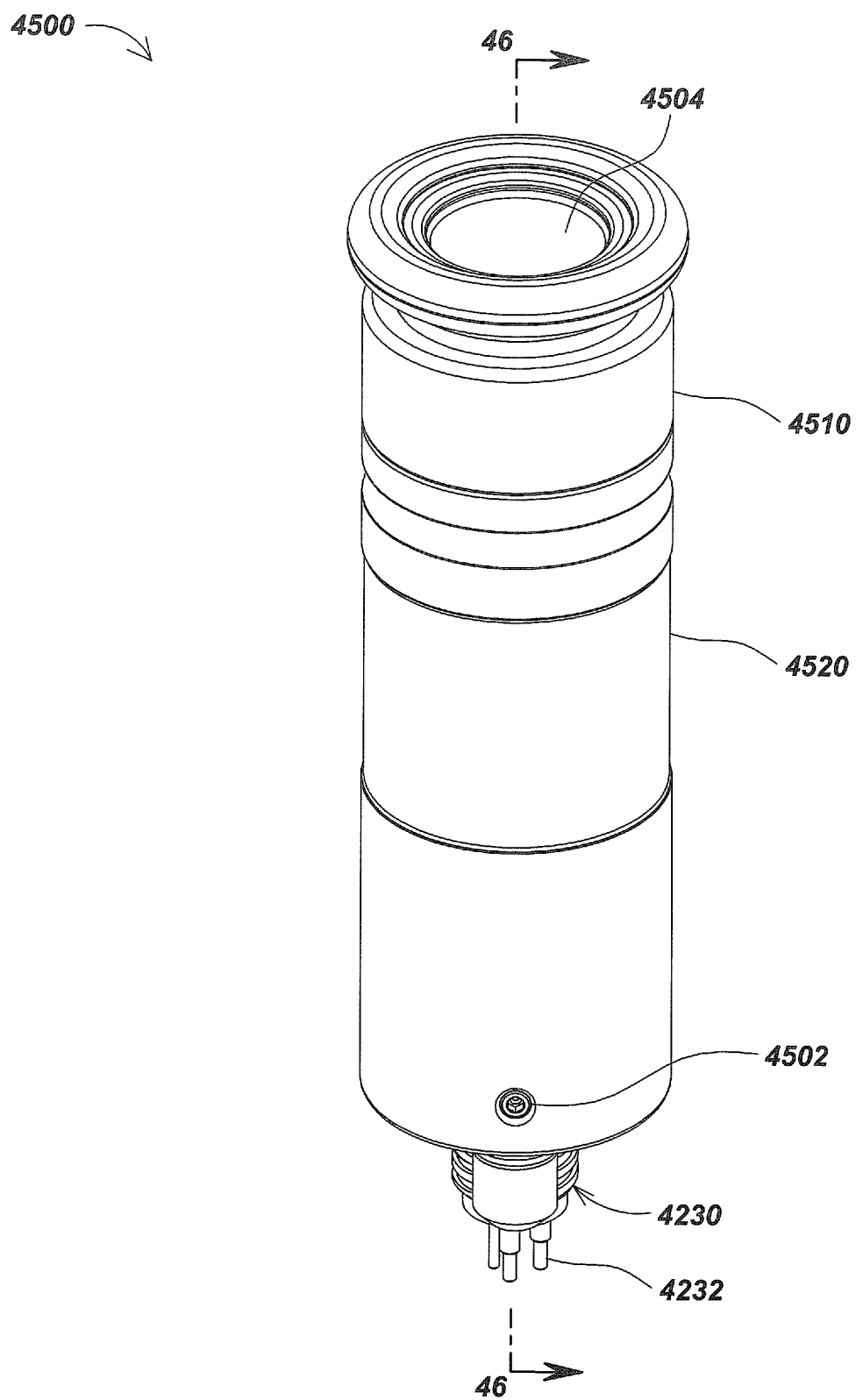
FIG. 45 is an isometric view of an underwater LED light fixture embodiment.

FIG. 45 is an isometric view of an underwater LED light fixture embodiment 4500. For example, light fixture embodiment 4500 may include a housing, which may be formed by a forward pressure housing 4510 and an aft housing 4520, mated together. Light fixture embodiment 4500 may include an electrical connector, such as a three-pin underwater electrical connector 4230, which may be fitted into the rear of the aft pressure housing 4520. For example, electrical connector 4230 may include a male threaded segment that screws into a female threaded bore or aperture that extends through the rear of aft housing 4520. The connector 4230 may also include one or more conductive contact pins 4232 for providing power to the circuit boards inside the light fixture 4500.

A window 4504 may be sealed to the forward housing 4510, and may be made of a suitably high strength transparent material, such as glass, acrylic, sapphire, or other suitable material for providing optical clarity for the passage of light, mechanical strength, such as for example, resistance to external pressure, and heat dissipation.

A vent port 4502 may be disposed through the aft pressure housing 4520 to vent "poisoning" gases, which are in contact with and/or absorbed within elements of lighting devices, to the external environment (e.g., the ocean or atmosphere). Such a mechanism may prevent browning and/or may be used to de-brown affected LEDs by servicing subsequent to browning.

Figure 46:
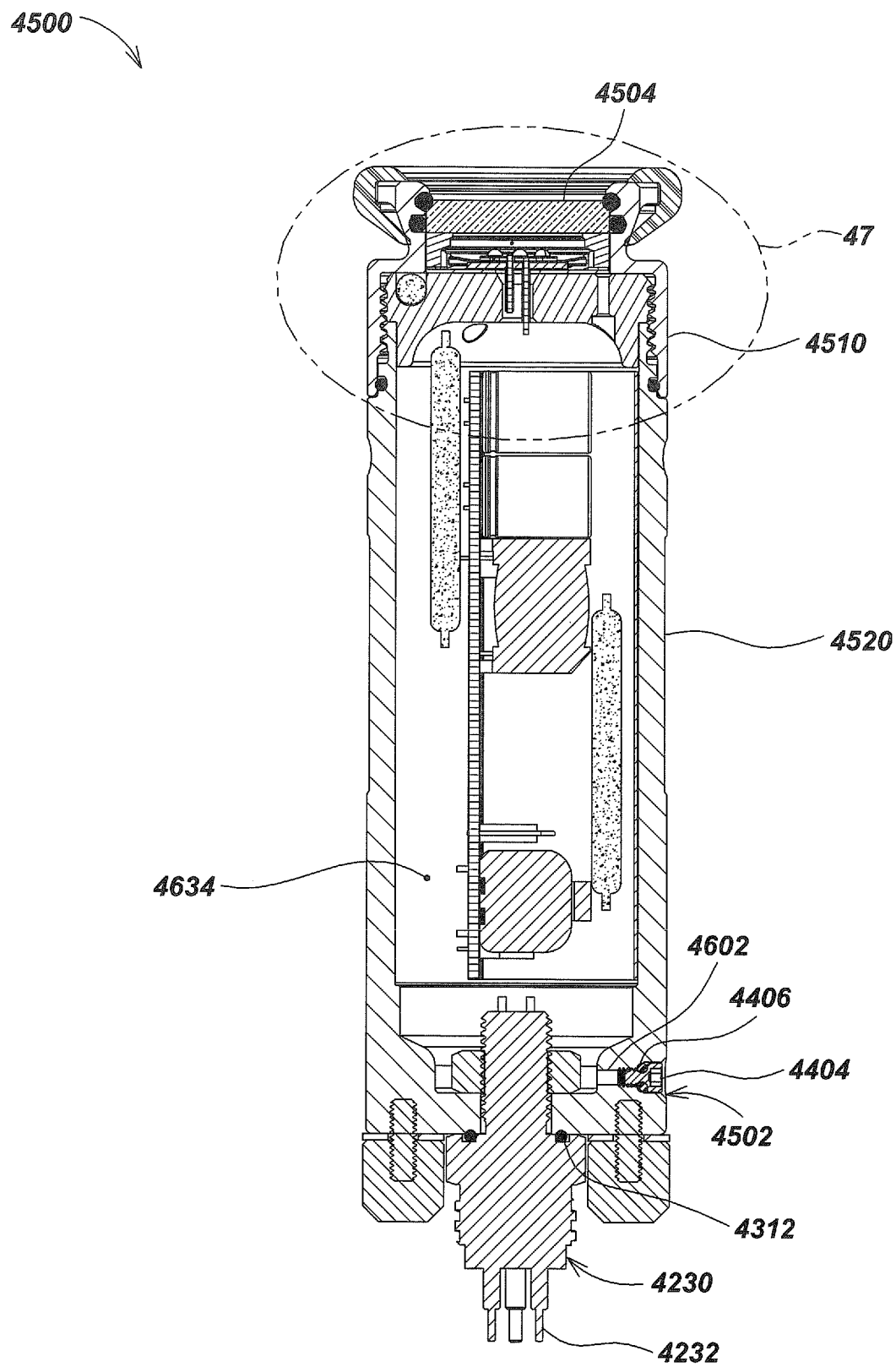
FIG. 46 is a section view of the underwater LED light fixture embodiment of FIG. 45, taken along line 46-46.

FIG. 46 is a section view of the underwater LED light fixture embodiment 4500 of FIG. 45, taken along line 46-46. A vent port 4502 with vent passage 4602 may be disposed within a sealed compartment or driver volume 4634 inside aft housing 4520. A threaded fastener or vent screw 4404 may be sealed to aft pressure housing 4520 with an O-ring 4406.

Figure 47:
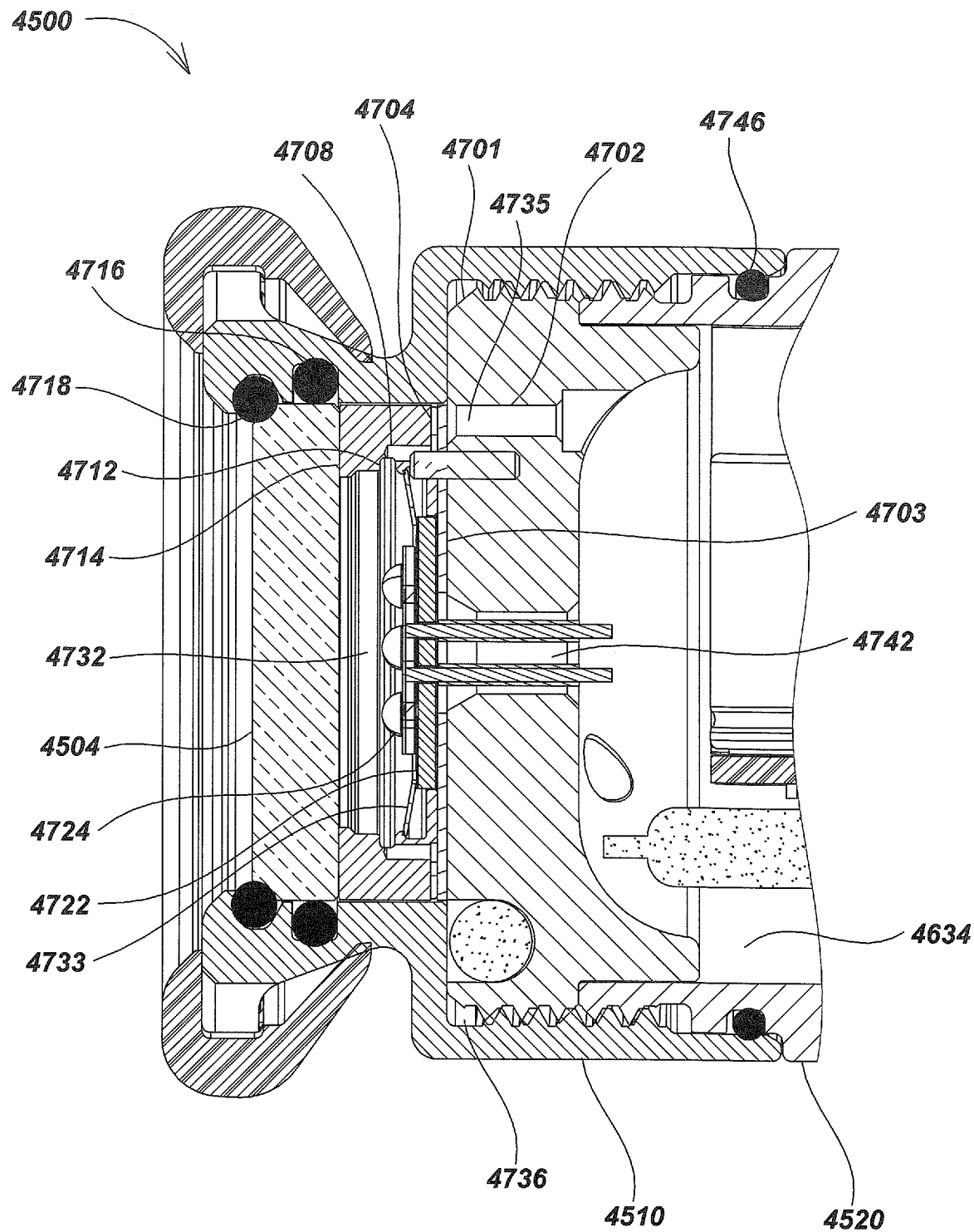
FIG. 47 is an enlarged detail view of the light source volume of the underwater light fixture embodiment as shown in FIG. 46, and designated as illustrative section 47.

FIG. 47 is an enlarged detail section view light fixture embodiment 4500 as shown in FIG. 46, and designated as illustrative section 47. In an exemplary embodiment, window 4504 may be secured to forward housing 4510 with one or more O-rings, such as O-rings 4716 and 4718. O-rings 4716 and 4718 may be comprised of highly permeable or selectively permeable materials to allow "poisoning" gases to diffuse out of the light interior spaces over time. A sealing element, such as a housing O-ring 4746, may be disposed between forward pressure housing 4510 and aft pressure housing 4520.

One or more LEDs 4724 may be disposed on the surface of an LED PCB 4722 which is restrained against LED PCB heatsink 4701 by LED PCB clamp spring 4733. A compartment, such as a light source volume 4732, may be disposed below window 4504. A second compartment, such as driver volume 4634 is a sealed compartment for keeping moisture away from one or more driver components.

Figure 48:
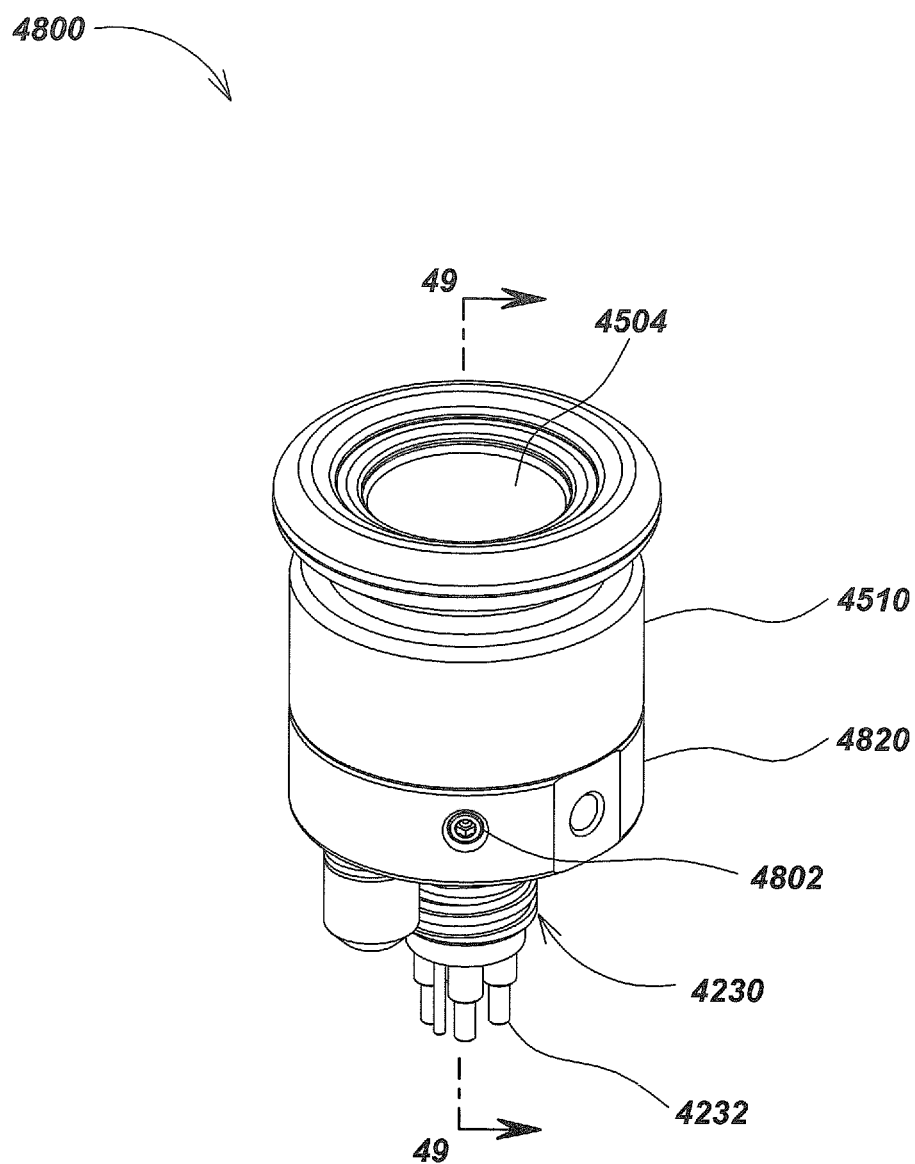
FIG. 48 is an isometric view of an embodiment of an underwater LED light fixture.

Vent path 4735 may be directed through or around LED PCB heatsink 4701. Vent path 4735 may be comprised of various mechanical features such as vent lathe groove 4712, vent drilled hole 4708, and vent slot 4704 which are formed in window support 4714. Vent path 4735 may continue around non-greased pyrolitic graphite 4703 to vent hole 4702 formed in LED PCB heatsink 4701. Vent path 4735 may continue through intervening driver volume 4634 to vent port 4802 (as seen in FIG. 48), which allows "poisoning" gases to leave the sealed internal volumes for the purpose of correcting, preventing or delaying LED browning. Additional vent paths to vent port 4802 may be achieved by migrating gases through ungreased pyrolitic graphite 4703, then through vapor path through electrical power supply hole 4742, or around LED PCB heatsink threads as shown by vapor path 4736. Other vent paths may be formed in various alternate embodiments so as to allow venting of interval volumes having "poisoning" gases or contaminants and/or through internal volumes where contaminating gases may be formed.

FIG. 48 is an isometric view of an embodiment of an underwater LED light fixture 4800. For example, light fixture embodiment 4800 may include a housing, which may be formed by a forward pressure housing 4510 and an aft housing 4820, mated together. Light fixture embodiment 4800 may include an electrical connector, such as a three-pin underwater electrical connector 4230, which may be fitted into the rear of the aft pressure housing 4820. For example, electrical connector 4830 may include a male threaded segment that screws into a female threaded bore or aperture that extends through the rear of aft housing 4820. The connector 4830 may also include one or more conductive contact pins 4232 for providing power to the circuit boards inside the light fixture 4800.

A window 4504, may be sealed to the forward housing 4510, and may be made of a suitably high strength transparent material, such as glass, acrylic, sapphire, or other suitable material for providing optical clarity for the passage of light, mechanical strength, such as for example, resistance to external pressure, and heat dissipation.

A vent port 4802 may be disposed through the aft pressure housing 4820 to vent "poisoning" gases, which are in contact with and/or absorbed within elements of lighting devices, to the external environment (e.g., the ocean). Such a mechanism may prevent browning and/or may be used to de-brown affected LEDs.

Figure 49:
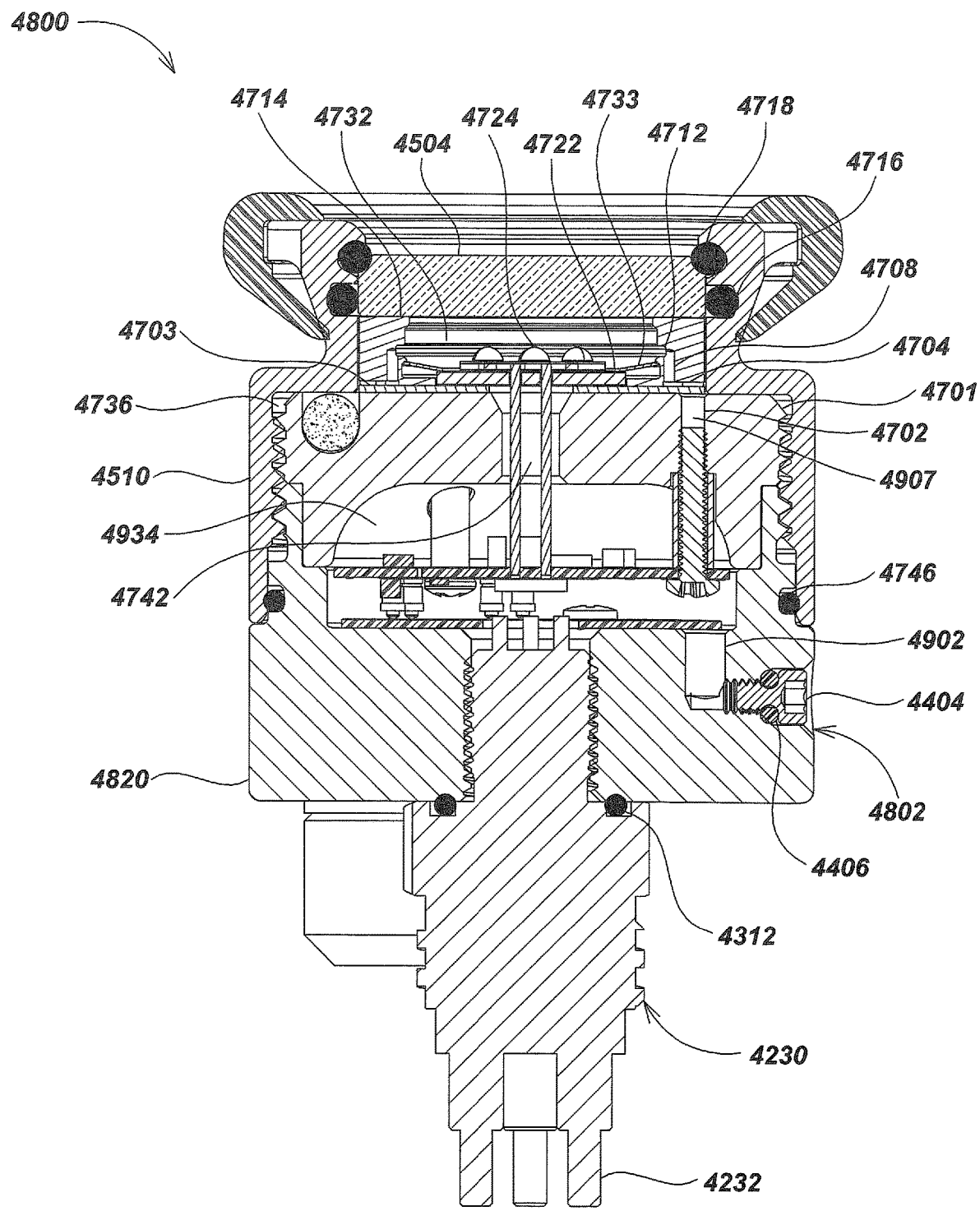
FIG. 49 is a section view of the underwater LED light fixture embodiment of FIG. 48, taken along line 49-49.

FIG. 49 is a section view of the underwater LED light fixture embodiment 4800 of FIG. 48, taken along line 49-49. In an exemplary embodiment, window 4504 may be secured to forward housing 4510 with one or more O-rings, such as O-rings 4716 and 4718. An LED PCB 4722 may be secured against an LED PCB heatsink within light source volume 4732 with LED PCB clamp spring 4733. One or more LEDs 4724 may be disposed on the surface of LED PCB 4722.

Light fixture embodiment 4800 may include an air tight compartment, such as an electronics volume 4934 to seal off electrical components from moisture. Electrical connector 4230 may be sealed to the aft pressure housing 4820 with a sealing element, such as O-ring 4312. A sealing element, such as a housing O-ring 4746, may be disposed between forward pressure housing 4510 and aft pressure housing 4820.

To provide venting of "poisoning" gases, which are in contact with and/or absorbed within elements of lighting devices, to escape to the external environment, light fixture embodiment 4800 may include a vent port 4802. For example, vent port 4802 may be comprised of a threaded fastener, or vent screw 4404, which may seal within a hole located in aft pressure housing 4820 with an O-ring 4406. Light fixture embodiment 4800 may further include a vent path 4907. Vent path 4907 may be disposed through LED PCB heatsink 4701. Vent path 4907 may be comprised of various mechanical features such as vent lathe groove 4712, vent drilled hole 4708, and vent slot 4704 which are formed in window support 4714. Vent path 4907 may continue around non-greased pyrolitic graphite 4703 to vent hole 4702 formed in LED PCB heatsink 4701. Vent path 4736 continues through intervening electronic volume 4934 to vent hole 4902, then to vent port 4802 which allows "poisoning" gases to leave the sealed internal volumes for the purpose of correcting, preventing or delaying LED Browning. Additional vent paths to vent port 4802 may be achieved by migrating gases through ungreased pyrolitic graphite 4703, then through vapor path through electrical power supply hole 4742, or around LED PCB heatsink threads as shown by vapor path 4736. The venting may be implemented with graphite materials such as described previously herein, which may be controlled by compressing to remove internal voids and additionally by applying a thin layer of grease to either side prior to installation. If the graphite is used dry and uncompressed, it does not typically seal, however, if the graphite is compressed and greased it does seal. In this manner the graphite treatment can be used to selectively seal or vent between the LED volume and other internal volumes, such as the electronics driver volume or other internal volumes of the lighting device.

Figure 50:
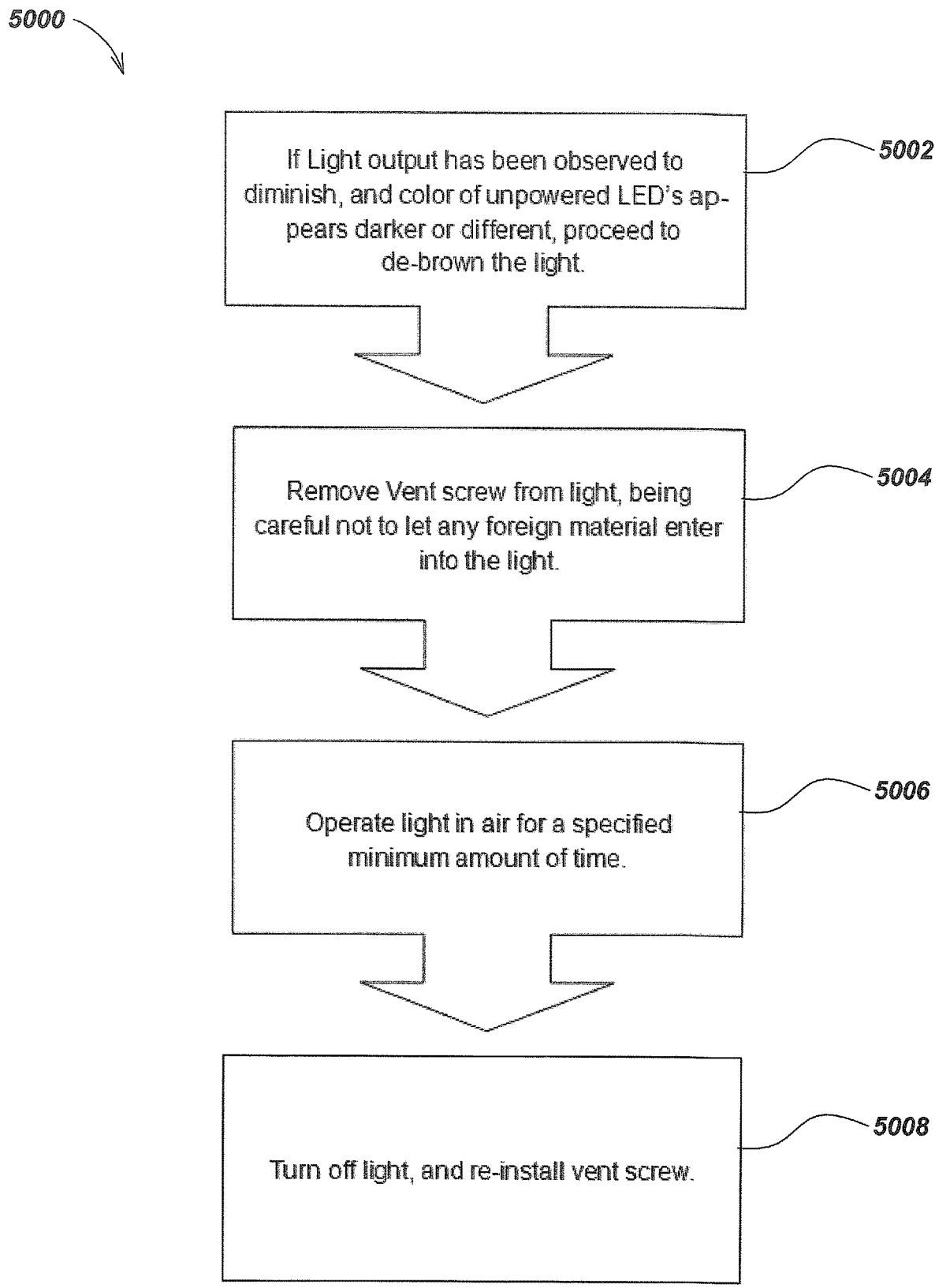
FIG. 50 is a flowchart illustrating an embodiment of a de-browning process as may be used with a serviceable vented LED lighting device as described herein.

Servicing of light embodiments in accordance with the previously described aspects that include vent ports and/or internal vent paths to remove contaminants may be done in various ways. For example, when a light is removed from service (e.g., by removing it from an underwater or other operating environment, etc.) the vent port may be opened to allow internal contaminants/"poisoning" gases to flow out of the housing's interior volumes, and then re-sealed to return the light to operation. This may be combined with operation of the light with vent opened and/or by purging the interior volumes with other gases, a vacuum, etc. For example, FIG. 50 is a flowchart illustrating a de-browning mechanism embodiment 5000. In this servicing process, at a first stage 5002, if light output has diminished (i.e., brightness or color of LEDs change, indicating browning or other output degradation), servicing may continue to stage 5004. At stage 5004, the vent may be opened, for example by removing a threaded vent screw from light (typically being careful not to let particulate matter into the light) or otherwise opening the vent port, and proceeding to stage 5006. At stage 5006, the light may be operated in an ambient air environment until sufficient de-browning has occurred. In some implementations, the interior volumes may be purged with air, other gases, a vacuum, etc., either before, during, or after operation at stage 5006. At stage 5008, the light may be turned off and the vented port resealed, such as by screwing a threaded vent screw back in, etc.

Figure 51:
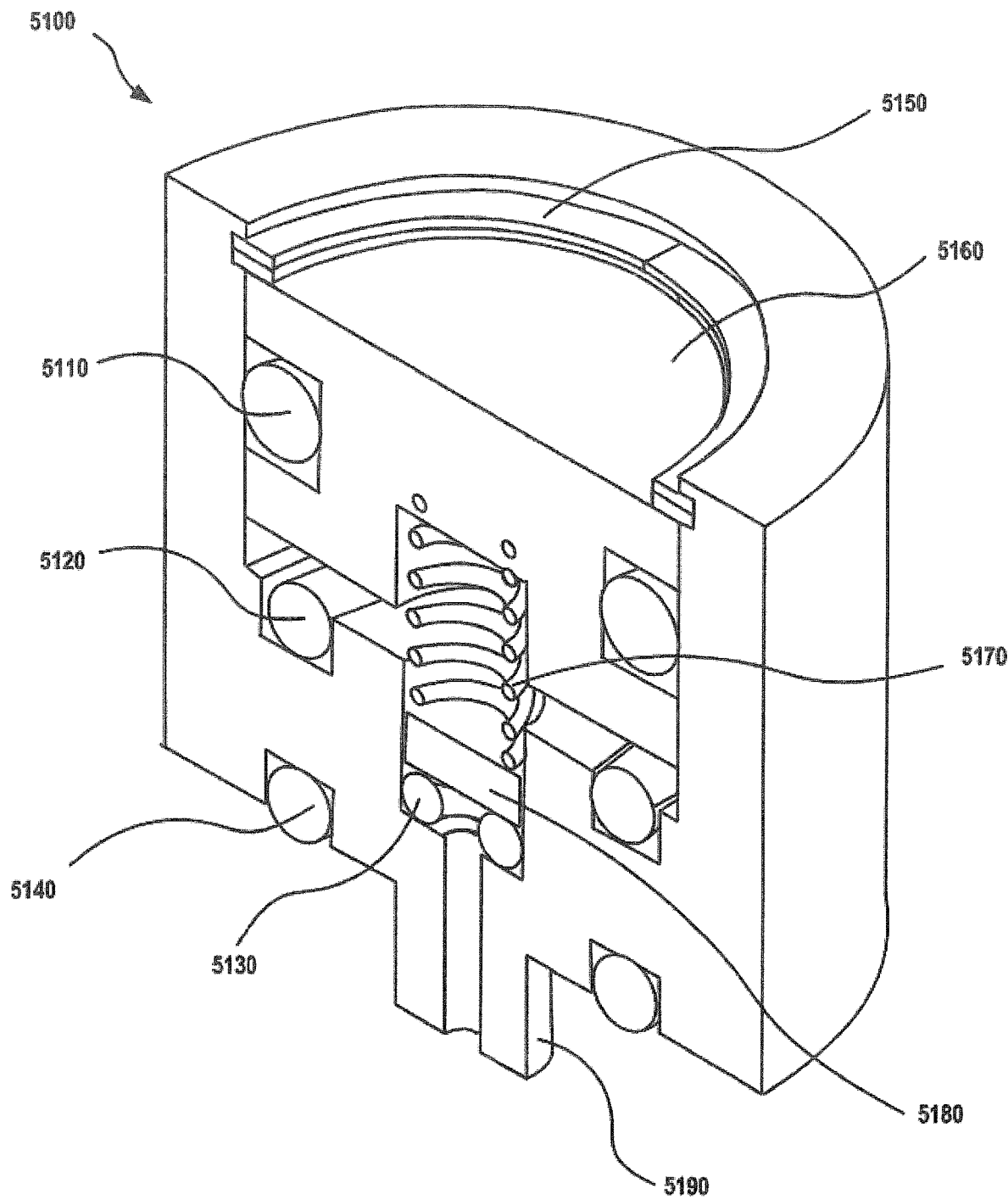
FIGS. 51-53 illustrate details of an embodiment of a selectively permeable pressure relief valve for use in submersible lighting devices in accordance with certain aspects.
Figure 52:
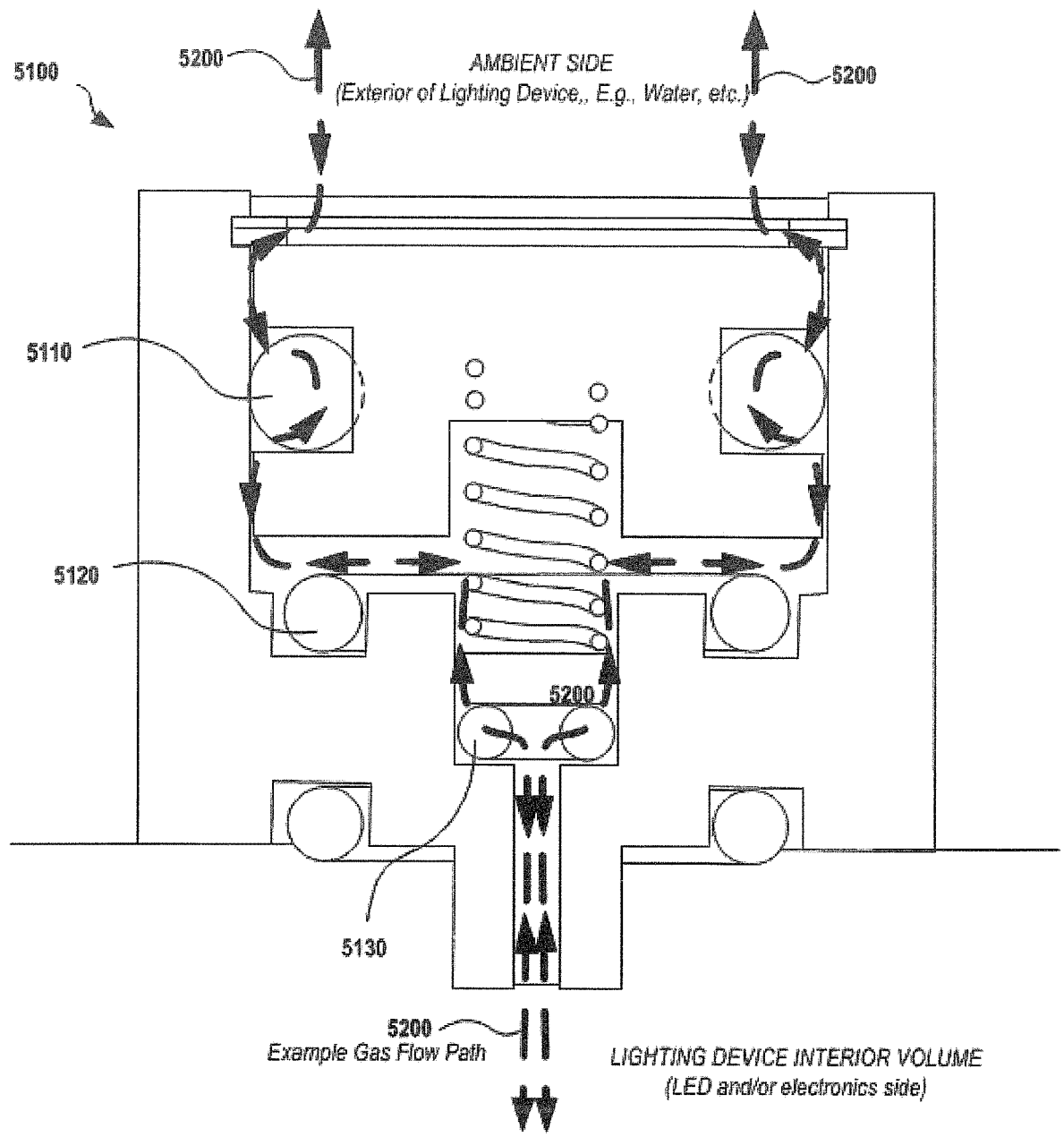

FIGS. 51 and 52 illustrate details of an embodiment 5100 of a pressure valve configured for automatic operation to selectively allow contaminants/"poisoning" gases to exit interior volumes of a lighting device. Valve 5100 may include a seal 5110 which may be of silicone or other materials selected to be permeable to gases, and in particular to contaminating or "poisoning" gases. In operation, seal 5110 may also filter debris and water away from another type of seal 5120 (which may, for example, be of Viton or other similar or equivalent materials) and act as a piston seal to maintain pressure differences allowing piston 5160 to engage seal 5120. Seal 5120 may be selected from a material, such as Viton, to provide water sealing at high pressures (e.g., when the piston is pushed downward in the orientation shown in FIG. 51). When the lighting device in which valve 5100 is installed is out of water (or other high pressure environments) seal 5120 may be disengaged, to allow gases to pass freely through surrounding valve paths and between interior volumes of the lighting device and the exterior environment.

Additional seals in valve embodiment 5100 may include gas permeable seal 5130, which may be of silicone or a similar or equivalent material, and which may be disposed in the valve to provide an additional or final barrier between semiconductor lighting elements, such as LEDs, and water or other environmental fluids. As shown in embodiment 5100, gas permeable seal 5130 is preferably not exposed to high pressure due to the other sealing mechanisms of the valve.

An exterior seal 5140 may be included to protect threads or other joints of the valve from water or other contaminants. A snap ring 5150 or other piston capture element may be included to keep piston 5160 in place. Use of a snap ring such as snap ring 5150 may provide advantages in field servicing of the valve and/or associated lighting device. Piston embodiment 5160 engages the seal 5120 (e.g., a Viton o-ring) to create a water tight seal when external pressure (e.g., from water or other external fluids) is applied to the valve and associated lighting device. A spring 5170 or other similar or equivalent mechanism may be used to apply a light force to engage seal 5130, and/or disengage piston 5160 from seal 5120 when external pressure is removed. A compression element 5180 or similar or equivalent element may be included to transfer pressure from the spring 5170 to the seal 5130 and force the gas path through seal 5130. The compression element 5180 may comprise a material that is impermeable to water. A threaded engagement element 5190, such as a standard threaded shaft, may be included to allow for screwing of the valve to the associated lighting element for easy manufacturing and maintenance.

Figure 53:
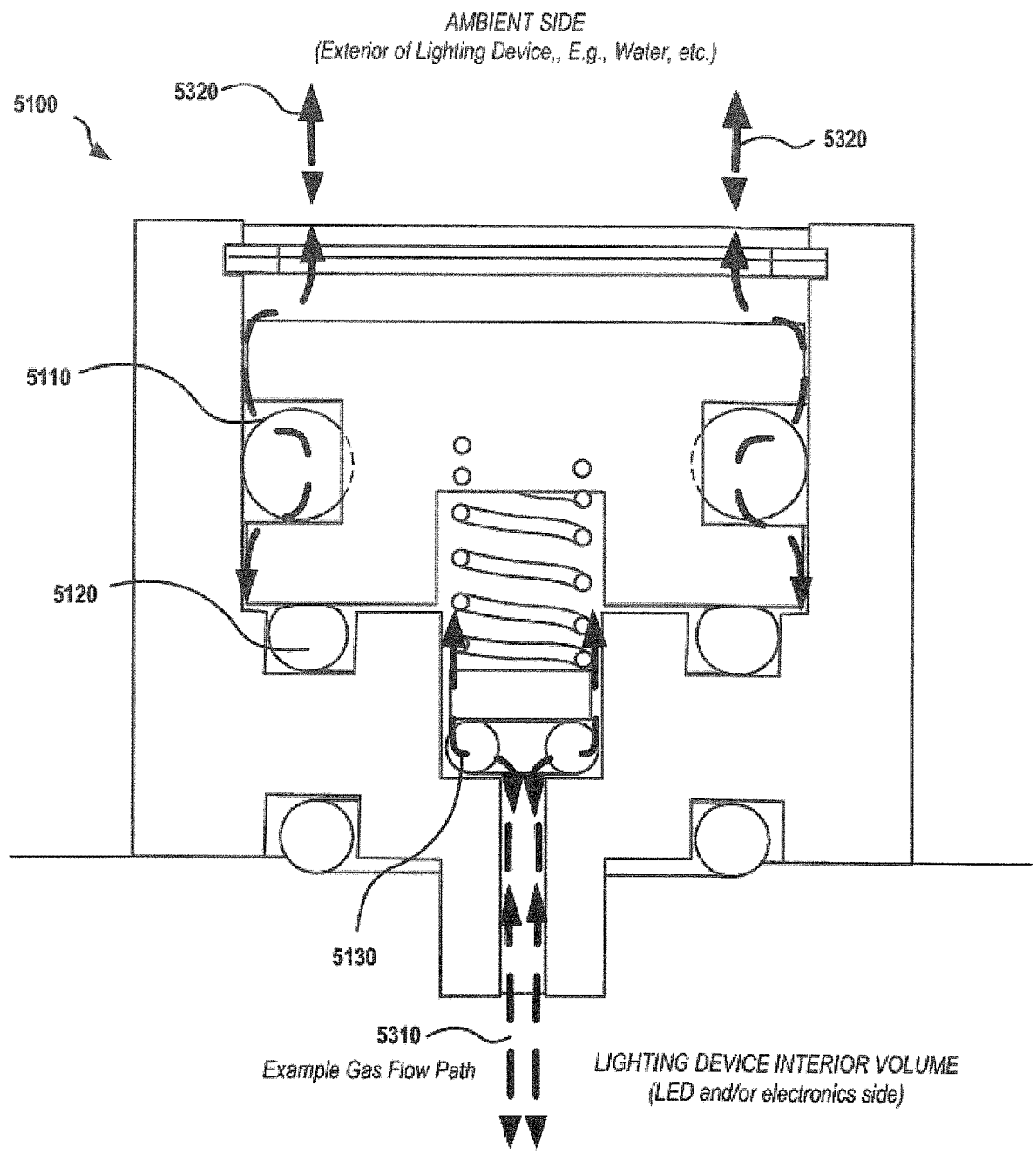

FIG. 52 illustrates example gas flow, as illustrated by the arrow lines 5200, through the pressure valve embodiment 5100 to allow contaminants/"poisoning" gases to exit the interior of lighting devices when only low pressure is applied to the exterior (e.g., when a light is above water or otherwise under low ambient pressures in an "open" state). As shown in FIG. 52, in an "open" state (e.g., when no high pressures applied to the piston from exterior water or other fluids) gases may flow through gas permeable seals 5110 and 5130, as well as through the opening between seal 5120 and piston 5160. FIG. 53 shows a corresponding cutaway view of the valve 5100 when high pressure is applied (e.g., when a lighting device is deep underwater or otherwise subjected to high exterior pressures or in a "closed" state). In this configuration, seal 5120 closes off the exterior by being pressed in contact with the piston 5160 so that gas flow path 5310 from the interior volumes of the lighting device are cut off and do not allow gases to exit through the valve (and gas flow via paths 5320 from the exterior are similarly cut off at seal 5120). Various other embodiments may include similar or equivalent sealing mechanisms with pistons, seals, such as o-rings of gas permeable materials, or other equivalent elements to allow selective gas flow from within a lighting device or other apparatus.

The seals (e.g., silicone o-rings or gaskets) may be configured to provide some measure of water ingress protection during any stage of operation. A particular installation orientation (e.g., "down" or "horizontal") may be used to provide maximum effectiveness, and a modular design such as the embodiment shown may facilitate serviceability and replacement.

The embodiments 5100 may be readily modified in alternate implementations to allow for manual opening and closing in place of, or in addition to, the automatic configuration shown. For example, for lights configured to operate in deep underwater applications, (e.g., for short duration operation on ROVs, AUVs, etc.) an automatic vent/valve may be preferable, whereas for lighting device for shallow operation (e.g., commercial divers, etc.) where an automatic valve may not engage properly due to limited applied pressure, a manually operated valve may be preferable. For some implementations in very shallow water or other environments (e.g., aquariums, ponds, pools, etc.) an air tube to the surface or to a source of purge gas may be used instead of sealed vent port or valve. A vent port with a threaded seal or plug may be advantageous in some applications due to simplicity and/or minimal cost. A vent tube integral on a power cable that allows contaminants to travel up the tube and out of the housing may be used.

Lights in accordance with the various aspects described herein may be used in a variety of lighting applications. An exemplary application is for littoral or underwater lighting, however, lights in accordance with various aspects may also be used for other applications subject to exposure to wet or otherwise problematic environments such as on or in aircraft, ground vehicles, boats, submarines, piers or docks, airport lighting, space applications, or similar applications. Alternately, lights in accordance with various aspects described herein may also be used in applications where long light duration, lighting or replacement cost, high lighting output power, or other constraints are important, such as outdoor surface lighting, building or structure lighting, highway lighting, environmental lighting, or other lighting applications.

The present invention is not intended to be limited to the aspects shown herein, but is to be accorded the full scope consistent with the specification and drawings, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c.

The previous description of the disclosed aspects is provided to enable any person skilled in the art to make or use various embodiments of the present invention. Various modifications to these aspects will be readily apparent to those skilled in the art, and the generic principles defined herein may be applied to other aspects without departing from the spirit or scope of the invention. Therefore, the presently claimed invention is not intended to be limited to the aspects and details shown herein but is to be accorded the widest scope consistent with the appended Claims and their equivalents.

The invention claimed is:

1. A submersible LED light fixture, comprising:
  a housing assembly including one or more interior volumes;
  a light head made of a thermally conductive material;
  a metal core printed circuit board (PCB) thermally coupled to the light head;
  a plurality of LEDs mounted on the MCPCB;
  a transparent window mounted in the light head, extending across the MCPCB and spaced from the LEDs, the window being sealed around a periphery thereof to the light head;
  a multilayer stack of spacers made of a high compressive strength material positioned between the window and the MCPCB for engaging the window and carrying loads exerted by the window.

2. The LED light fixture of claim 1, further comprising a pressure relief valve (PRV) mounted in the housing assembly.

3. The LED light fixture of claim 2, wherein the pressure relief valve is an automatically actuated PRV.

4. The underwater lighting device of claim 2, wherein the pressure relief valve is a manually actuated PRV.

5. The underwater lighting device of claim 1, wherein the window comprises sapphire.

6. The underwater lighting device of claim 1, wherein the window comprises acrylic.

7. The underwater lighting device of claim 2, wherein the pressure relief valve provides selective permeability as a function of applied external pressure.

8. The underwater lighting device of claim 1, further including a selectively permeable barrier element disposed in the housing assembly.

9. The underwater lighting device of claim 8, wherein the selectively permeable barrier element comprises a silicone material and/or an O-ring.

10. The underwater lighting device of claim 1, further including a serviceable port disposed in the housing assembly and one or more internal venting paths within the housing assembly to allow transfer of contaminating gases to the serviceable port.

11. The underwater lighting device of claim 1, wherein the one or more volumes includes a first volume with the MCPCB disposed in the first volume and a second volume with a power circuit disposed in the second volume.

12. The underwater lighting device of claim 1, further including a pyrolytic sheet in thermal contact with the MCPCB to aid is dissipating heat therefrom.

13. The underwater lighting device of claim 1, further including a selectively gas permeable pressure valve disposed in the housing assembly.

\* \* \* \* \*